United States Patent [19]

Leigh

[11] Patent Number: 4,506,322
[45] Date of Patent: Mar. 19, 1985

[54] READ/WRITE MEMORY CELL FOR MICROCOMPUTER

[75] Inventor: Antony W. Leigh, Houston, Tex.

[73] Assignee: Texas Instruments Incorporated, Dallas, Tex.

[21] Appl. No.: 350,950

[22] Filed: Feb. 22, 1982

[51] Int. Cl.³ ............................................. G06F 13/00
[52] U.S. Cl. ................................... 364/200; 365/154
[58] Field of Search ..................... 364/200 MS File; 365/154

[56] References Cited

U.S. PATENT DOCUMENTS 3,962,684  6/1976  Caudel et al. ..................... 364/200
4,184,208  1/1980  Tubbs ............................ 365/154 X Primary Examiner—Raulfe B. Zache
Attorney, Agent, or Firm—John G. Graham

[57] ABSTRACT

A system for real-time digital signal processing employs a single-chip microcomputer device having separate on-chip program ROM and data RAM, with separate address and data paths for program and data. The data RAM uses a pseudo-static cell array with refresh. An external program address bus allows off-chip program fetch in an expansion mode, with the opcode returned by an external data bus. A bus interchange module allows transfer between the separate internal program and data busses in special circumstances. The internal busses are 16-bit, while the ALU and accumulator are 32-bit. A multiplier circuit produces a single state 16×16 multiply function separate from the ALU, with 32-bit output to the ALU. One input to the ALU passes through a 0-to-15 bit shifter with sign extension.

18 Claims, 52 Drawing Figures

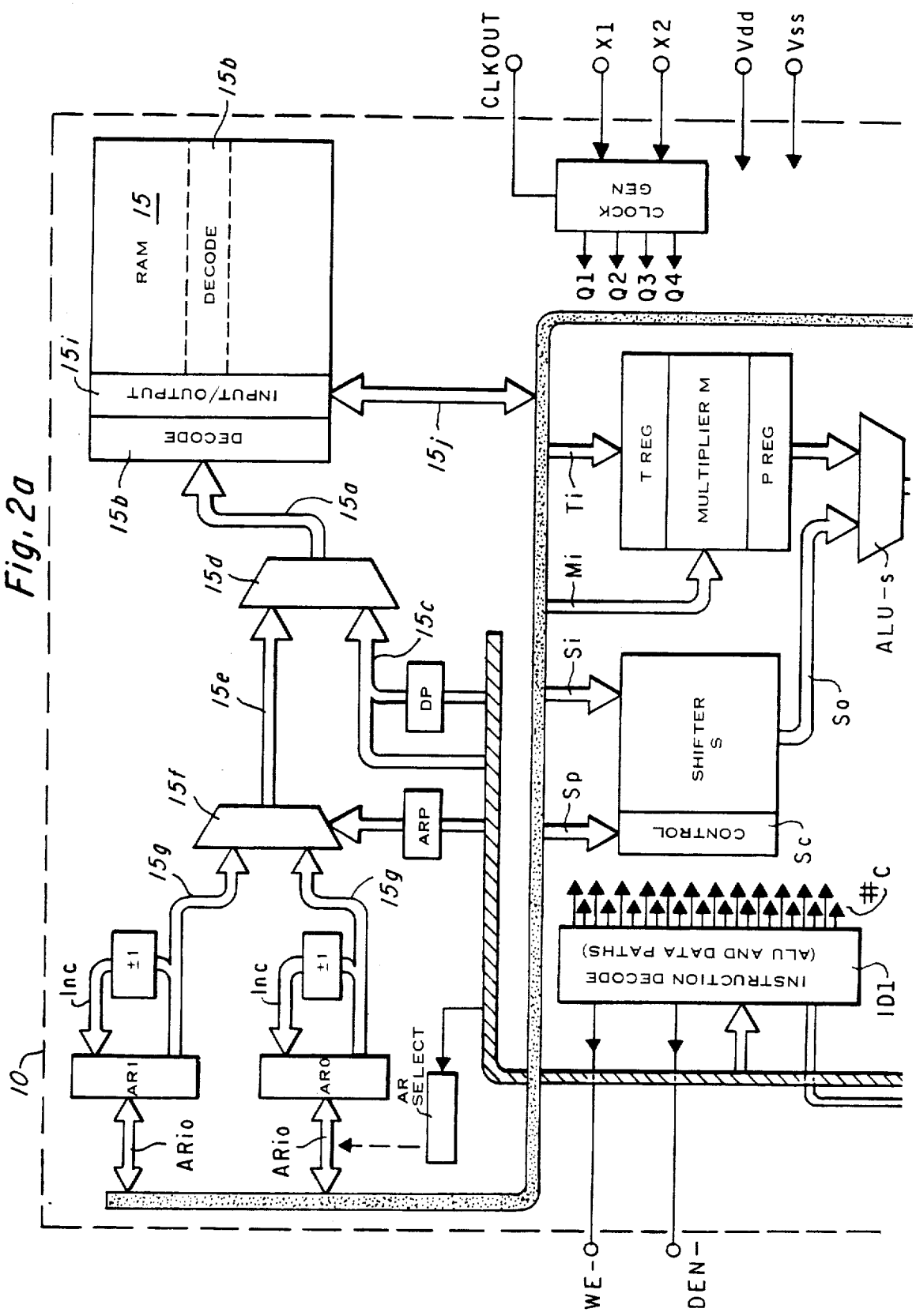

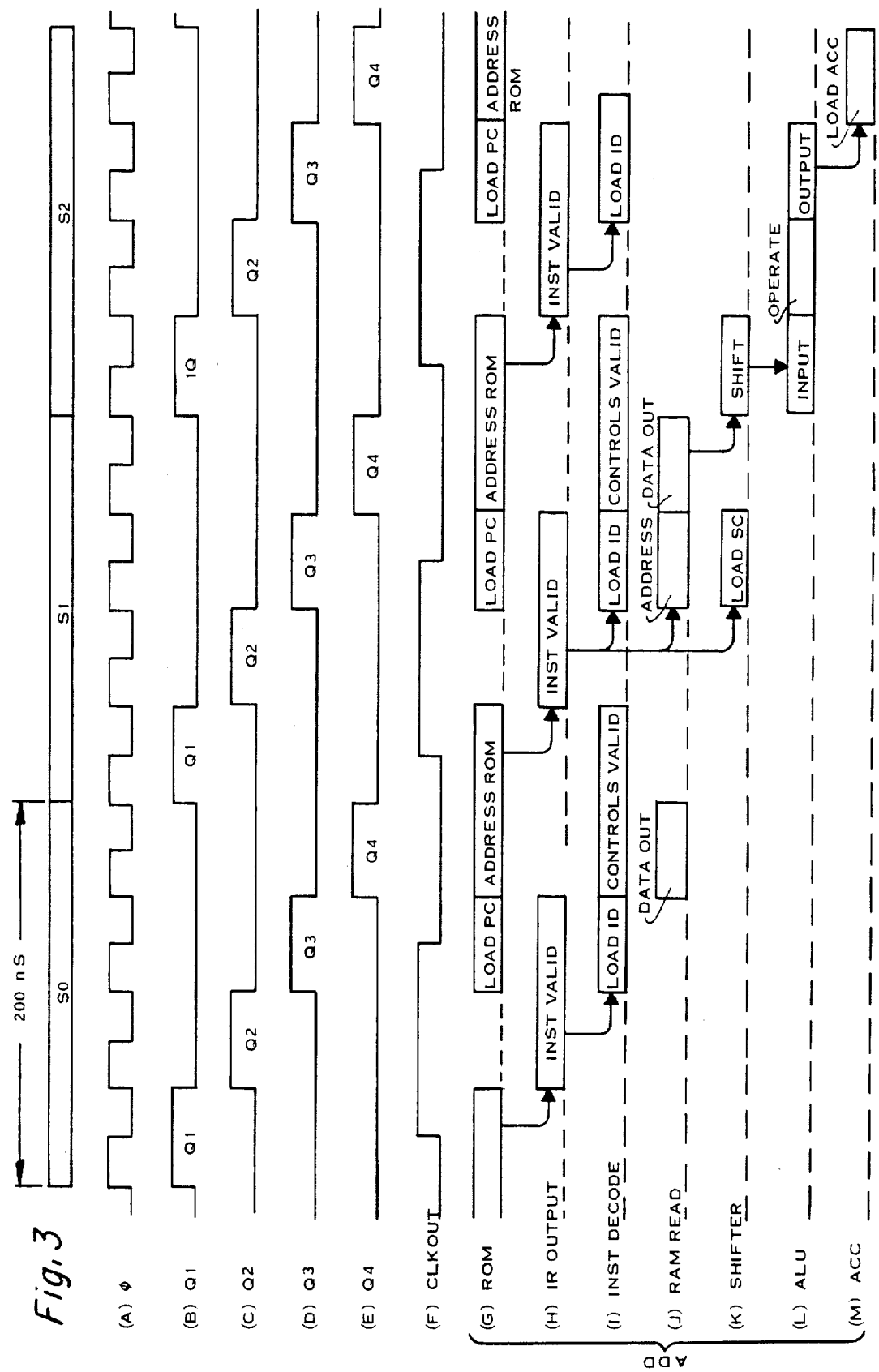

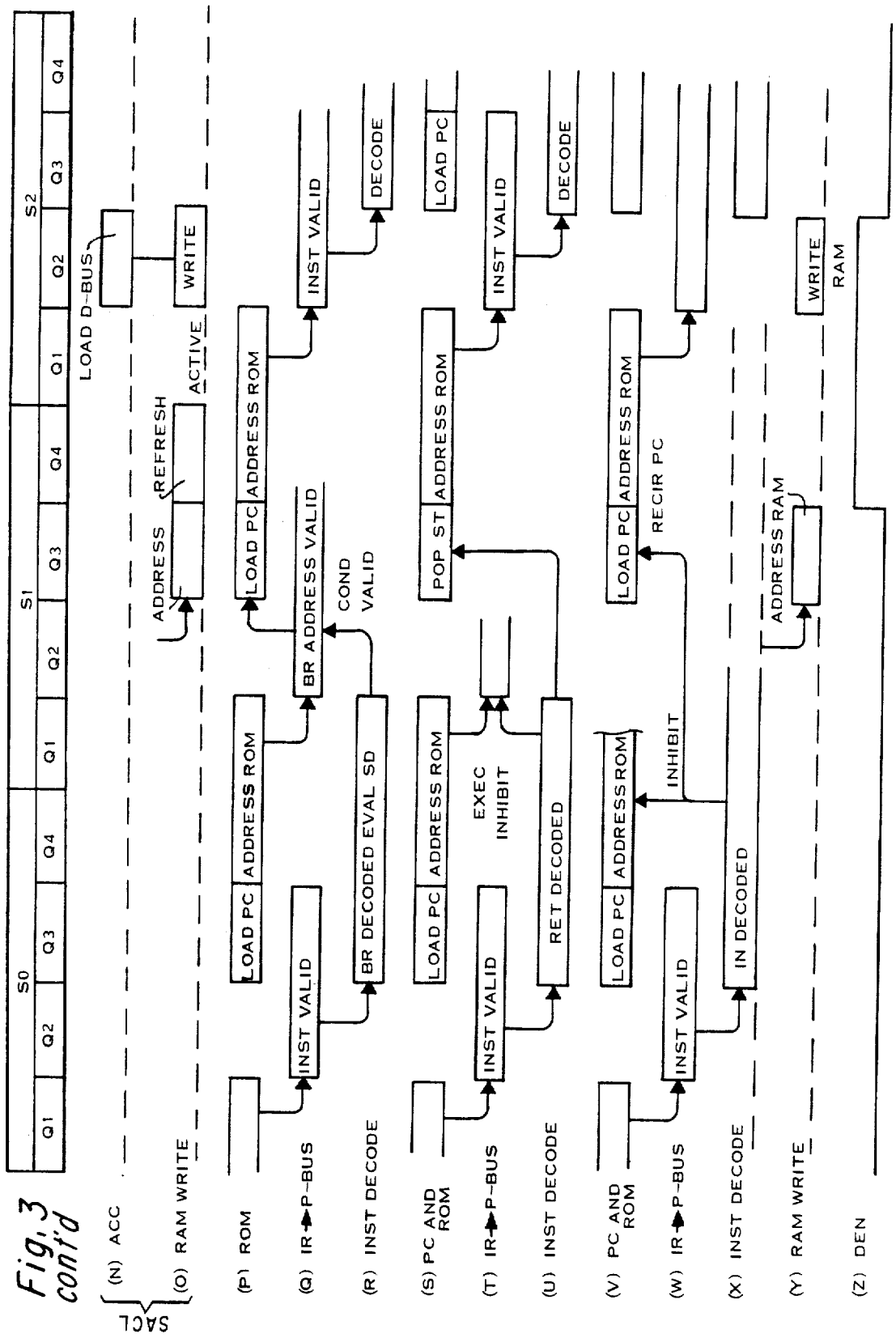

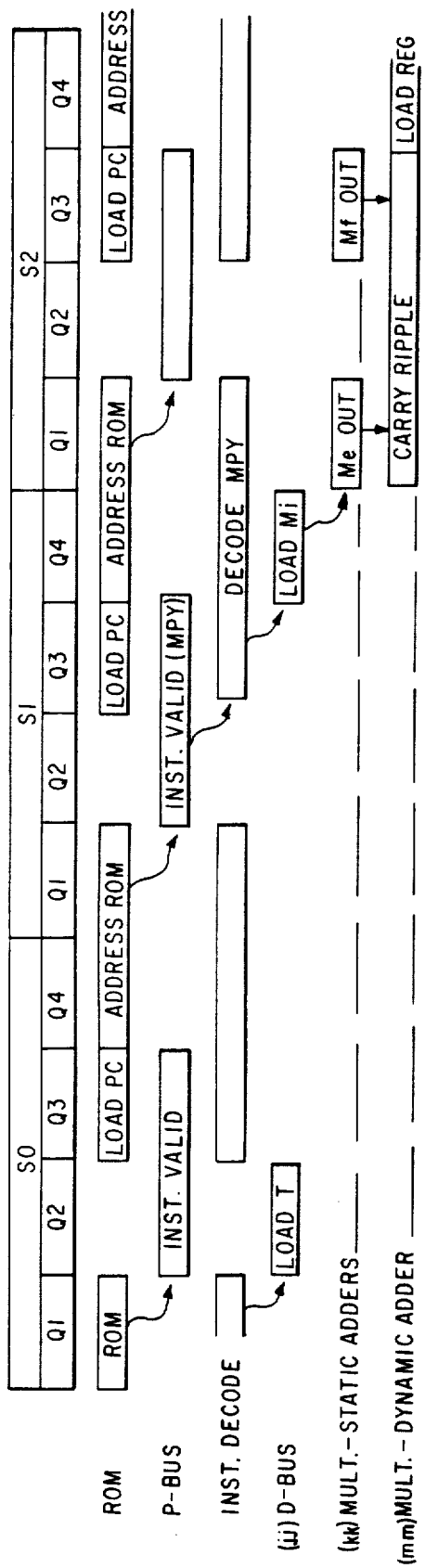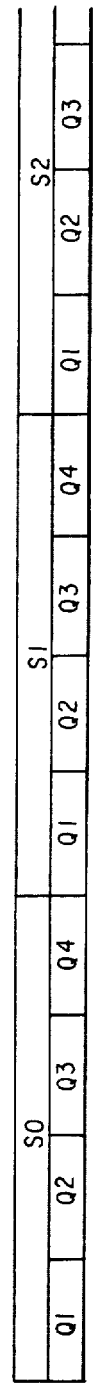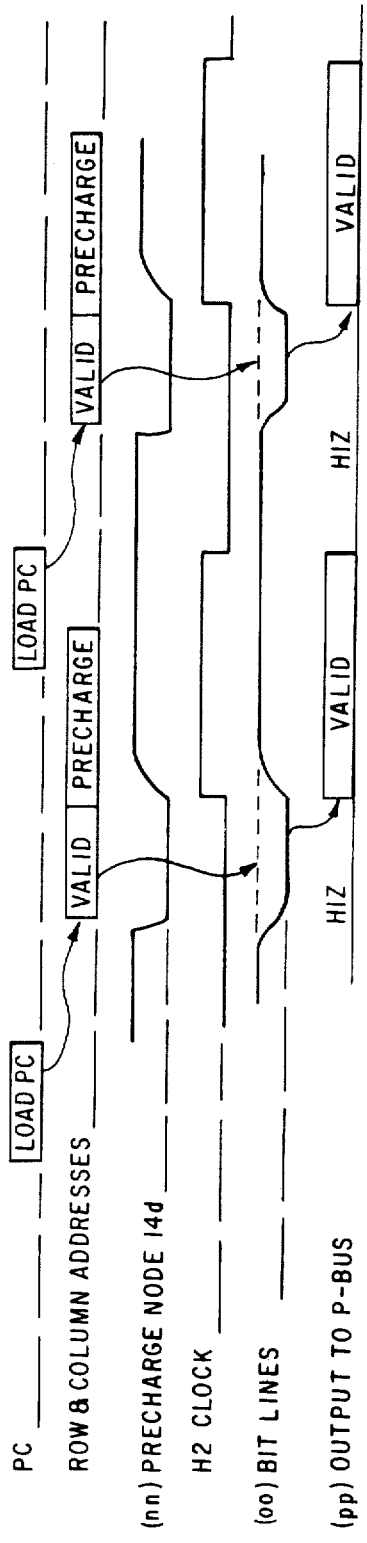
Fig.3(cont'd) MULTIPLY INSTRUCTION
Fig.3(cont'd) ROM OPERATION

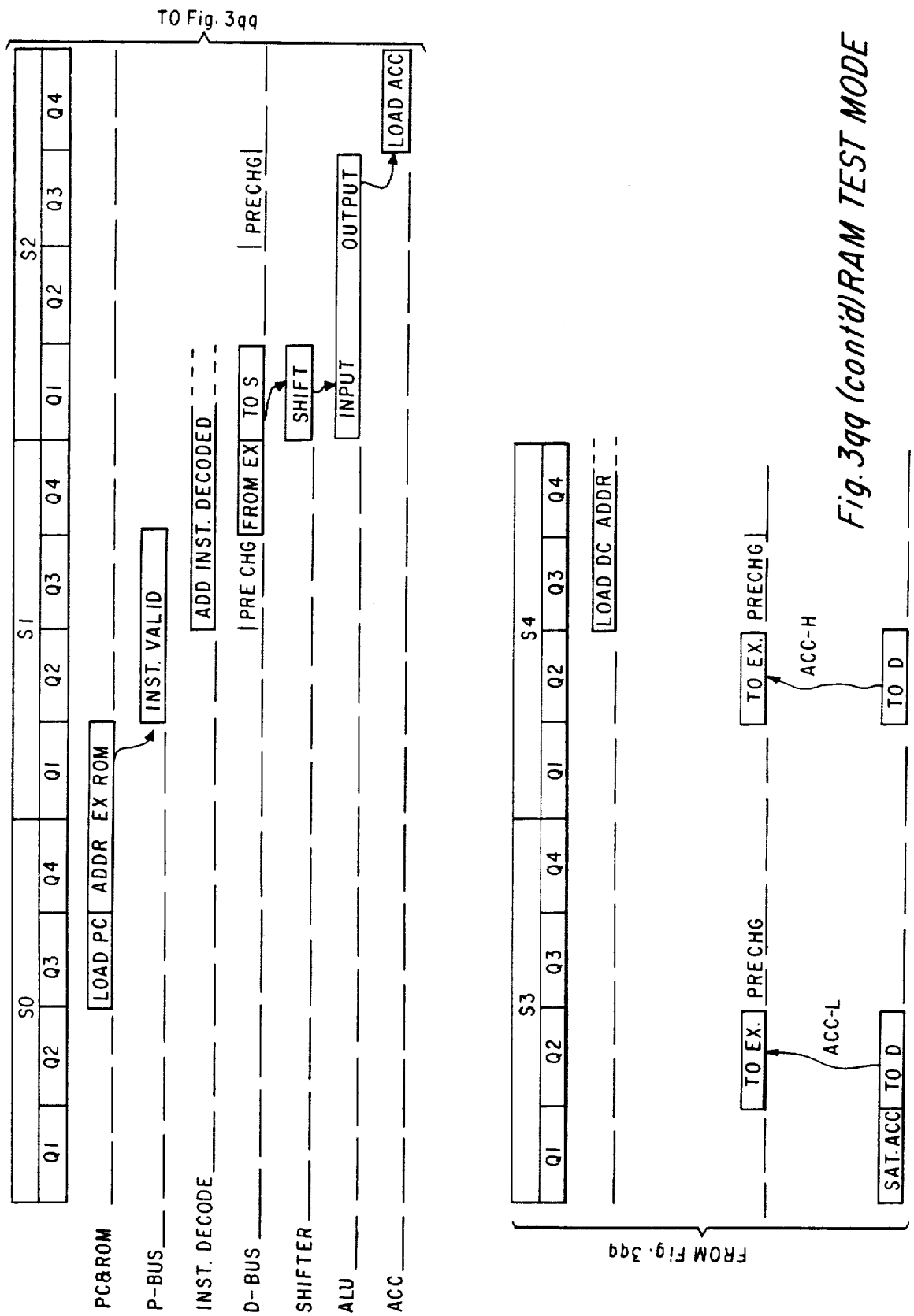

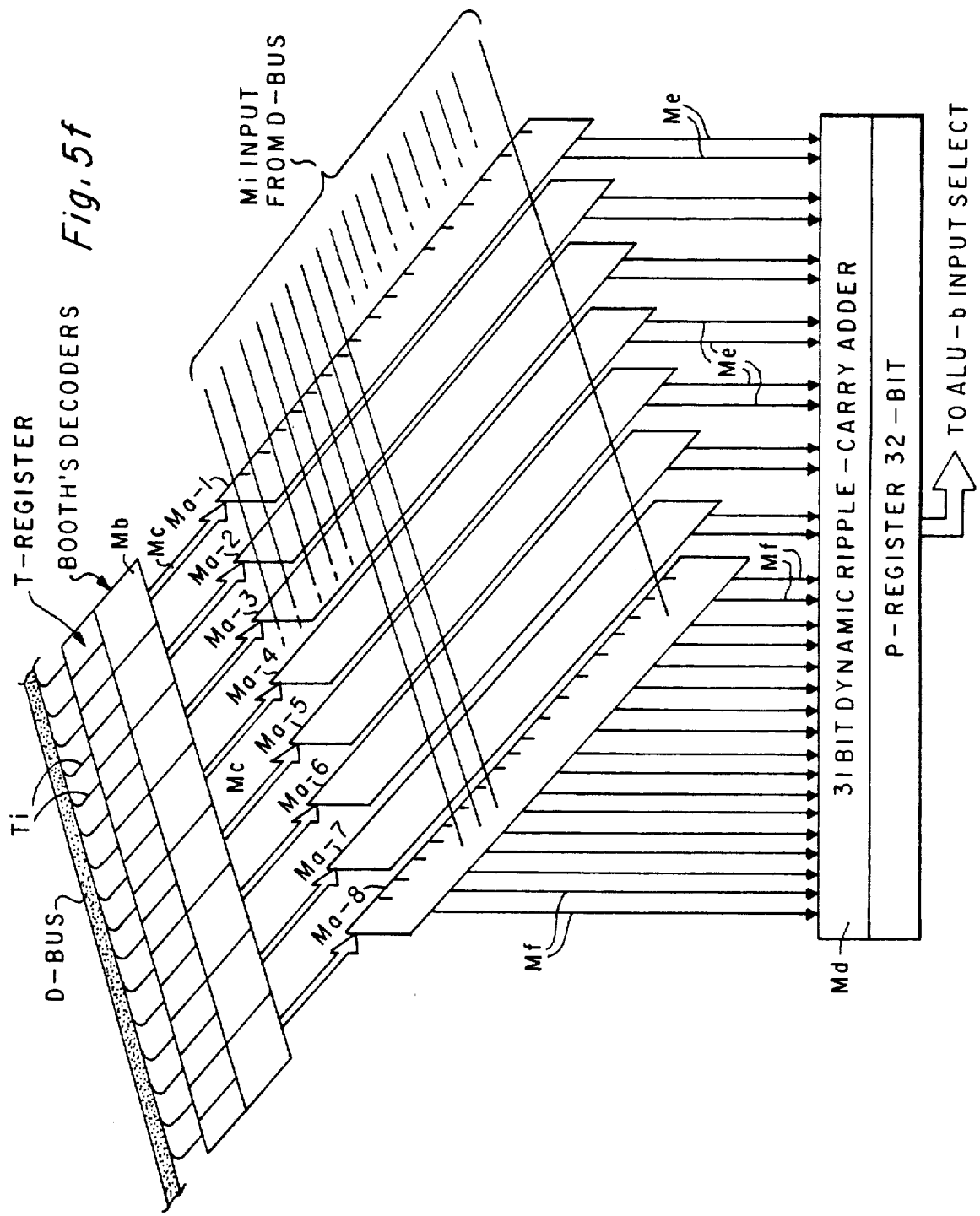

READ/WRITE MEMORY CELL FOR MICROCOMPUTER

TABLE OF CONTENTS

Background of the Invention
Summary of the Invention
Brief Description of the Drawings
Detailed Description of Specific Embodiment
  Microprocessor System
  The Microcomputer Chip
  The CPU
  Program Memory Addressing
  Data Memory Addressing
  Input/Output Functions
  The Instruction Set
  System Timing
  The Chip Layout
  Arithmetic Logic Unit
  The Shifter S
  Accumulator
  Status Decode
  Bus Interchange Module
  The Multiplier
  The RAM
  Auxiliary Registers
  The ROM
  The Test Control
  Program Counter and Stack
  Data I/O Buffer
  Emulator Mode Interrupts
  Table A: The Instruction Set
  Table B: ALU Functions

BACKGROUND OF THE INVENTION

This invention relates to integrated semiconductor devices and systems, and more particularly to features of a high-speed, miniaturized, electronic digital signal processing system in single-chip microcomputer form.

A microprocessor device is a central processing unit or CPU for a digital processor which is usually contained in a single semiconductor integrated circuit or "chip" fabricated by "MOS/LSI" technology, as shown in U.S. Pat. No. 3,757,306 issued to Gary W. Boone and assigned to Texas Instruments. The Boone patent shows a single-chip 8-bit CPU including a parallel ALU, registers for data and addresses, an instruction register and a control decoder, all interconnected using the Von Neumann architecture and employing a bidirectional parallel bus for data, address and instructions. U.S. Pat. No. 4,074,351, issued to Gary W. Boone, and Michael J. Cochran, assigned to Texas Instruments, shows a single-chip "microcomputer" type device which contains a 4-bit parallel ALU and its control circuitry, with on-chip ROM for program storage and on-chip RAM for data storage, constructed in the Harvard architecture. The term microprocessor usually refers to a device employing external memory for program and data storage, while the term microcomputer refers to a device with on-chip ROM and RAM for program and data storage; the terms are also used interchangeably, however, and are not intended as restrictive as to some features of this invention.

Subsequent to 1971 when U.S. Pat. Nos. 3,757,306 and 4,074,351 were originally filed, many improvements have been made in microprocessors and microcomputers to increase the speed and capability of these devices and reduce the cost of manufacture, providing more circuitry and functions in less space, i.e., smaller chip size. Improved VLSI semiconductor processing and photolithographic techniques allow narrower line widths and higher resolution, providing added circuit density and higher speed, but circuit and system improvements also contribute to the goals of increased performance with smaller chip size. Some of these improvements in microcomputers are disclosed in the following U.S. Patents, all assigned to Texas Instruments: U.S. Pat. Nos. 3,991,305 issued to Edward R. Caudel and Joseph H. Raymond Jr.; 4,156,927 issued to David J. McElroy and Graham S. Tubbs; 3,934,233 issued to R. J. Fisher and G. D. Rogers; 3,921,142 issued to J. D. Bryant and G. A. Hartsell; 3,900,722 issued to M. J. Cochran and C. P. Grant; 3,932,846 issued to C. W. Brixey et al; 3,939,335 issued to G. L. Brantingham, L. H. Phillips and L. T. Novak; 4,125,901 issued to S. P. Hamilton, L. L. Miles, et al; 4,158,432 issued to M. G. VanBavel; 3,757,308 and 3,984,816. The devices described in these patents have been of the Harvard architecture and of the 4-bit type, particularly adapted for calculator or controller applications.

Additional examples of microprocessor and microcomputer devices in the evolution of this technology are described in publications. In Electronics, Sept. 25, 1972, pp. 31-32, a 4-bit P-channel MOS microcomputer with on-chip ROM and RAM is shown which is similar to U.S. Pat. No. 3,991,305. Two of the most widely used 8-bit microprocessors like that of U.S. Pat. No. 3,757,306 are described in Electronics, Apr. 18, 1974 at pp. 88-95 (the Motorola 6800) and pp. 95-100 (the Intel 8080). A microcomputer version of the 6800 is described in Electronics, Feb. 2, 1978 at pp. 95-103. Likewise, a single-chip microcomputer version of the 8080 is shown in Electronics, Nov. 25, 1976 at pp. 99-105. Another single-chip microcomputer, the Mostek 3872, is shown in Electronics, May 11, 1978, at p. 105-110, and an improved version of the 6800 is disclosed in Electronics, Sept. 17, 1979 at pp. 122-125. Sixteen-bit microprocessors based on minicomputer instruction sets evolved such as the part number TMS9900 described in a book entitled "9900 Family Systems Design", published in 1978 by Texas Instruments Incorporated, P.O. Box 1443, M/S 6404, Houston, Tex. 77001, Library of Congress Catalog No. 78-058005. The 8086, a 16-bit microprocessor evolving from the 8080, is described in Electronics, Feb. 16, 1978, pp. 99-104, while a 16-bit microprocessor identified as the 68000 (based on the 6800) is described in Electronic Design, Sept. 1, 1978 at pp. 100-107, and in IEEE Computer, Vol. 12. No. 2, pp. 43-52 (1979).

These prior 8-bit and 16-bit microprocessors and microcomputers have been general-purpose processors of the Von Neumann architecture with multiplexed address/data buses; some have been microcoded as described in U.S. Pat. No. 4,402,043 by Guttag, McDonough and Laws, or U.S. Pat. No. 4,432,052 by Hayn, McDonough and Bellay, both assigned to Texas Instruments, and at pp. 28-34, IEEE Spectrum, March 1979, by McKevitt and Bayliss, or Proceedings 111th Annual Microprogramming Workshop, December, 1979 by Stintter and Tredenick. Microcoding, originally described by Wilkes in 1951, employs a control ROM to store microinstruction sequences entered by instruction words; the programmer works in a higher level machine code, so the number of assembly language code statements is supposedly reduced, and thus programming cost is reduced.

In contrast, features of the invention may be preferably employed in a special-purpose high-speed microcomputer device according to the embodiment described herein which departs from these contemporary microprocessor devices in several major respects in order to achieve substantial speed and performance advantages. This device is generally a non-microcoded processor of modified Harvard architecture.

It is the principal object to this invention to provide improved features of a microcomputer device and system, particularly one adapted for real-time digital signal processing or the like. Another object is to provide a high-speed microcomputer of enhanced capabilities.

SUMMARY OF THE INVENTION

In accordance with one embodiment, features of the invention are included in a system for real-time digital signal processing employing a single-chip microcomputer device having separate on-chip program ROM and data RAM, with separate address and data paths for program and data. An external program address bus allows off-chip program fetch in an expansion mode, with the opcode returned by an external data bus. A bus interchange module allows transfer between the separate internal program and data busses in special circumstances. The internal busses are 16-bit, while the ALU and accumulator are 32-bit. A multiplier circuit produces a single state 16×16 multiply function separate from the ALU, with 32-bit output to the ALU. One input to the ALU passes through a 0-to-15 bit shifter with sign extension.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIGS. 2A and 2B are an electrical diagram in block form of an MOS/LSI microcomputer device (including a CPU or central processor unit) employed in the system of FIG. 1 and utilizing features of the invention;

FIGS. 4 and 4a are greatly enlarged plan views of a semiconductor chip containing the microcomputer of FIG. 2, showing the physical layout of the various parts of the device;

DETAILED DESCRIPTION OF SPECIFIC EMBODIMENT

MICROPROCESSOR SYSTEM

Figure 1:
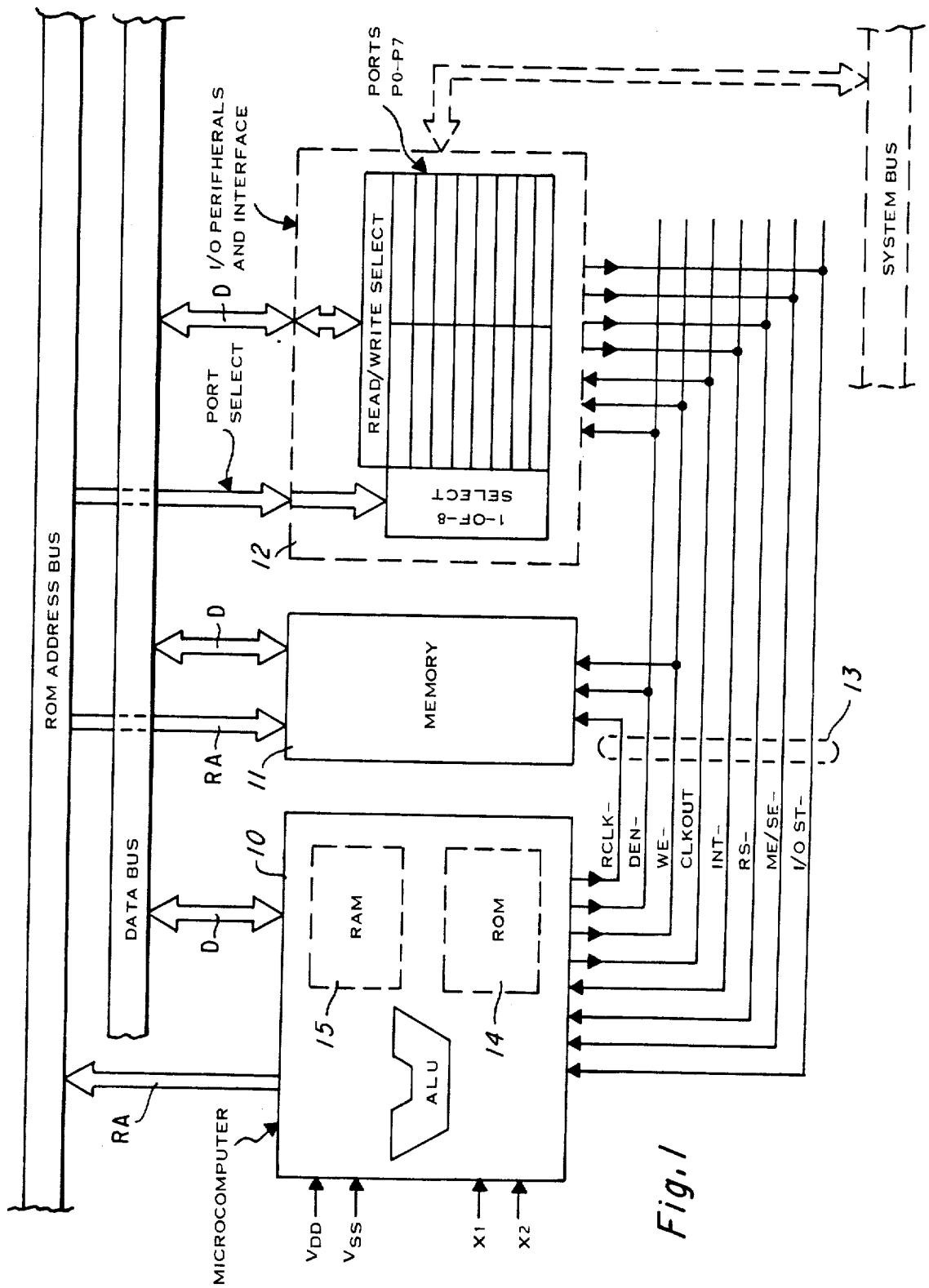
FIG. 1 is an electrical diagram in block form of a microcomputer system employing features of the invention.

The microcomputer device to be described herein is primarily used for signal processing, but concepts thereof may be used in processor devices of various configurations, and these devices may be used in many different systems; in one embodiment the microcomputer is used in a system shown in generalized form in FIG. 1. The system may be, for example, a voice communication system, a speech analysis system, a small "personal" or "home" computer, a single-board general purpose microcomputer, a word processing system, a computer terminal having local processing capability with display and typewriter keyboard, or any one of many applications of various types. The system includes a single-chip MOS/LSI central processing unit or microcomputer 10 which will be described in detail, along with a program or data memory 11 and input/output or I/O devices 12. Usually the I/O devices 12 for the typical system include analog-to-digital and/or digital-to-analog converters, a modem, a keyboard, a CRT display, a disc drive, etc. Often the I/O 12 includes coupling to a general purpose processor; that is, the microcomputer 10 is an attached processor in a larger system with interface via the I/O 12. The microprocessor 10, program data memory 11 and I/O 12 communicates with one another by two multibit, parallel address and data busses, D and RA, along with a control bus 13. The microcomputer 10 has suitable supply voltage and crystal-input terminals; for example, the device employs a single +5 V Vdd supply and ground or Vss, and a crystal is connected to terminals X1 and X2 of the device 10 to control certain system timing. The microcomputer 10 is a very high speed device with a crystal input of 20 MHz, providing in instruction execution rate of five million per second, in one embodiment.

The microcomputer device 10 is a general purpose microcomputer specifically aimed at serving a large class of serial signal processing problems such as digital filtering, signal handling for telecommunications modems (modulation, demodulation), data compression for linear predictive code (LPC) speech signals, fast Fourier transforms, and in general for virtually all computation intensive analog system functions, including detection, signal generation, mixing, phase tracking, angle measurement, feedback control, clock recovery, correlation, convolution, etc. It is suitable for applications which have computational requirements similar to those for control and signal processing, such as coordinate transformation, solution of linear differential equations which constant coefficients, averaging, etc. The device 10 is usually interfaced via I/O 12 to a general purpose processor such as a 99000, and 8600 or a 68000, to construct processing systems as will be explained.

It is understood that, even though described in the context of a microcomputer in the preferred embodiment, with an on-chip program ROM 14 and data RAM 15, neverthless some concepts of the invention may be used in a single-chip microprocessor with all off-chip program memory and/or data memory instead of the on-chip memory illustrated. Indeed, modes of operation are provided which disable the on-chip memory. Also, a microcomputer is shown having two separate external program address and data busses instead of the multiplexed, bidirectional busses which are now common, but some features herein disclosed are applicable where busses are multiplexed. The advantage of separating the busses and separating program and data memory space is speed.

In general terms, the system of FIG. 1 functions in the following manner: the microcomputer 10 fetches an instruction word internally by accessing the ROM 14 or externally by sending out an address on the ROM address bus RA to the memory 11 (and RCLK- on control bus 13). If external, the instruction word is received back via the data bus D from the addressed location in the memory 11. This instruction is executed in the next machine cycle (of length of 200 ns defined by a 20 MHz clock or crystal X1, X2) while a new instruction is being fetched; execution of an instruction may include accessing the on-chip RAM 15 for an operand, or writing a result into data RAM 15, and an arithmetic or logic operation in ALU.

In the example to be described in detail, a 12-bit instruction address applied internally to ROM 14 or externally to the RA bus directly addresses $2^{12}$ or 14K words of program instruction or constants in ROM 14 and memory 11. When reading from memory 11, a DEN- (data bus enable bar) command is asserted on control bus 13. It is also possible to write into the memory 11, and for this purpose a WE- (write enable bar) command is asserted by the device 10 on one of the control bus lines 13; the memory 11 may contain read/write memory devices in some or all of the address space, so the WE- command permits a write function.

The I/O devices 12 are addressed as ports; this interface to external devices 12 is accomplished using the address and data busses RA and D and control bus 13, but the I/O devices 12 do not occupy locations in the logical address space like the memory 11. This is in contrast to conventional memory-mapped I/O.

Data input/output via I/O or peripherals 12 employs a 3-bit field RAp from the bus RA to select one of eight 16-bit ports P0-P7 in peripheral circuitry 12. Each port can be defined as either input or output by DEN- or WE-, so in effect these are sixteen 16-bit ports, eight in and eight out. The selected 16-bit port is addressed by RAp and DEN- or WE-, when accessed for read or write via the bus D. This operation uses one of the two instructions IN or OUT; on the control bus 13, WE is active for write or OUT, or DEN- is active for read or IN. A ROM clock RCLK is active on control bus 13 on every machine cycle except when either DEN- or WE- is active; that is, the memory 11 is activated by RCLK- for possible instruction word access from off-chip in each machine cycle, but if accessing peripheral 12 using DEN- or WEthen the RCLK- does not occur.

A reset signal RS- on the control bus 13 clears the program counter and address bus RA (resets to zero), sets the data bus D in a high impedance state, and the memory controls DEN-, WE- and RCLK- in an inactive (high) state. All address and temporary data registers within the microcomputer 10 are cleared by a reset routine in the ROM 14, but the internal RAM is not cleared. In this manner, the peripheral circuitry 12 (such as a main processor) can assert control, or initiate a start-up or power-on sequence.

An interrupt signal INT- on the control bus 13 causes the microcomputer 10 to halt execution (saving the current ROM address) and go to an interrupt vector address, unless interrupts are masked by the program.

The ME/SE- line in the control bus 13 defines the memory expansion mode or systems emulator mode for the microcomputer 10. When this pin is held high (at +Vcc), the microcomputer executes from on-chip ROM and off-chip memory 11, but when low (Vss) the chip is in the systems emulator mode and execution is only from the memory 11 which is PROM, EPROM or RAM so the program can be easily changed.

THE MICROCOMPUTER CHIP

Figure 2B:
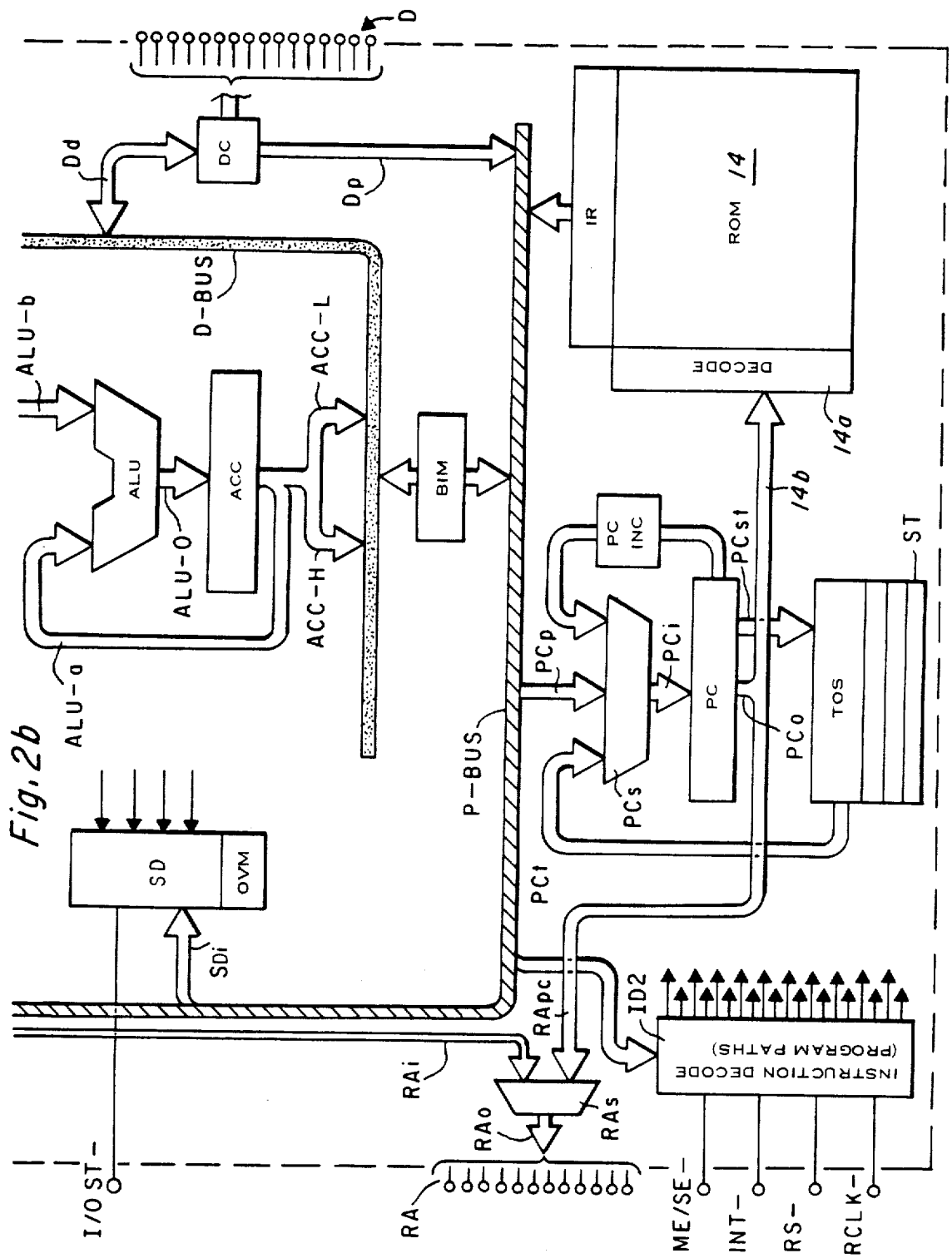

The internal architecture of the microcomputer 10 is shown in a detailed block diagram in FIG. 2. This device is a single-chip semiconductor integrated circuit mounted in a standard 40-pin dual-in-line package or a chip carrier. Sixteen pins or terminals of the package are needed for the 16-bit data bus D, twelve are used for the address bus RA and the remaining terminals are used for the power supply Vdd and Vss, the crystal X1, X2, and the control bus 13.

In addition to the program and data memory 14 and 15, the microcomputer 10 contains a central processing unit or CPU for the system of FIG. 1, and this CPU includes a 32-bit arithmetic/logic unit of ALU, a 32-bit accumulator Acc to hold operands and results, multiplier M separate from the ALU, a shifter S which is one input to the ALU, status or flag decode SD, and in instruction decoder ID1 which receives the current instruction word and generates the control bits fo the CPU and data memory portions of the device 10.

The program memory 14 has associated with it a program counter PC to hold the instruction address used to access the ROM 14 or sent out on bus RA to the memory 11, an instruction register IR to receive the instruction word from ROM 14, a stack ST to save program memory addresses, and an instruction decoder ID2 which receives the current instruction word and generates control bits for the program memory portion of the microcomputer. The instruction decoder ID1 and ID2 of course may be combined into one larger control ROM, or indeed split into smaller PLAs or random logic.

Associated with the data memory 15 are two auxiliary address registers AR0 and AR1 for the data memory 15, a page register ARP to select between the registers AR0 and AR1 for use as the data memory addresses, and a data page buffer DP to hold certain bits of the data memory address.

The CPU is oriented around two internal busses, a 16-bit program bus (P-Bus) and a 16-bit data bus (D-Bus). Program access and data access can thus occur simultaneously, and the address spaces are separate. The microcomputer is thus of the Harvard architecture, although a bus interchange module BIM permits loading the program counter PC from Acc, for example, or accessing ROM 14 for constants via P-Bus, BIM and D-Bus.

The two major requirements for a signal processing microcomputer are high speed arithmetic and flexibility. Performance is achieved by using separate, principally on-chip program and data memories 14 and 15, a large single accumulator Acc and a parallel multiplier M. A special purpose operation, data move, is defined within the data memory 15 which further enhances the performance in convolution operations. Flexibility has been achieved by defining an instruction set as will be described with reference to Table A, incorporating memory expansion and a single level of interrupt.

The device can be configured with, for example, less than 2K or $2^{11}$ words of on-chip program memory 14 yet the architecture allows for memory expansion up to 4K or $2^{12}$ words by the addition of external program memory in the memory 11. In addition, a separate mode allows the device 10 to be configured as a system emulation device; in this "system emulator" mode, the entire 4K memory space is external and the ROM 14 is not used.

The CPU

The arithmetic/logic unit or ALU consists of thirty-two parallel stages, each separate stage performing an arithmetic or logic function on its two input bits and producing a one-bit output and carry/borrow. The particular function performed on data passing through the ALU is defined by the current 16-bit instruction word in IR which is applied by the program bus P-Bus to an instruction decoder ID1. The ALU has two 32-bit data inputs ALU-a and ALU-b, and a 32-bit data output ALU-o to accumulator Acc. The ALU-a input is always from the accumulator Acc and the ALU-b input is always either from the shifter S or from a 32-bit product register P in the multiplier MM. The source of the ALU-b input is defined by an input select circuit ALU-s which selects from these two alternatives, based upon the contents of the current instruction word, i.e., the outputs #C of the decoder ID1. The shifter S receives a 16-bit input Si from D-Bus and produces a 32-bit output So which is the input Si shifted from zero to fifteen places to the left. Left-shifted data is zero-filled, i.e., all right-hand bit positions are filled with zeros when data is shifted out to the left. A unique feature is that the high-order bit is sign extended during shift operations. The ALU operates in twos-complement. The shifter S includes a shift control Sc loaded with a four-bit value from P-Bus via lines Sp so an arithmetic instruction can directly define the number of bits shifted in the path from D-Bus to the ALU-b input.

In this description, the LSB is considered to be on the right and the MSB on the left, so left-shift is toward more significant bits. Bit-O is the MSB and bit-15 is the LSB. Data is usually handled in signed 2's complement in this architecture.

The multiplier M is a 16×16 multiplier using carry feed-forward, constructed in dynamic/static logic, to implement Booth's algorithm. One input to the multiplier M is the T register which is a 16-bit register for temporary storage of the multiplicand received from D-Bus via lines Ti. The other 16-bit input is via lines Mi from the D-Bus; this multiplier input may be from the data memory 15 or may be a 13-bit multiply-immediate value derived directly from the instruction word (loaded right-justified and sign-extended).

The ALU always receives the contents of the accumulator Acc as its ALU-a input, and always stores its output in Acc, i.e., Acc is always the destination and the primary operand. The unit will add, subtract and perform the logic operations of And, Or and Exclusive Or. The logic operation results are between the lower half of Acc (bits 16–31) and a 16-bit value from the data memory 15. Due to passing the data memory value through the shifter S (with zero shift), the operand for the logical operation result of the MSBs (bits 0–15) is zero. The final 32-bit result reaching the accumulator is thus in two parts: Bits 0–15 will be Acc bits 0–15 Anded (or Or'ed, etc) with zero; bits 16–31 of the result will be Acc bits 16–31 Anded (etc.) with the data memory value. The accumulator Acc output, in addition to the 32-bit ALU-a input, includes high and low 16-bit outputs Acc-H (bits 0–15) and Acc-L (bits 16–31); separate instructions SACH "store accumulator high" and SACL "store accumulator low" are provided for storing high and low-order Acc 16-bit words in the data memory 15.

The status decoder SD monitors the Acc whenever an instruction which updates Acc is executed. Four bits of SD are OV, L, G and Z. Accumulator overflow (or underflow) is indicated by the OV bit, Acc contents less than zero is indicated by the L bit, Acc greater than zero indicated by the G bit, and Acc equal zero indicated by the Z bit. Upon interrupt the OV bit is saved in an overflow flag register, but the other bits are available only up to the time the next accumulator instruction is executed.

The accumulator overflow mode is a single-bit mode register OVM (included in SD), directly under program control, to allow for saturated results in signal processing computations. When the overflow mode OVM is reset, overflow results are loaded via ALU-o into the accumulator Acc from the ALU without modification. When the overflow mode is set, overflow results are set to the largest, or smallest, representable value of the ALU and loaded into the accumulator Acc. The largest or smallest value is determined by the sign of the overflow bit. This allows a saturated Acc result in signal processing applications, modeling the saturation process of analog signals.

A separate status bit in SD monitors the condition of the currently used auxiliary register AR0 or AR1 and detects the all-zero condition of the least significant nine bits of the current auxiliary register (i.e. loop counter portion). This bit is used for a branch instruction conditioned on non-zero for the auxiliary register, BARNZ or "branch on auxiliary register non-zero."

The input/output status bit I/O ST- is an external pin which is part of the control bus 13 and provides "branch on I/O zero" instruction BIOZ to interrogate the condition or peripheral circuits 12. A zero level on the I/O ST- pin will cause a branch when sampled by the BIOZ instruction.

The bus interchange module BIM exchanges the low-order twelve bits of the 16-bit value on the D-Bus with the low-order twelve bits on the P-Bus. This operation is not available to the programmer as an instruction, but instead is needed as an inherent operation in instructions such as table look up TBLR A or table write TBLW, or in a call-accumulator instruction CALLA where a computed address in Acc may be used to reach a subroutine. A 16-bit value from IR on the P-Bus may be loaded via BIM to D-Bus for storing in RAM 15, for example, in table-read.

Program Memory Addressing

The program memory 14 is a ROM which is partitioned ×16 to produce a 16-bit output to instruction register IR, and this ROM employs a decoder 14a which selects one 16-bit instruction word based on an 11-bit or 12-bit address on input lines 14b. In the example embodiment, the ROM 14 contains less than 2K words, so an 11-bit address can be used, but the on-chip program memory could be expanded to 4K with a 12-bit address. The circuit of the ROM 14 is expecially adapted for fast access as will be explained. The address input 14b is received from the program counter PC which is a 12-bit register containing the address of the instruction following the one being executed. That is, at the time when the control bits #C are valid at the outputs of the instruction decoders ID1 and ID2 for one instruction; PC contains the address of the next instruction. After an address in PC goes into decoder 14a to read the next instruction from ROM 14 into IR, the program counter PC is incremented via PCinc in preparation for another instruction fetch; i.e. PC is self incrementing under control of a #C control bit from ID2. The output PCo from the program counter PC is also applied via lines RApc and selector RAs (and output buffers not shown) to the external RA bus via output lines RAo and twelve output pins of the microcomputer device. The RA bus (RA0 through RA11) contains the PC output via RApc when the selector RAs is in one mode, or contains the 3-bit port address input RAi when executing I/O instructions IN and OUT. Whenever the address in PC is above the highest address in ROM 14, off-chip program addressing to memory 11 is assumed; however, the device is designed to operate principally with the on-chip ROM 14, so for many uses of the device off-chip fetches for program instructions would never be needed. The program counter PC may be loaded via input PCi and selector PCs from the P-Bus for branch or call instructions, or loaded from the accumulator Acc via Acc-L, D-Bus BIM, P-Bus, PCp and PCi in a "call accumulator" CALLA instruction or table-read and table-write.

The register stack ST is used for saving the contents of PC during subroutine and interrupt calls. In the illustrated embodiment, the stack ST contains four 12-bit registers constructed as a first-in, last-out push-down stack, although a larger or smaller number of registers could be used. The current contents of PC are saved by "pushing" onto the top-of-stack register TOS via lines PCst. Successive CALL instructions will keep pushing the current contents of PC onto TOS as the prior contents are shifted down, so up to four nested subroutines can be accomodated. A subroutine is terminated by execution of a return instruction RET which "pops" the stack, returning the contents of TOS to PC via lines PCt, selector PCs and input PCi, allowing the program to continue from the point it had reached prior to the last call or interrupt. When TOS is popped, the addresses in lower registers of ST move up one position. Each subroutine, initiated by a call instruction or an interrupt, must be terminated by a RET instruction.

In an example embodiment, the ROM 14 contains 1536 words, so the remainder of the 4K program address space, 2560 words, is off-chip in the memory 11. When the memory expansion control pin ME/SE- is high, at logic 1, the device interprets any program address in PC in the 0-to 1535 range as being an on-chip address for the ROM 14, and any address in the 1536–4095 range as being an off-chip address so that the PC contents are sent out via RApc and RAo to the RA bus. An output strobe RCLK- generated by the decoder ID2 for every machine state enables the external memory 11 (except when IN or OUT instructions are being executed). When off-chip program memory 11 is accessed, the instruction word read from memory 11 is applied to the external bus D and thus to the internal P-Bus via input/output control DC and lines Dp; this is a 16-bit instruction and, like the output of ROM 14 via IR, it is loaded into decoders ID1 and ID2 for execution, or 12-bits are loaded into PC via PCp, or otherwise used just as an on-chip instruction fetch.

When the ME/SE- pin is at zero the device enters the system emulator mode wherein the entire 4K program address space is off-chip, so all PC addresses are applied to the RA bus via RApc and RAo. This mode is necessary when a user is developing systems or programs, prior to arriving at a final version of code for the ROM 14. That is, the microcomputer 10 can operate with no code permanently programmed into the ROM so that new programs (stored in RAM or EPROM in the memory 11) can be tested and debugged, then when the final code is extablished the chips 10 are produced in large volume with this code mask-programmed into the ROM 14.

In either mode, the first two program addresses 0000 and 0001 are used for the reset function. When the reset pin RS- is brought low, an address of all zeros is forced into the program counter PC, as will be explained. Also, the third address is reserved for an interrupt vector; when the INT- pin is brought low, an address of 0002 is forced into PC to begin an interrupt routine.

Data Memory Addressing

The data memory 15 in the example embodiment contains 144 16-bit words, and so an 8-bit address is needed on address input 15a to the RAM address decoder 15b. However, the RAM 15 may be constructed with up to 512 words, requiring a 9-bit address, so the addressing arrangement will be described in terms of address bits which are unused in some embodiments. Each 128 word block of the RAM 15 is considered to be a page, so a 7-bit address field in an instruction word from program memory 14 on P-Bus via input 15c is used to directly address up to 128 words of data memory 15, within a page, and the page is selected by a data page buffer DP. Alternatively, for indirect addressing, two auxiliary registers AR0 and AR1 are employed in the example embodiment; however, up to eight of these 16-bit auxiliary registers may be used, with the particular one currently being used as the source of the indirect address for the RAM 15 being defined by the auxiliary register pointer ARP. With two registers AR0 and AR1, the pointer ARP is only one bit, but for an embodiment with eight auxiliary registers the pointer ARP is a 3-bit register. The 16-bit auxiliary registers AR0 and AR1 are under control of indirect-address instructions, or store, load or modify auxiliary register instructions SAR, LAR, annd MAR, as will be described. Nine-bit addresses from the low-order parts of the auxiliary registers may be applied to the address input 15a via selector 15d, lines 15e, selector 15f, and lines 15g, the paths being defined by control bits #C from ID1. When one of the auxiliary registers is to be the source of the RAM address, the selector 15d uses the value on lines 15e as the address input 15a, whereas if the P-Bus is to be the source of the RAM address the selector 15d uses a 7-bit address from input 15c and a 1-bit (expandable to 3-bit or 4-bit) page address from the data page register DP. The selector 15f is controlled by the pointer ARP which is loaded from P-Bus as defined by an instruction. The auxiliary registers are used for indirect addressing wherein an instruction need not contain a complete address for RAM 15 but instead merely specifies that an auxiliary register is to be used for this address; such instructions can also specify increment or decrement for the auxiliary register selected, in which case the nine LSBs of AR0 or AR1 are changed by +1 or −1 via paths Inc. The auxiliary registers may be thus used as loop counters. The auxiliary registers are accessed by the D-Bus via lines ARio so these registers may be used as miscellaneous working registers, or may be initially loaded to begin a loop count.

The data memory 15 is accessed using the D-Bus and an input/output circuit 15i, via lines 15j. Construction of the data memory is such that a data move wholly within the RAM 15 is permitted, according to an important feature of the microcomputer 10. Under instruction control, the data at one address can be moved to the next higher location within one machine cycle without using the ALU or D-Bus. Thus during an add, for example, the accessed data can be also moved to the next higher address.

Input/Output Functions

Input and output of data from the microcomputer chip 10 uses the data bus D and two of the lines of the control bus 13, these being data enable bar DE- and write enable bar WE-. Two instructions, IN and OUT, are employed for the data input and output functions. The external data bus D is coupled to the internal data bus D-Bus by the input/output control and data buffers DC and lines D1. The output buffers in DC are tri-state, so the output to data bus D from DC is always placed in a high impedance state except when OUT is being executed; to this end, one of the controls #C from the instruction decode ID1 sets the output buffers in high impdence state whenever OUT is not decoded. When the instruction IN is present, the control DC activates sixteen input buffers, so the external data bus D is coupled to the internal D-Bus via DC and lines Dd for data input. When the OUT instruction is decoded, a control #C from ID1 activates output buffers in DC so the internal D-Bus is coupled via Dd and DC to the external bus D.

Execution of an IN instruction will also generate a data enable DEN- strobe on line 13a from ID1, and will couple the D-Bus to the RAM 15 via 15i and 15j, so the data from external will be entered into on-chip data memory. The intended uses of the microcomputer as a signal processor require hundreds or thousands of accesses to RAM 15 for every off-chip reference. That is, a value will be fetched from off-chip then convolution or like operations performed using this new value and other data in the RAM 15, so thousands of instruction executions will transpire before another off-chip reference is needed. For this reason, the architecture favors internal data manipulation over off-chip data access.

Execution of an OUT instruction causes generation of an off-chip write enable WE- strobe on line 13b from ID1 and outputs data from RAM 15 via 15i and 15j, D-Bus, lines Dd and buffer DC to the external bus D. Referring to FIG. 1, this data may be written into one of the ports P0–P7 (selected by the 3-bit RAi value) in the peripherals 12.

Implicit in both the IN and OUT instructions is a 3-bit port address on lines RAi from ID1. This address is multiplexed onto the three LSBs (RA9–RA11) of the external address bus RA via selector RAs. Up to eight peripherals may thus be addressed. The remaining high order bits of the RA bus outputs are held at logic zero during these instructions.

THE INSTRUCTION SET

The microcomputer 10 of FIGS. 1 and 2 executes the instruction set of Table A. The Table shows in the first column the mneumonic or assembly language name of each instruction used in writing source code, followed in the second column by the object code in binary which is the form the code appears in the ROM 14 and in the instruction register IR. This binary code is decoded in ID1 and ID2 to generate all of the controls #C to execute the desired operation by accessing various busses and registers and setting the functions of the ALU. The Table also gives the number of cycles or machine states employed by the microcomputer in executing the instruction; note that all instructions except branches, calls, table look-up and input/output are executed in one state time. The microcomputer is not microcoded; the standard ALU instructions are executed in one state. The Table also shows the number of instruction words or opcodes needed to define each instruction; it is important to note that only branches and call direct require two instruction words. The right-hand column of Table A is a brief description of the operation for each instruction.

Most of the instructions of Table A show the low-order eight bits (bits 8–15) as "IAAAAAAA", which is the direct or indirect RAM 15 address for one operand. If the "I" bit, bit-8, is 0, the direct addressing mode is used, so the "A" field of the instruction word, bits 9–15, is employed as a direct address connected from IR through P-Bus, lines 15c and selector 15d to address input 15a. In this direct addressing mode, the auxiliary registers AR0–AR1 are not used.

For the instructions containing "IAAAAAA", the indirect addressing mode is specified by a 1 in the I field, bit-8, of these instructions. The input address on lines 15a for the RAM 15 will in this case be obtained from one of the auxiliary registers AR0 or AR1, and bit 15 will select which one. If bit-15 is 0, AR0 is used; if bit-15 is 1, AR1 is used. Thus bit-15 coupled from IR via P-Bus controls the selector 15f (and can be loaded into the ARP register). Since the number of auxiliary registers is expandable to eight, bits 13–15 of these indirect-address instructions are reserved for use with a 3-bit selector 15f and ARP register to define one-of-eight in the indirect addressing mode. Bit-10 to bit-12 are controls in indirect addressing: bit-10 causes the addressed auxiliary register to be incremented if 1, or no change if 0; bit-11 causes the addressed AR to be decremented if 1 or no change if 0; bit-12 if 0 causes bit-15 to be loaded into ARP after execution of the current instruction, or if 1 leaves the ARP unchanged.

The shift code SSSS used in several instructions of Table A is a four-bit field loaded into shift control Sc via Sp to define the number of spaces (zero to fifteen) that the data coming from the RAM 15 via D-Bus is left shifted as it passes through the shifter S on the way to the ALU-b input.

Although not material to the structure described herein, assembly language formats using the instruction set of Table A employ "A" to designate direct addressing and "@" to designate indirect. Thus, "ADD S,A" means add contents of memory location defined by the A field of the instruction word. "ADD A@" means add using contents of the data memory location addressed by the auxiliary register AR0 or AR1 selected by the existing contents of ARP. ADD S@+ means add using current contents of ARP to define AR then increment this auxiliary register for loop counting; ADD S@ is the same as previous except decrement by 1. ADD S@–, AR is same as previous except ARP is loaded with the value of bit-15 to define a new auxiliary register for subsequent operations.

The descriptions given in the right-hand column of Table A assume direct addressing. For indirect addressing, the above explanation applies.

The ADD instruction thus adds the 16-bit contents of RAM 15 (at location.OAAAAAAA for direct, or the contents at the locations in RAM 15 selected by the chosen AR if indirect), shifted SSSS spaces left, to the 32-bit contents of the Acc, and stores the result in the Acc. ADDH does the same except only the high-order half of Acc is the source of one operand and destination of the result, and no shift is performed.

The subtract instructions SUB and SUBH subtract the addressed RAM 15 data from the accumulator and store the result in Acc, but are otherwise the same as add. The load instruction LAC loads Acc with the 16-bit data addressed by IAAAAAAA which is left-shifted by SSSS bits. Only ADD, SUB and LAC specify a shift.

There are four instructions associated with the auxiliary registers: SAR, LAR, LARK and MAR. Store auxiliary register SAR causes the contents of one of the auxiliary registers defined by RRR to be stored in the memory location IAAAAAAA; the load AR instruction LAR is the reverse of SAR. The AR selected in SAR or LAR is defined by a pointer RP loaded from P-Bus with the RRR field of the instruction word, determining which of the auxiliary registers is coupled to D-Bus via lines ARio. With the LARK instruction a constant K from IR (bits 8–15) is loaded into the AR defined by RRR; this 8-bit constant K is right-justified and MSBs set to zero in the 16-bit auxiliary register. The modify auxiliary instruction MAR causes one auxiliary register to be modified by bit-10 to bit-12 as above, but no add or access to memory 15 access is implemented. The MAR code is operative only in the indirect mode, I=1; in direct mode this instruction results in no-op.

The input/output instructions are written in assembly language as "IN PA, A" or "OUT PA, A", where PA is the 3-bit port address PPP output on bits 9–11 of the RA bus (generated from the decoder ID1 and coupled via lines RAi). IN enables DEN- and disables RCLK-, while OUT enables WE- and disables RCLK-. The peripheral devices 12 decode RA9-RA11 to select one of eight 16-bit ports P0–P7, locations for read or write via the bus D. These instructions use two machine states so that the data input pins of bus D are free on the second state to allow external fetch of the next instruction from memory 11 instead of ROM 14.

The store accumulator instructions SACL and SACH, written as "SACL X,A" in assembly, cause the low or high order bits of Acc to be left-shifted XXX places and stored in the data memory 15 at the location defined direct or indirect by IAAAAAAA. The X field is not fully implemented in the example embodiment; for SACH only X=0, X=1 and X=4 are allowed. This shift is implemented in the accumulator Acc circuitry itself rather than in the shifter S or in ALU.

The arithmetic and logic instructions without shift code are ADDH, ADDS, SUBH, SUBS, SUBC, ZALH, ZALS, EXOR, AND, OR and LACK. These are all written as ADDH A, for example, in assembly language. ADDH causes the 16-bit data from the defined location in RAM 15 to be added to the high-order half of Acc and stored in the high-order half of Acc; actually the data from RAM 15 is left shifted sixteen bits in shifter S as it goes from D-Bus to the ALU-b input. The ADDS instruction means that the sign extension is suppressed in the shifter S; the data from RAM 15 defined by A is treated as a 16-bit positive number instead of a signed 2's complement integer. SUBH and SUBS correspond to ADDH and ADDS except subtract is performed in the ALU.

The conditional subtract instruction SUBC is used in divide operations. The contents of the defined location in RAM 15 are subtracted from the contents of Acc and left-shifted fifteen bits, producing an ALU output ALU-o which, if equal to zero is left-shifted by one bit and a +1 is added, with the result stored in Acc. If the ALU output is not equal to zero then it is left-shifted by one-bit and stored in Acc (the +1 is not added). SUBC is a two-cycle instruction that assumes the accumulator is not used in the following instruction. If the following operation involves Acc then a NO OP instruction should be inserted after SUBC.

The "xero accumulator load high" instruction ZALH fetches the 16-bit word at the addressed location in the RAM and loads it into the high-order half of Acc (bits 0–15); the Acc has been zeroed, so the low-order bits 16–31 remain zero. The shifter S is in the data path from D-Bus via ALU to Acc, so a 16-bit shift is performed in ZALH to move the data to the high-order half. The ZALS instruction fetches a word from RAM and loads it into the low-order half of the zeroed Acc, with sign extension suppressed in the shifter S.

The logic operations EXOR, AND and OR are performed in 32-bit format, even though the operand fetched is sixteen bits. For EXOR, the high-order half of Acc is Exclusive Or'ed with zeros, concatenated with Exclusive Or of the fetched data with the low-order half of Acc, both halves of the result being stored in Acc. The same applies to OR and AND.

The load accumulator instruction LACK causes an 8-bit constant contained in the eight LSB's of the instruction word to be loaded into the eight LSB's of Acc, right justfied; the upper twenty-four bits of Acc are zeroed. To accomplish this operation, the instruction word on P-Bus from IR (after ID1 and ID2 are loaded, of course), is coupled to the D-Bus by BIM, and thence to the ALU-b via shifter S (with no shift). The ALU performs "pass ALU-b" or add zeros to b, leaving the constant in Acc.

The data shift or data move instruction DSHT causes the contents of the defined location in the RAM 15 to be moved to the defined location plus one. This is accomplished internal to the RAM 15 without using the ALU or data bus D-Bus. The operation cannot cross a page boundry, however.

The "load T" instructions are used to set up multiply operations. LT causes the T register to be loaded from RAM 15 with the value defined by IAAAAAAA. The "load T with data move" instruction LTD employs an operation like DSHT in the RAM; the T register is loaded with the contents of the RAM 15 location defined by IAAAAAAA, then this same value is shifted to location IAAAAAAA+1, and also the contents of Acc is added in ALU to the contents of the P register with the result going to Acc. The LTA instruction is the same as LTD but without data move; the T register is loaded from RAM 15 and the P register is added to Acc, with result to Acc.

The multiply instruction MPY causes the 16-bit contents of T register to be multiplied in multiplier M (not using ALU) by the value from RAM 15 on the input Mi from D-Bus, with the 32-bit result going to the P register. The "multiply constant" instruction MPYK causes the 16-bit contents of T register to be multiplied by a 13-bit constant C from the opcode in IR; the 32-bit result stays in P register. For MPYK, the constant is connected from IR to Mi via P-Bus, BIM and D-Bus.

The "load data page" instructions LDPK and LDP cause the data page register DP to be loaded with up to eight bits from the opcode itself or from the defined location in RAM 15. In the embodiment shown, the DP register is only one bit, but in other embodiments with a larger RAM 15 the DP register contains up to eight bits. The page address remains the same in DP until a new load page instruction occurs.

The load status and store status instructions LST and SST are used in call subroutine or interrupts to save the contents of the status circuits SD, or restore status SD. These instructions are used instead of hard wired circuits for performing this function.

The disable and enable interrupt instructions DINT and EINT are used to mask or unmask the interrupt capability, i.e., these instructions reset or set a latch which determines whether or not the microcomputer 10 responds to the INT-pin.

An absolute value instruction ABS functions to assure that the accumulator contains only an absolute value, i.e., if Acc is less than zero, the absolute value of Acc is loaded into Acc, but if Acc is greater than zero there is no change. Similarly, the zero accumulator instruction ZAC clears Acc.

The overflow mode instructions RAMV and SAMV cause the overlfow mode latch OVM in the status decode SD to be set to 1 or reset to 0. When OVM is set, the ALU output is set to its maximum or minimum before loading into Acc upon overflow. This simulates the effect of saturating an amplifier in an analog circuit, and is useful in signal processing.

Three P register instructions PAC, HPAC and SPAC are used in manipulating data after a multiply MPY or MPYK. PAC loads the accumulator with the contents of the P register by passing the 32-bit data through the ALU without performing any operation to modify the data; actually the ALU-a input is zeroed and an Add is executed. The APAC instruction adds the contents of the P register to the contents of Acc, with the result going to Acc. Similarly, the SPAC subtracts the contents of P register from Acc, result to Acc.

The subroutine instructions are CALL, CALLA and RET. CALL is a two-word instruction; the first word is the opcode and the second is the absolute address of the first instruction in the subroutine. When CALL is decoded in ID2, PC is incremented to fetch the next instruction word which is the address, then the incremented contents of PC are pushed to stack ST. The subroutine ends in return RET which causes the address on TOS to be popped and loaded into PC. To save status, SST must be used before CALL, and LST inserted after RET. The CALLA instruction is unique for a Harvard architecture machine; this uses the contents of Acc as the subroutine address rather than using the next location addressed by PC+1. The low-order bits of Acc are transferred via Acc-L and BIM to the P-Bus and thus via PCp to the program counter PC. The incremented PC is saved in CALLA by pushing to ST just as in a CALL.

The table look up instructions TBLR and TBLW also employ the Acc as an address source. These instructions require three states to execute. The RAM 15 location defined by IAAAAAAA is transferred via D-Bus and BIM to P-Bus, and thus via PCp to PC, from whence this address is applied to ROM 14 or via RApc to the external RA bus.

The branch instructions all require two words, the first being the opcode and the second at PC+1 being the address. The low-order bits 8-15 of the branch opcodes are unused. Unconditional branch B loads the word at PC+1 into PC as the next address. BARNZ is conditional upon whether or not a loop counter, one of the auxiliary registers defined by ARP, is not-zero. BV causes a branch if the overflow bit OV in the status decode SD is a 1. BIOZ causes a branch if the IO bit from I/O ST- is active-low, corresponding to a 1 in the status decoder SD. The six instructions BLZ, BLEZ, BGZ, BGEZ, BNZ and BZ are all dependent upon the defined condition in SD reflecting the condition in Acc.

SYSTEM TIMING

Figure 3:
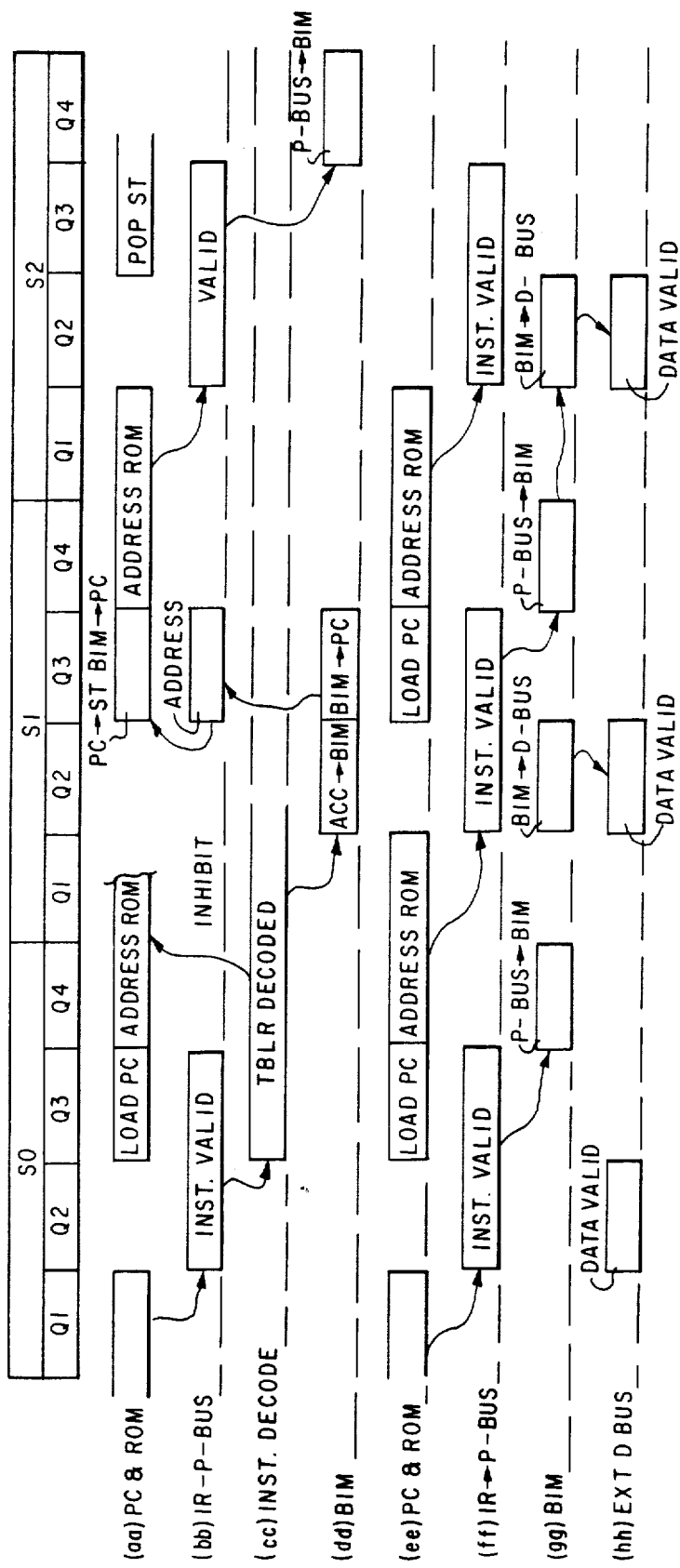
FIGS. 3a-3qq are timing diagrams showing voltage or event vs. time in the operation of the microcomputer of FIG. 2.

Referring to FIG. 3a et seq the timing of the system of FIG. 1 and the CPU chip of FIG. 2 is illustrated in a sequence of voltage vs. time waveforms or event vs. time diagrams. The chip 10 includes a clock generator 17 which has two external pins X1 and X2 to which a crystal (or external generator) is connected. The basic crystal frequency is up to 20 MHz and is represented by a clock $\Phi$ of FIG. 3a. This clock $\Phi$ has a period of 50 ns, minimum, and is used to generate four quarter-cycle clocks Q1, Q2, Q3 and Q4 seen in FIG. 3b-3e, providing the basic internal timing for the microcomputer chip 10. A set of four quarter cycle clocks Q1 to Q4 defines one machine state time of 200 ns, minimum; the states are referred to as S0, S1, S2, in FIG. 3. The clock generator 17 produces an output CLKOUT, FIG. 3f, on one of the control bus lines 13. CLKOUT has the same period as Q1, but 50% duty cycle and beginning at the midpoint of Q1. This output is used for timing or synchronizing external elements of the system of FIG. 1.

Internally, the microcomputer 19 executes one instruction per state time for most types of instructions, so five million instructions per second are executed at 20 MHz clock rate. Of course, some instructions such as input/output, branch, call or table look-up require two or three state times. Assuming a sequence of single-state instructions such as add, load, store, etc., a new address is loaded into PC during each Q3 as seen in FIG. 3g, then the ROM 14 is addressed during Q4 and Q1 so an instruction word output is produced from IR onto P-Bus valid in the next Q2 and continuing through Q3, as seen in FIG. 3h. The ROM 14 access time is thus about 100 ns. If an external instruction fetch from memory 11 is used, the same access time applies. Tthe instruction decoders ID1 and ID2 receive the instruction word from P-Bus during Q3 as seen in FIG. 3i, and most of the decoder outputs #C are valid during Q1, although some fast controls are available in Q4. For direct addressing of the RAM, the address on bit-9 to bit-15 of P-Bus is immediately gated into the RAM decoder 15b when P-Bus becomes valid, but in either direct or indirect the RAM address is valid by the beginning of Q3 as see in FIG. 3j. For RAM read, the data output via 15j to D-Bus is valid on Q4, FIG. 3j, and this data passes through the shifter S, FIG. 3k, and is available as an ALU input during Q1, FIG. 31. The ALU controls #C are valid in Q2 and the ALU output ALU-o is available during Q3. The accumulator Acc is loaded from ALU in Q4, FIG. 3m, then saturated in the next Q1.

It is thus seen that an ADD instruction, for example, for which fetch began at Q3 of the S0 state in FIG. 3a-3m, will be completed, i.e., the result loaded into Acc, in Q4 of state S2, then the saturated Acc available in Q1 of state S3 could be loaded to D-Bus in Q2. There is substantial overlap of instruction execution. A new instruction fetch begins during Q3 of each state time for one-state instructions, so execution of two more instructions may have begun before one is finished.

Not shown in FIG. 3a-3m is the write-RAM function. The RAM 15 is always written into during Q2. Addressing the RAM is always during Q3, however. Thus, an instruction such as "store accumulator low" SACL is illustrated in FIGS. 3n and 3o. The RAM address is received from the instruction register via P-Bus on Q3 of S1 (assuming the SACL instruction was fetched beginning at Q3 of S0), and the write will not occur until Q2 of state S2. During the read slot, Q4 of S1, a refresh occurs for the addressed row of the RAM, then the same address stays until Q2 of state S2 for the write. The D-Bus is loaded from Acc during this same Q2, see FIG. 3n.

If the accumulator must perform the saturate function in the overflow mode, i.e., OVM set to 1, this will be performed after the load accumulator function of FIG. 3m. That is, for the ADD instruction of FIGS. 3a-3m, the Acc is saturated during Q1 if the next state S3, so that when the accumulator is accessed by the following instruction it will be available to load the D-Bus on Q2.

When an instruction uses the data move function within the RAM 15, the move operation occurs during Q1 as illustrated in FIG. 3o. Also, if the increment loop counter function is performed for the auxiliary registers AR0 or AR1, the increment (or decrement) is executed in Q1. The T register, auxiliary registers AR0 or AR1, ARP latch, DP register and stack ST registers are each loaded during Q2 of any state time if these functions are included in the current instruction.

The bus interchange module BIM always executes a transfer from D-Bus to P-Bus beginning in Q2, if this function is defined by the instruction. The transfer from P-Bus to D-Bus by BIM is begun during Q4. The D-Bus is precharged on Q3 of every cycle, so no data can carry over on D-Bus through Q3 of any state, nor can data be loaded to or from D-Bus during Q3.

The program counter PC is incremented by the PCinc path during Q3 of each state time. That is, the load PC function of FIG. 3g is the incremented value just generated.

Execution of a branch instruction is illustrated in FIG. 3p-3r. If the instruction loaded into the decoders ID1 and ID2 during Q3 of state S0 is a branch, the status decode SD bits from the previous instruction are valid during Q1 of S1 so the decision of branch or not is made at this point. Meanwhile, of course, another instruction fetch has begun so if the branch condition is met the instruction delivered to P-Bus during Q2 of S1 is used as the next address but not executed, i.e., not loaded to ID1 and ID2; if the condition iis not met, however, this instruction is discarded i.e., stays in P-Bus until precharge. Assujing the condition is met, the branch address is loaded from IR via P-Bus to PC during Q3 of S1, and the new instruction delivered to IR and P-Bus in Q2 of S2 then decoded and executed beginning at Q3 of S2, FIG. 3r.

A CALL instruction is executed in the same time sequence as a branch, seen in FIG. 3p-3r, except no SD evaluation is needed, and the original PC+1 is pushed to stack ST during Q3 of S1.

A return instruction RET is a two cycle instruction as illustrated in FIG. 3s-3u. If the instruction loaded into the decoders ID1 and ID2 during Q3 of state S0 is RET, the instruction fetch which began with PC "increment and load PC" in Q3 of S1 is discarded and a pop stack function is performed in Q3 of S1 so the next instruction fetch is to the return address. The instruction fetched during Q4 of S1 is then decoded and executed beginning at Q3 of S2.

Input (or output) instructions are executed in two cycles as illustrated in FIGS. 3v-3z. Assume the opcode loaded into the decoder ID2 in Q3 of S0 is IN, seen in FIG. 3x. The instruction fetched beginning at Q3 of S0 is not used, execution is inhibited by the decode of IN so it is never loaded from IR to P-Bus. The contents of PC at Q3 of S1 are saved until Q3 of S2 for the next instruction fetch; that is, PC is recirculated back to PC by the increment path, but no increment is performed. The controls #C produced from decode of IN are available for two states. The RAM address is loaded from P-Bus on Q3 of S1, seen in FIG. 3y, and the data input reaches D-Bus on Q4 of S1 and is written into RAM 15 during Q2 of S2. The DEN-control is active from Q4 of S1 through Q2 of S2 for the IN function. An OUT instruction is executed like IN except the RAM 15 is read during Q4 of S1 and the INE-control is active instead of DEN-.

A table look up instruction is executed as shown in FIG. 3aa-3dd. The TBLR opcode is decoded beginning at Q3 of S0 and causes the Acc to be copied via D-Bus to BIM in Q2 of S1, then PC is loaded with this Acc value via P-Bus from BIM in Q3 of S1 so the content of Acc is used as the next instruction fetch address. Meanwhile, execution of the instruction fetched beginning at Q3 of S0 is inhibited by preventing a ROM read control #NRIR from copying IR to P-Bus (the ROM 14 output), at Q2 of S1. The incremented contents of PC from Q3 of S0 are pushed to ST during Q3 of S1, then popped at Q3 of S2 as the following instruction address. The data fetched from ROM 14 (or memory 11) using the address from Acc during Q4/S1 to Q1/S2 is loaded onto P-Bus during Q2 of S2 where it remains until Q4 of S2 at which time the BIM accepts the data from P-Bus and then transfers it to D-Bus on Q2 of S3, the next state. The destination address for RAM 15 is loaded into decoder 15b from P-Bus by Q3 of S1 and remains for two states, so the RAM write occurring at Q2 of S3 will use the RAM address defined in the original TBLR opcode.

One of the problems inherent in manufacturing microcomputer devices is that of testing the parts to determine whether or not all of the elements are functional. In many microcomputers, the instruction words read from the internal ROM are not available on external busses and so the ROM cannot be checked in any way other than by executing all possible functions, which can be lengthy. The device of FIG. 2 allows the ROM 14 to be read out one word at a time using the bus interchange module as illustrated in FIGS. 3ee-3hh. A test mode, not part of the instruction set of Table A, is entered by holding the I/O ST-pin at above Vdd, for example 10 V, and holding RS-low, producing an input to the decoders ID1 and ID2 causing a ROM output function in which the ROM 14 is accessed every cycle and PC increment as seen in FIG. 3ee. The P-Bus receives the ROM output, FIG. 3ff, but the opcodes are not loaded into the decoders ID1, ID2. Instead, the BIM accepts the opcodes from P-Bus on Q4 of each cycle and transfers to D-Bus on the next Q2, as seen in FIG. 3hh.

The Chip Layout

Figure 4:
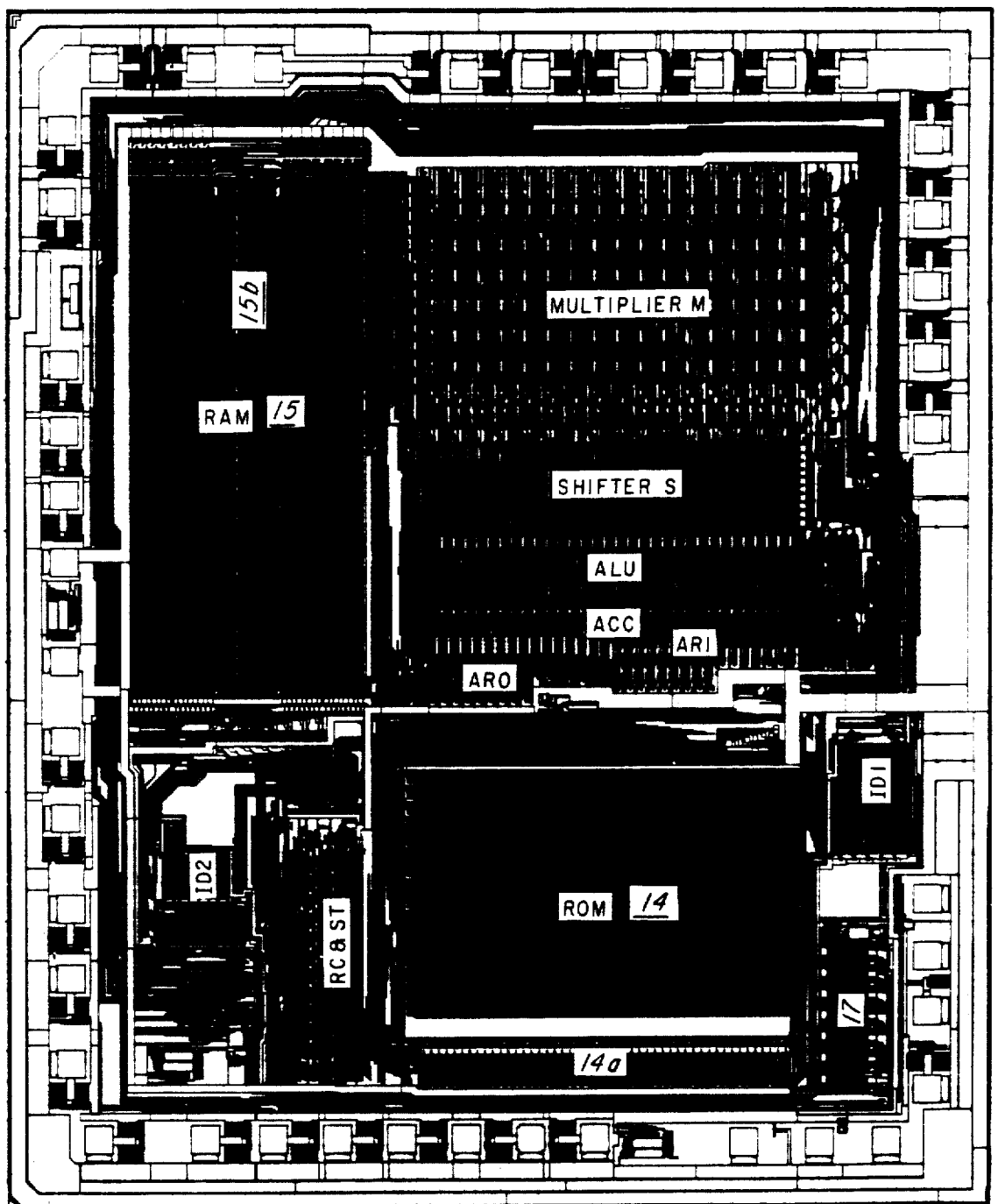
Figure 40:
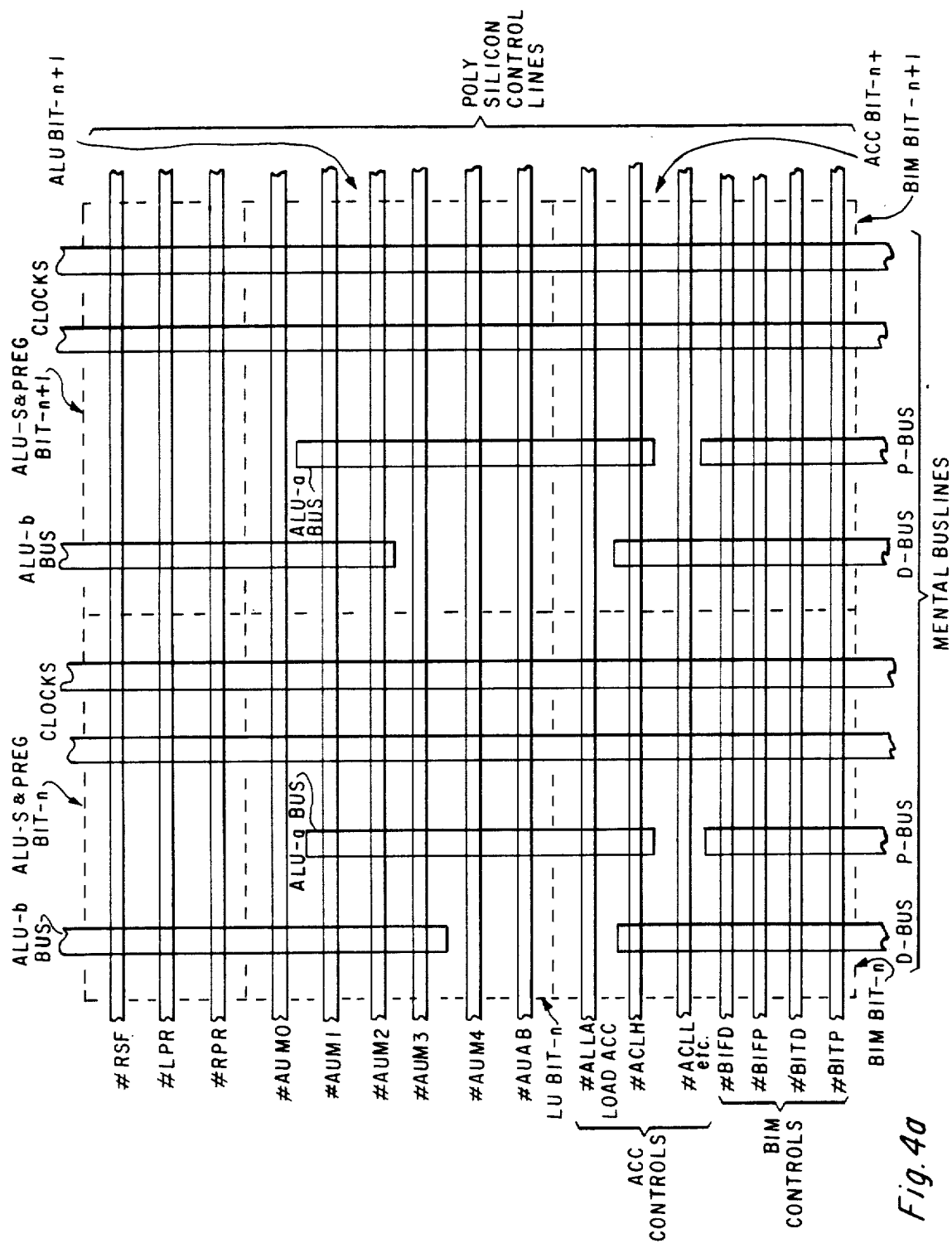

In FIG. 4, the microcomputer 10 of FIGS. 1 and 2 is illustrated in chip layout form. This is a top view of an MOS/LSI chip which is about 150 mils on a side. A major part of the area of the chip 10 is occupied by the memory including the ROM 14 and RAM 15 with their address decoders, and by the 16×16 multiplier M.

The ROM 14 has associated with it an X address decoder 14x and a separate Y address decoder 14y for instruction word output; twelve address bits are used to define one of up to 4096 16-bit words in the ROM 14, although in this example only 1536 words are on-chip.

The RAM 15 has an X address decoder 15bx which selects 1-of-144 row lines and a Y address decoder 15by which select 1-of-2 column lines, so only eight bits are needed for the RAM select in this embodiment (eight bits could accommodate a 256 word RAM).

The busses RA and D have twelve and sixteen bonding pads on the chip (total of twenty-eight) for connection to external, and the areas of the chip around these bonding pads seen in FIG. 4 are occupied by the buffers used for the ports. It will be noted that the RA bus is only used for output, so only output buffers are needed for this port, while the D-Bus requires tri-state output buffers as well as input buffers.

The multiplier M, shifter S, ALU, accumulator Acc, BIM and auxiliary registers AR0, AR1 on the chip 10 of FIG. 4 comprise a 32-bit wide "strip" which is an array of rows (parallel to control lines #C) and columns (parallel to metal bus lines such as D-Bus and P-Bus and ALU and register bits) containing all of the 16-bit and 32-bit registers, ALU bits, and the like circuitry associated with the D-Bus and related control lines #C. As set forth in U.S. Pat. 4,402,044 issued to McDonough and Guttag, assigned to Texas Instruments, an important feature is that the 32-bit ALU and its associated 32-bit Acc registers, the two 16-bit AR registers, the shifter S, and the bus interchange BIM as described above are laid out on the MOS/LSI chip 10 in a regular strip pattern as seen in FIG. 4. Other circuitry connected to the D-Bus and the ALU-b input and having controls #C shared by sixteen or thirty-two bits may also be in the strip, such as AR and BIM. Tthe Acc and the ALU each contain thirty-two bits or stages which are laid out in a regular pattern like memory cells, the bits arrayed and aligned horizontally and vertically as seen in FIG. 4. D-Bus and P-Bus of FIG. 2 are each sixteen parallel metal strips on top of the cells of the ALU and registers, and all of the dozens of control lines #C are horizontal polysilicon lines typically used as the control gates for transistors in the ALU and its associated registers and like circuitry. This layout arrangement is advantageous because the multiplier ALU and registers, and perpendicular control lines #C and metal busses fit in an array with virtually none of the wasted space used merely for routing conductors in conventional contruction of microprocessors. Metal bus lines such as P-Bus and D-Bus and control lines #C are in large part routed over functional regions or cells of the chip in the strip rather than over unused silicon, and many 90 degree turns are produced inherently at functional cells rather than in conductor routing. In the prior devices, the controls, the registers, the ALU, etc. where islands of circuitry connected by busses or conductors. The enlarged view of FIG. 4a shows a small part of the strip, two-bits wide, illustrating the metal bus lines and the polysilicon control lines #C for an N-channel silicon gate MOS device made generally by a single-level polysilicon process according to U.S. Pat. No. 4,055,444, assigned to Texas Instruments. Various contacts (not shown) would be made within each register bit or stage from metal to silicon or to polysilicon. It is significant to note that many of the connecting lines from registers to busses illustrated in FIG. 2 are not physically lines or elongated conductors at all but instead are merely metal-to-silicon or metal-to-poly contact areas along the metal bus lines of FIG. 4a. That is, routing of 16-bit or 32-bit sets of parallel conductors is minimized by the strip feature, and the size of the chip 10 is reduced. All busses are not needed in any one part of the strip, and thus the pitch or maximum width of cells of the strip is minimized since the metal-to-metal spacing is a critical limiting factor in bit density.

The internal program of the microcomputer 10 may be modified at the gate level mask in making the chip. The macro code or program in the ROM 14 is defined by a single mask in the manufacturing process as set forth for example in U.S. Pat. Nos. 3,541,543, 4,208,726 or 4,230,504, assigned to Texas Instruments. By rewriting this user or macrocode, keeping the instruction set defined by ID1 and ID2 the same, a wide variety of different functions and operations are available.

Arithmetic Logic Unit

Figure 5A:
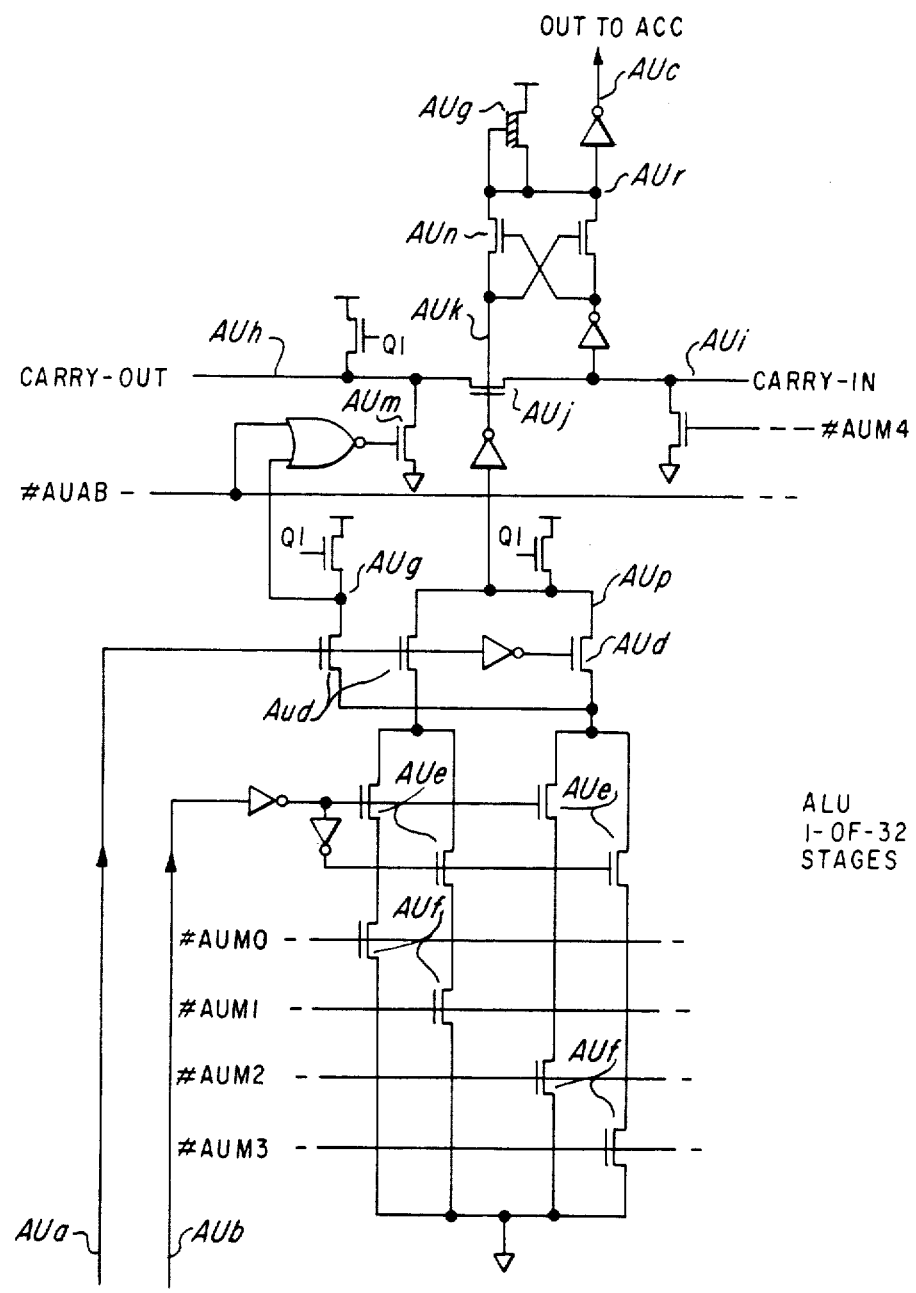
FIGS. 5a-5q are electrical schematic diagrams of particular circuits in the microcomputer device of FIG. 2.

A detailed schematic diagram of one bit of the 32-bit ALU is shown in FIG. 5a. The ALU operates under control of six of the #C commands from the instruction decode ID1, these commands being labelled #AUM0--#AUM4 (valid on Q2) and #AUAB (valid on Q1). The ALU-a input, inverted, is on line AUa and the ALU-b input inverted, is on line AUb, both being valid on Q1, one from Acc and the other from the shifter S or P register. The ALU output is at line AUc, valid on Q4, representing one of the inverted 32-bit parallel output ALU-o to Acc. Table B shows the function produced by operation of the ALU for various combinations of the six #C commands. This ALU is generally the same as U.S. Pat. No. 4,422,143 issued to Karl M. Guttag, assigned to Texas Instruments. Propagate and generate nodes AUp and AUg are precharged on Q1 and conditionally discharged by transistors AUd controlled by the ALU-a input, transistor AUe controlled by the ALU-b input and its complement, and transistors AUf controlled by the #AUM0-#AUM3 commands, according to the functions of Table B. A carry-out node AUh and a carry-in node AUi for each bit are coupled by a propagate-carry transistor AUj controlled by a line AUk which is the propagate node AUp inverted. The carry-out node AUh is precharged on Q1 and conditionally discharged via transistor AUm which is controlled by a NOR gate having a generate node AUg as one input and the absolute value command #AUAB as the other, so if #AUAB is 1 the transistor AUm is off and carry-out bar is always 1, meaning no carry or absolute value. If #AUAB is 0, the generate signal on AUg controls. The inverted propagate signal on AUk is one input to an Exclusive Nor circuit AUn with static load AUq; the inverted carry-in bar of line AUi is the other input to the Exclusive NOR, resulting in an output AUr which inverted is the ALU output AUc. The carry-in bar node AUi is made unconditionally 0 when control #AUM4 is high for logic functions OR, AND and EXOR, so this input to circuit AUn is unconditionally 1, but for ADD, SUB, etc., the control #AUM4 is 0 and the carry-in from the node AUu of the next low-order bit of the ALU controls.

The Shifter S

Figure 5B:
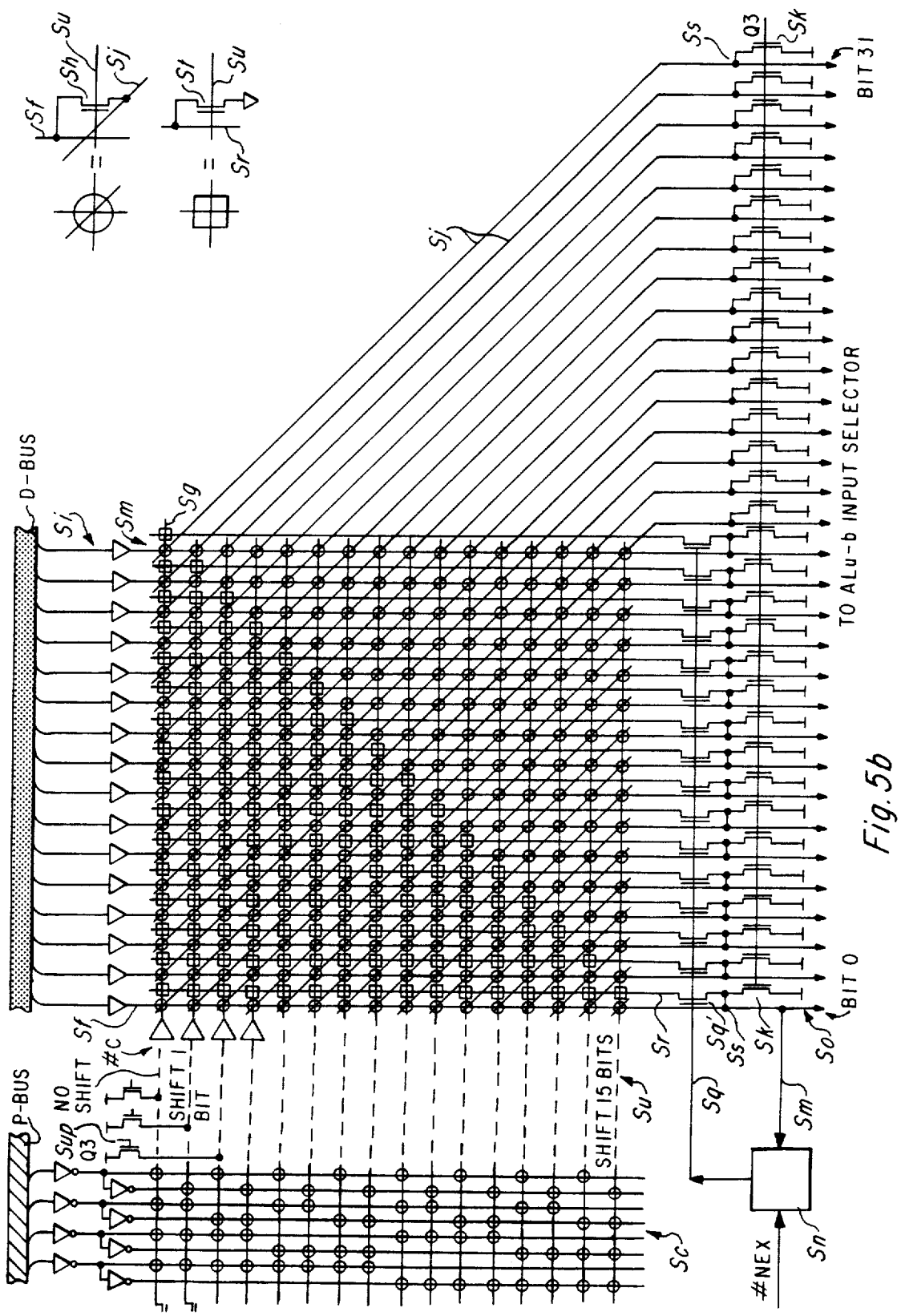

Referring to FIG. 5b, the shifter S includes a 16-bit input Si, a shift matrix Sm, a shift controller Sc, and a 32-bit output So going to the ALU-b input. The nput Si is connected to receive the D-Bus at all times and to drive lines Sf in the matrix Sm through high level buffers. If no shift is to be performed, a line Sg is high, turning on all sixteen of the transistors Sh for this line, so the 16-bit data on lines Sf will appear on the sixteen right-most output lines So via diagonal lines Sj. All of the lines Sf are precharged on Q3 via thirty-two transistors Sk then conditionally discharged by the input Si. The sign bit is extended by detecting the MSB bit-0 of the input Si by the line Sm. A gate Sn also receives a #NEX not extend command from ID1 (one of the controls #C) to kill the sign extension for certain instructions of Table A. Based on the incoming sign bit Sm and #NEX, the gate Sn generates an extend command on line Sq to transistors Sq'. The transistors Sq' in series with lines Sr conditionally discharge the nodes Ss on lines Sf through transistors St. The control Sc is a 1-of-16 decoder or selector which receives the bits 4–7 of the instruction word from the P-Bus on 4-bit input Sp during Q3 and activates one of the sixteen lines Su; the lines Su are precharged in Q3 via transistors Sup and conditionally discharged during Q4 via transistors Sud and Sc'. The controls for the shifter S consist of the 4-bit value on Sp (the SSSS field of the ADD instruction, for example) defining the number of positions of left shift, and controls on lines #C for negating sign extension, etc. Since the data is usually in two's complement, the sign bit is extended to all bits to the left of the most significant data bit. The sign bit is 0 for positive and 1 for negative. If the shift is to be seven bits, for example, the seventh line Su stays high on Q4 and all others go low. This turns on all transistors Sh and St in the seventh row and all other transistors Sh and St are off. The 16-bit data coming in on lines Si is thus moved via transistors Sh and lines Sj to a position on lines So seven bits to the left of the zero shift (right-most) position, and zero-filled to the right due to the precharge Sk. To the left, the sign bit will stay 0 if the bit-0 is low, but if bit-0 is 1 then Sq is high, transistors Sq are on, allowing all bits to the left to discharge.

Accumulator

Figure 5C:
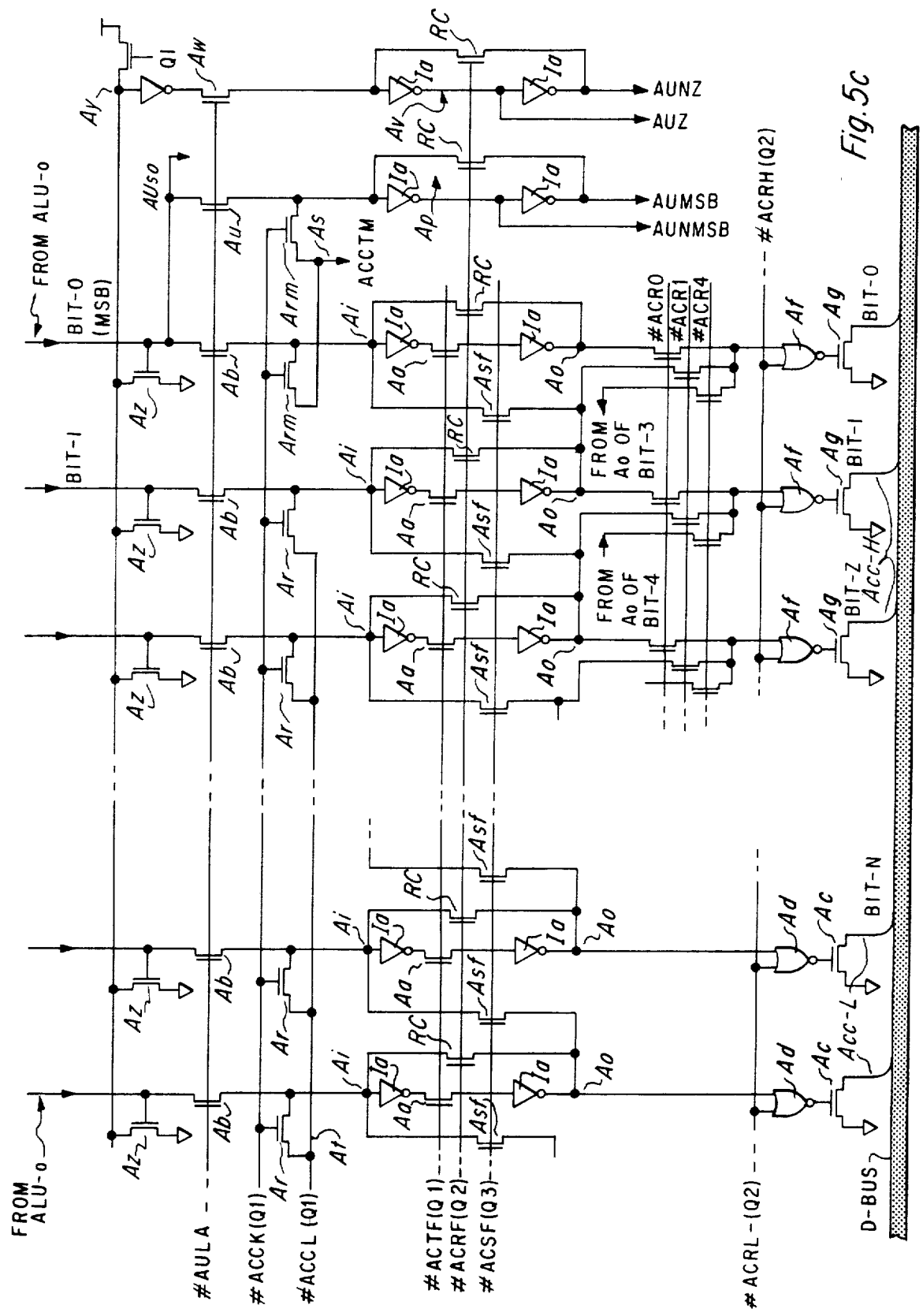

A detailed schematic diagram of representative high-order bits and low-order bits of the 32-bit accumulator Acc and its controls is shown in FIG. 5c. In each bit, two dynamic inverters Ia are used, with a recirculate transistor RC connected between input Ai and output Ao, and activated by an accumulator refresh control #ACRF valid on Q2. The coupling from the output of the first inverter Ia to the input of the second Ia is through a transistor Aa controlled by command #ACTF on Q1. Input node Ai is connected to the ALU-o output via transistor Ab controlled by load accumulator command #AULA valid on Q4. Output node Ao (for low-order bits Acc-L) is connected via line Ac and a Nor gate Ad which is controlled by a "read accumulator low" command #ACRL valid on Q2. Thus, the low-order bits may conditionally discharge the D-Bus during Q2 via transistor Ae and lines Acc-L. Similarly, the high-order sixteen bits of Acc are coupled from output node Ao of each bit via Nor gate controlled by a "read accumulator high" command #ACRH valid on Q2. Accordingly, the high-order bits of Acc may conditionally discharge D-Bus via transistor Ag and lines Acc-H, assuming an "accumulator read no shift" command #ACRO was valid on Q1 turning on series transistor Ah. The high-order bits may be left-shifted one or four bits by Acc read commands #ACR1 and #ACR4 and transistors Aj and Ak, respectively. The one-bit shift is used to scale the multiplier M output in multiply operations where the answer is 31-bits because of the sign bits in 16×16 multiply. The 4-bit shift is used in a multiply by constant instruction because the constant is twelve bits from P-Bus and this should be left-shifted by four places to fill out the 16-bit word. Also, when processing data which the programmer knows to be scaled much less than zero (with many zeros following a decimal point, in effect), the Acc can be stored with shift so that significant data wouldn't be lost, particularly in repeated multiply operations. The instruction set permits zero the seven places of shift with the XXX bits of SACL or SACH, so additional transistors like Ah, Aj and Ak would fully populate this function for both Acc-L and Acc-H.

The Z input bit for the status decoder is generated in the circuit of FIG. 5c by a set of thirty-two transistors Az having their gates connected to the ALU-o bits and all drains connected to a node Ay precharged on Q1. When the load Acc command #AULA is present on Q4, the node Ay is connected to latch Av by transistor AW which will be 1 if the ALU output is all zeros, or 0 otherwise. The latch Av has two inverters Ia and recirculate via RC on #AURF, Q3. On Q4, the ALU all zero bit Z is valid on output AUZ and its complement on AUNZ.

The most significant bit of the ALU-o output, bit-0, is connected on Q4 from node Am through transistor An to a latch Ap like latch Av, producing the AUMSB bit and inverted AUNMSB bit which are used in the status decode SD to represent the sign of the data.

A set of thirty-one transistors Ar having all their gates connected to the Acc clock command #ACCK (on Q1) is used to saturate the accumulator input, positive or negative, or to zero the accumulator. The high-order bit-0 is connected from node Am by separate transistors Arm to a node As which is used for saturate control ACCTM on Q1. All the low-order bits are connected via transistors Ar to a line At which receives a control #ACCTL. To saturate high, the sign bit is detected at As as 0 (for positive) by #ACCTM being 0, and all the other thirty-one bits set to 1 by setting ACCTL on line Ae to 1, while #ACCK goes to 1, all on Q1. To saturate low, the sign bit is dectected as 1 (for negative) and all thirty-one low-order bits set to 0 via Ar and At. The latch Ap and AUMSB can be set the same as bit-o of Acc, by means of node As, ACCTM and transistor Arm. The accumulator could be set to all 0 or all 1 by placing the same value on ACCTL and ACCTM and activating #ACCK.

The subtract-conditional instruction SUBC requires a 1-bit left-shift when the ALU output is loaded into Acc. This is implemented by transistors Asf which are gated on Q3 by an #ACSF command. Thus, the output ALU-o is valid on inputs Ai at Q4 with no shift (then can be saturated during Q1), passes through this Acc stage on Q1 is recirculated on Q2, then can be shifted from Ao of one bit to Ai of the next more significant bit through transistor Asf on Q3, if a conditional subtract is being executed, depending upon whether the MSB is 1 or 0. It is assumed that the next state after SUBC is either a non-ALU instruction or a NO OP. The LSB is set to 1 via transistor Asf-31 by a control ACLB on Q3 if the ALU-o LSB output is 0, i.e., if AUNZ is 1 and AUMSB is 0; otherwise, a 1 is not added in SUBC instructions.

Status Decode

Figure 5D:
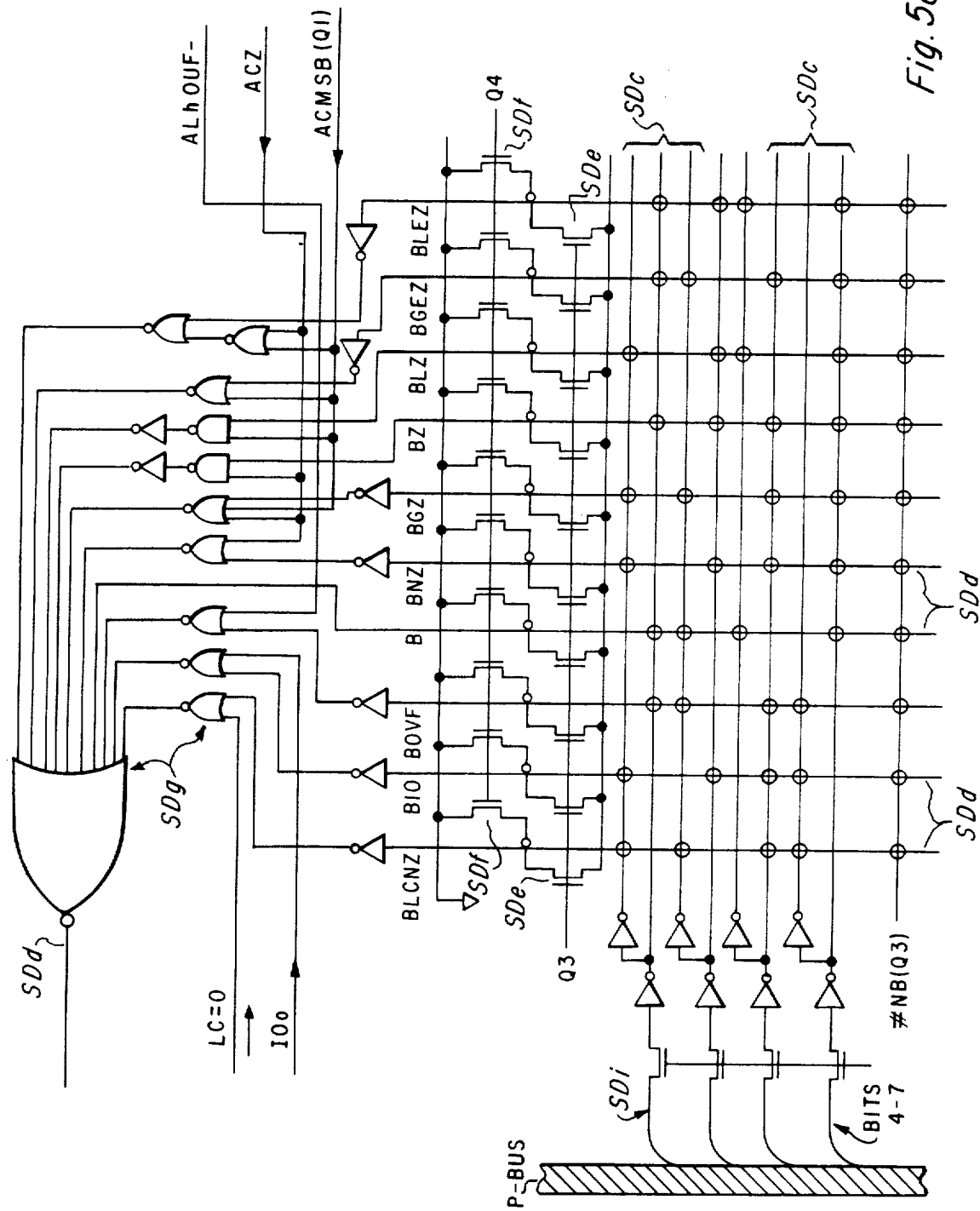

The status decode circuit SD is shown in detail in FIG. 5d. This circuit produces a branch command on line SDb going to decoder ID2, valid on Q2, when the conditions are satisfied for one of the branch instructions. This branch command causes control bits #C to, among other things, command the selector PCs to load PC from the P-Bus for the next address. The decode circuit SD receives the branch control bits 4-7 of the instruction word from P-Bus on inputs SDi, gated in on Q3, and receives a "not branch" command #NB via line SDi from the data decoder ID1, to generate true and complement of the bits 4-7 on row lines SDc, and produces a one-of-ten output on lines SDd valid on Q4. Referring to the instruction set of Table A, the ten branches are selected by bits 4-7 of the instruction word, and bits 0-3 must be 1 which is accounted for by the #NB input. Column lines of the decoder are precharged on Q3 by transistors SDe, and conditionally discharged on Q4 by transistors SDf. The gates SDg receive the SDd outputs and the status lines SDi from the ALU, Acc, loop counter and I/O pin. One of these lines SDi signifies that the ALU output is equal to zero (the Z input). Another line SDi signifies that the selected loop counter is zero (the LCZ input). The MSB input of lines SDs is derived from the most significant bit of the ALU output. The NV input is the inverse of overflow V and is derived from the ALU output by detecting no carry from the MSB. The other one of the inputs SDs is from the I/O ST- pin and signifies that an external condition input is valid; this input is valid on Q3. All of the other inputs SDs are valid on Q1, and since the inputs SDd are valid on Q4, the status control SDb will be valid on Q2 of one cycle for the ALU operation of the prior cycle.

Bus Interchange Module

Figure 5E:
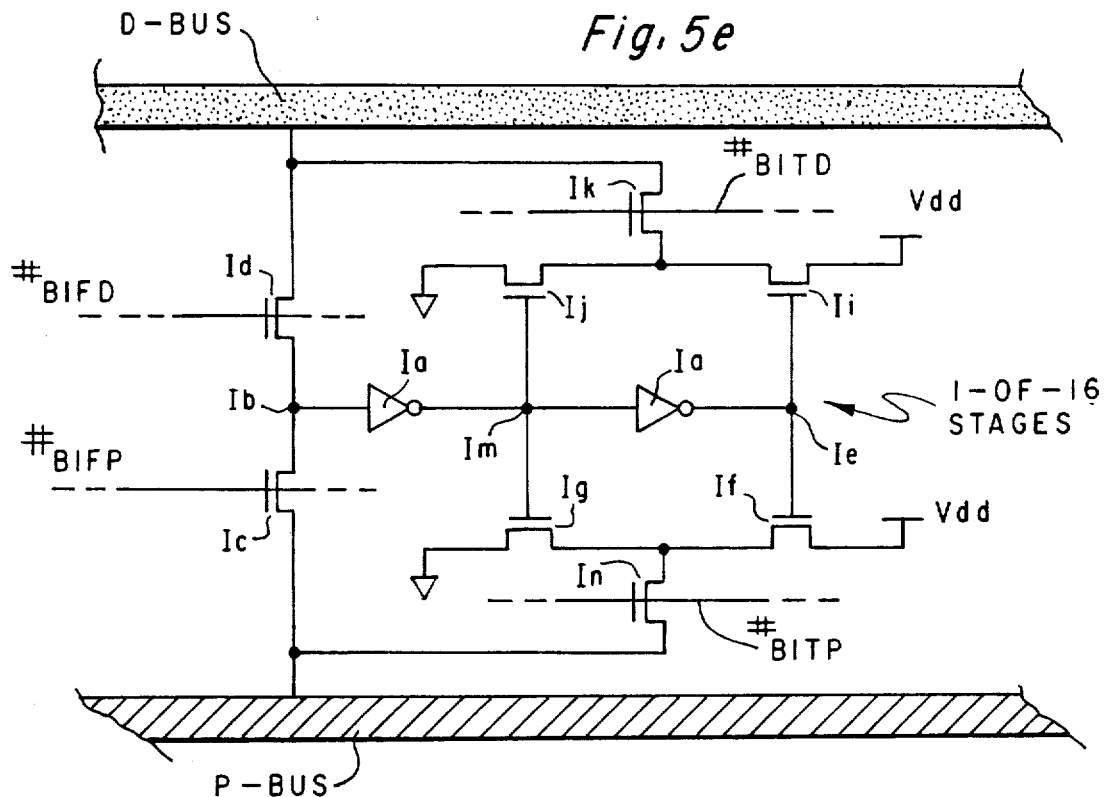

The bus interchange module BIM, shown in detail in FIG. 5e, consists of sixteen identical stages, only one of which is illustrated. Each stage has two clocked inverters Ia, with no feedback loop since data is not held in BIM longer than about half a state time. Input node Ib is connected to the respective bit of P-Bus via one of sixteen transistors Ic driven by a control bit #BIFP valid on Q4. The D-Bus is connected to the input node Ib via transistors Id driven by the control bit #BIFD (Bus Interchange From D) from decoder ID1 valid on Q2. The output node Ie is connected to the P-Bus by a push-pull stage including transistors If and Ig, and a transistor Ih driven by a control bit #BITP, valid during Q2 and Q3. Likewise, output node Ie is coupled to the D-Bus via a push-pull stage having driver transistors Ii and Ij, and a transistor Ik driven by a control bit #BITD valid on Q2 and Q4. The transistors Ig and Ij are driven by node Im at the output of the first inverter Ia, providing a push-pull output. Data is transferred from D-Bus to nodes Ib, Im, Ie on Q2, and then from these nodes to P-Bus on Q4. Similarly, data is transferred from P-Bus to nodes Ib, Im, Ie on Q4, and then from these nodes to D-Bus on Q4 or the next Q2.

The Multiplier

Figure 5G:
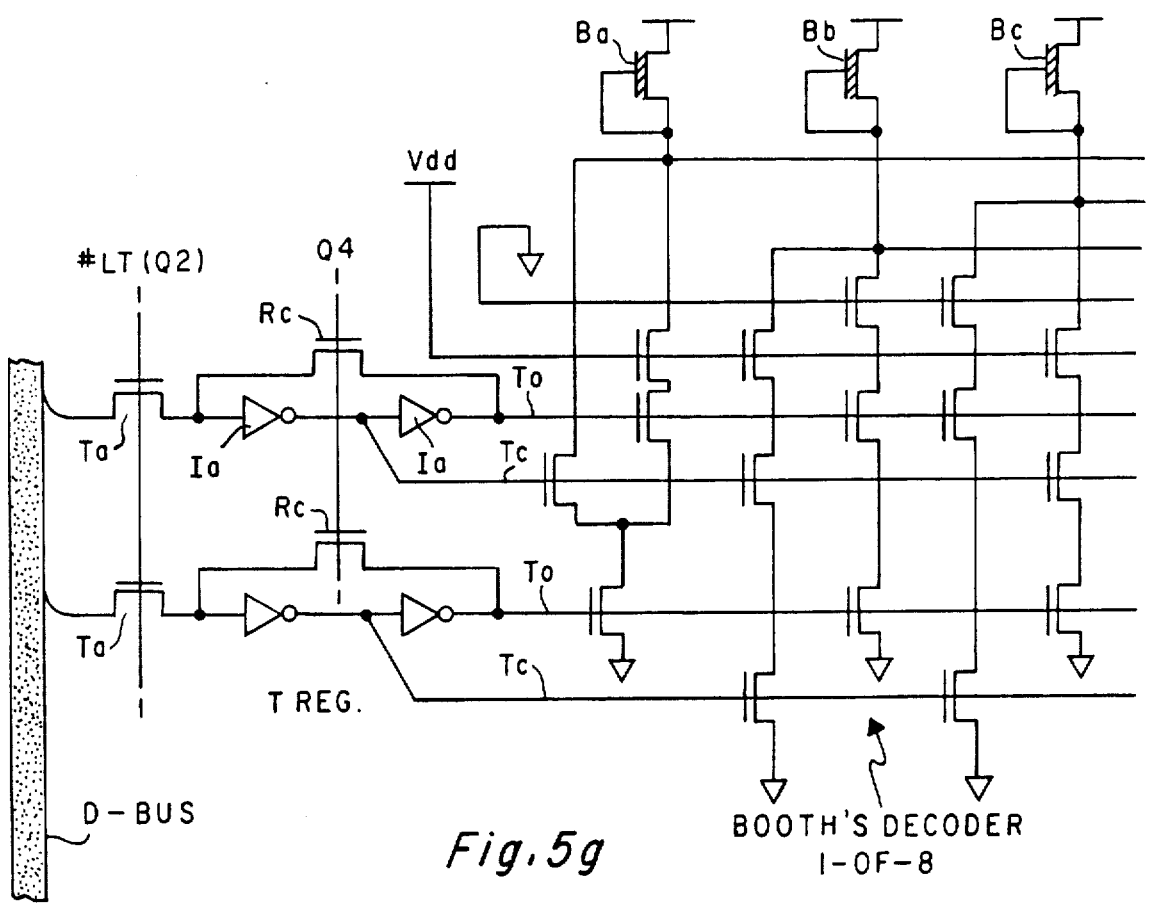
Figure 5G:
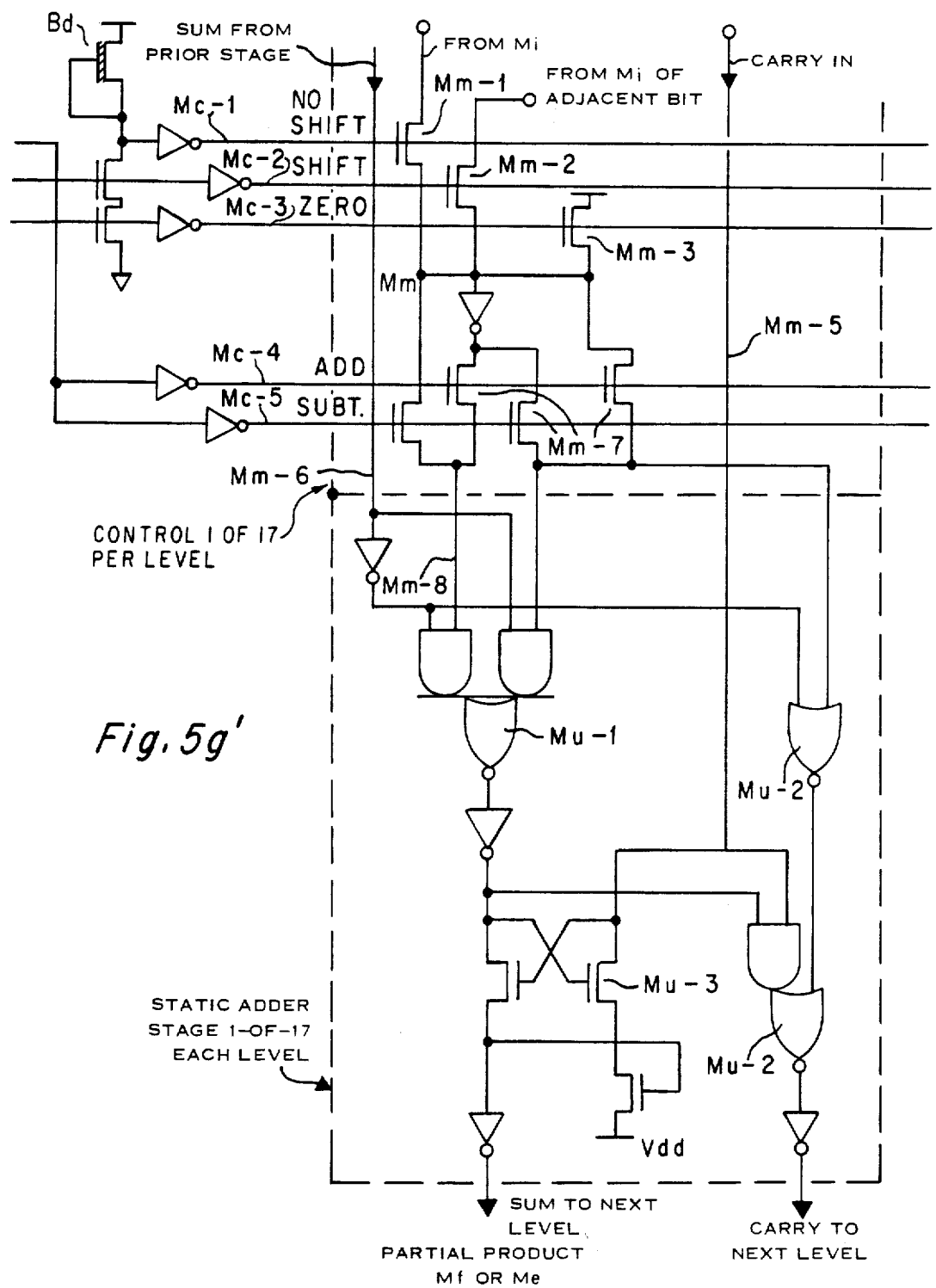
Figure 5H:
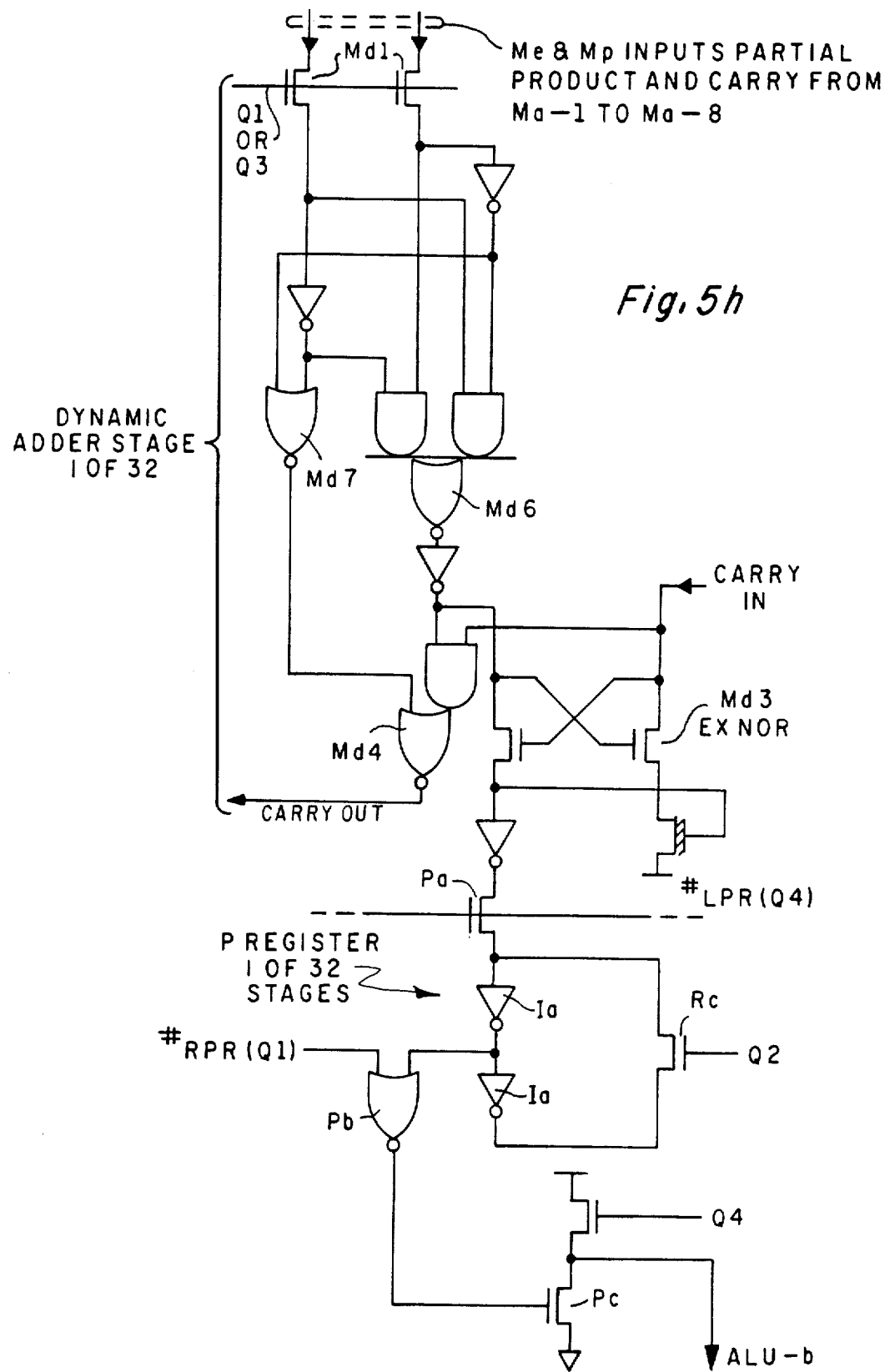

Referring to FIG. 5f, a schematic representation of the multiplier M and its T and P registers is shown, and corresponding detailed circuit diagrams are shown in FIGS. 5g and 5h. The 16-bit output of the T register is applied to a set of eight Booth's decoders Mb which produce eight sets of outputs Mc, each set including five functions: two of which are active at a time: (1) shift or no shift, and (2) add, subtract or zero. A set of eight banks of 17-bit static carry-feed-forward adders Ma-1 to Ma-8 receive the Mc inputs when the T register is loaded, and so a significant part of the multiplication function is initiated before the MPY instruction is executed. The adders Ma-1 to Ma-8 are static in that no clock Q1-Q4 is needed to cause them to operate. Each stage of each level or bank includes a control section Mm responsive to the decoder outputs Me, and the control section feeds an adder. Level Ma-2 uses half adders and levels Mc-3 to Mc-8 use full adders. The first level Mc-1 does not need an adder because there is no partial product from the prior stage, so it has only the control section. When the MPY instruction is decoded, on Q4 the second operand is applied to the static adders from D-Bus by 16-bit input Mi. As each level of the eight levels of adders Ma-1 to Ma-8 calculates the sum, the partial product is fed forward via lines Mf to the next higher level, except for the two LSBs of each level which are fed to the dynamic adders Md via lines Me. When the static adder array settles, the 17-bit output Mg from the level Ma-8 plus the seven lower level 2-bit LSB outputs Me, is applied to a carry-ripple adder MD (31-stages) to perform the final carry evaluation, producing a 31-bit product in two's complement notation. The 31-bits are sign extended to obtain a 32-bit product in the product register P.

Booth's 2-bits algorithm reduces the number of adder stages to about half the number otherwise required. When performing multiply in the classic pencil and paper method, the right or LS digit of one operand is multiplied by the other operand to produce a partial product, then the next digit is multiplied to produce another partial product which is shifted one digit with respect to the first. Booth's algorithm gave a method of multiplying in binary which allowed two bits to be treated each time, instead of one. Thus, level Ma-1 multiplies the two LSBs of T reg times all bits of D-Bus, producing a partial product Me and Mf. The second level Ma-2 multiplies the next two bits of T reg to D-Bus, adds the partial product Mf from Ma-1, and generates a new partial product Mf and two more bits Me because this operation shifts two bits each level.

In FIG. 5g, one of the eight decoders Mb is shown, along with two bits of the T register. The T register stage consists of two inverters Ia with a recirculate transistor Rc clocked in Q4. The stage is loaded via transistor Ta by a #LT command from ID1 occurring on Q2 during an LT instruction. The outputs of two stages of the T register and complements are applied by lines To and Tc to one Booth decoder Mb. The decoder consists of four logic circuits, each having a static load Ba, Bb, Bc or Bd and a pattern of transistors Be with the lines To and Tc applied to the gates. Two of the terms have 1 or 0 fixed in the gates by lines Bf. Outputs Mc-1 and Mc-2 represent no-shift and shift commands and come from the logic stages Be and Bd. Outputs Mc-4 and Mc-5 are true and complement outputs from load Ba of the first of the logic circuits, and these represent add and subtract commands. The output Me-3 from Bb is the zero command.

The first level Ma-1 of the static adders is simpler than the higher levels in that only the D-Bus input Mi and the inputs Mc are involved, with no partial product. Two stages of this first level are seen in FIG. 5g, along with two of the seventeen stages of level Ma-2 and level Ma-3. The control sections Mm are all the same on all levels. Note that no elements are clocked.

The decoders Mb and control sections Mm with controls Mc define the Booth's two-bits at a time algorithm which reduces circuitry and increases speed by a factor of two. When two bits are interrogated successively, the only operations required are add, subtract, do nothing or shift by one bit. Considering the input from T as one operand, and from D-Bus as the other, the following table describes the function

| Ti + 1 | Ti | (Ti − 1) | Function | Partial Product |
|---|---|---|---|---|
| 0 | 0 | (0) | Do nothing | K + O |
| 0 | 0 | (1) | Add D | K + D |
| 0 | 1 | (0) | Add D | K + D |
| 0 | 1 | (1) | Shift D & Add | K + 2D |
| 1 | 0 | (0) | Shift D & Add | K − 2D |
| 1 | 0 | (1) | Subtract D | K − D |
| 1 | 1 | (0) | Subtract D | K − D |
| 1 | 1 | (1) | Do nothing | K + O |

An example of multiplication using Booth's two bit algorithm is as follows:

```
D = 001101    (= 13 decimal)
T = 100111(0) (= −25 decimal)

Ti + 1  Ti  (Ti − 1)
  0 00 0000 00 000      1      1    (0)      → K − D
  1 11 1111(10 011)     0      1    (1)      → K + 2D
       |
  0 00(0011 01)0        1      0    (0)      → K − 2D
     | |
  1(11 0011)0  |
  ─────────────┼─
  1 11 0101 11 011
     (= −325 decimal)
```

In the control sections Mm the inputs Mi from the D-Bus are controlled by a transistor Mm-1 and control Mc-1, not shift. The Mi input for the adjacent bit is gated in by transistor Mm-2 and the Mc-2 shift command, providing the "2D" function as just described. The zero is provided by transistor Mm-3 and zero control Mc-3 which results in mode Mm-4 being connected to Vcc (zero in two's complement). The carry-in from the prior stage is on line Mm-5, and the partial product from the prior stage is on line Mm-6. The add or subtract control is provided by transistors Mm-7 controlled by the Mc-4 and Mc-5 add and subtract commands. The full adder includes logic gate Mn-1 receiving the outputs of the control section, as well as gates Mn-2 and the exclusive Nor Mn-3, producing a sum on line Mn-4 and a carry on line Mn-5. Speed is increased by using carry feed forward instead of carry ripple on the same level. Level Ma-1 has no partial product or sum Mm-6 from the prior stage, nor carry-in Mn-5, so the adder is not needed, only the control, producing a sum (a difference) at mode Mn-8 and no carry. The second level Ma-2 is a half adder since no carry feed forward is received from Ma-1.

One of the adder stages of the 31-stage ripple-through carry adder is shown in FIG. 5h, along with one stage of the P register. The adder stage receives two inputs Me, gated on Q1 or Q3 by transistors Md1. The six LSBs of adder Md have their inputs gated in on Q1 because the static array levels Ma-1, Ma-2 and Ma-3 will have settled and outputs Me will be valid at this point, so the add and ripple through the Md can begin, although the outputs Mf are not yet valid. Thus, the more significant bits are gated on Q3 at transistors Md1. A carry input Md2 from the next lower-significant stage is applied to one input of an exclusive NOR circuit Md3, and to a carry output gate Md4 which produces a carry output Md5 to the next higher stage. A propagate term is generated from the inputs Me and the carry-in by logic gate Md6, and a carry generate term by a logic gate Md7 with Md4. The same output Md8 is connected by line Md9 to the input of the P register stage, gated by #LPR (load P Reg) from ID1 on Q4 by transistor Pa. The P register stage consists of pair of inverters 1a and recirculate transistor Rc gated on Q2. The output is applied to the ALU-b input on Q1 by gate Pb with #NRPR (not read P Reg) from ID1 as one input, along with an inverter Pc. Transistor Pd precharges the ALU-b input on Q4.

The timing of the multiplier operation is illustrated in FIGS. 3jj to 3mm. On Q2 of So, the T register is loaded and outputs Mc from the Booth's decoder become valid. The Mi inputs from D-Bus are valid at Q4 of S1, assuming the MPY instruction is valid in decoder ID1 at Q3 of S1. The lower bits of the dynamic adder Md are loaded with Me on Q1 of S2, via Md1, and the carry begins to ripple through the lower of the 31-bits, then this continues in Q3 of S2 through the output Mf of the upper levels, so P register is loaded on Q4 of S2 via Pa, where the data remains until loaded to ALU-b on Q1 of a succeeding cycle.

The RAM

Figure 5I:
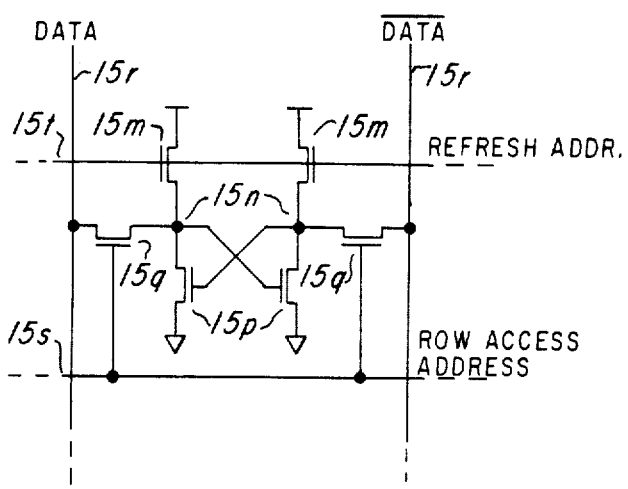

The cell used in the RAM 15 is a pseudo-static 6-transistor cell as seen in FIG. 5i. This cell differs from the traditional 6-transistor static cell in that refresh transistors 15m are used in place of polysilicon resisters or depletion transistors used as load impedences. The implanted resistors or depletion devices are larger and interpose process complexities. The storage nodes 15n are connected through cross-coupled driver transistors 15p to ground; one transistor 15p is on and theother off, storing a 1 or 0. Read or write is through access transistors 15q to data and data bar lines 15r, with gates of the transistors 15q driven by a row address line 15s. Refresh is accomplished when the refresh line 15t is pulsed high allowing the node 15n which is at 1 to be charged back up to a level near Vdd, while the 0 node 15n will conduct the pulse of current to ground through the on transistor 15p. The row address on 15s is delayed slightly from the refresh line 15t so that both won't begin at the same time. In the timing sequence of the FIGS. 3a–3e, particularly FIGS. 3j and 3o, the cell of FIG. 5i is read in Q4 of any cycle, or written into on Q2.

Figure 5J:
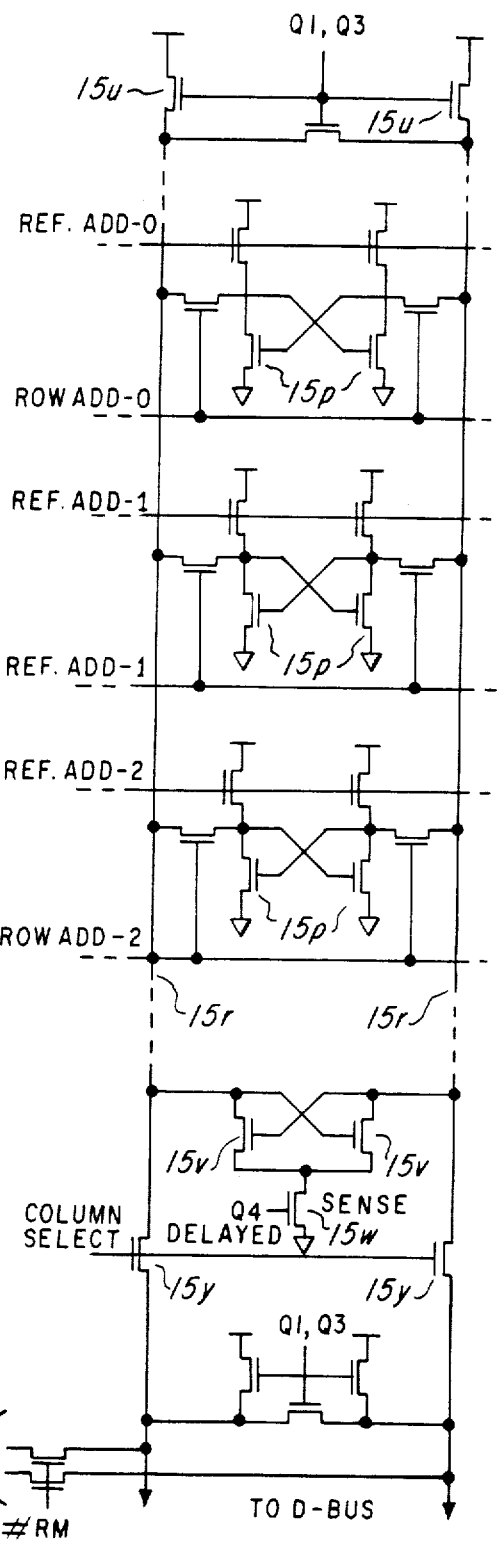
Figure 5K:
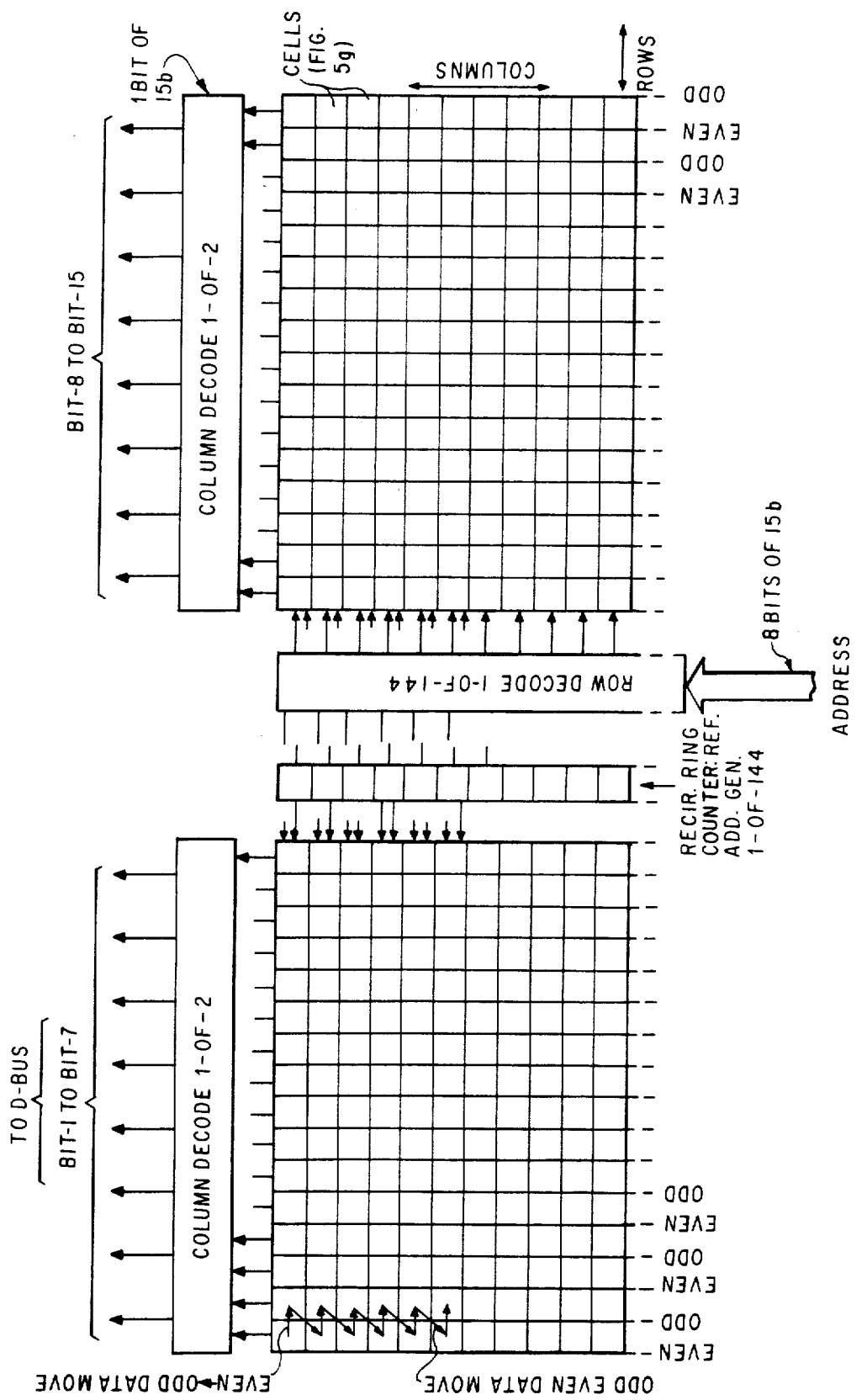

Referring to FIG. 5j, several of the cells of FIG. 5k are shown in a column. The data and data bar lines 15r are precharged to Vdd-Vt on Q1 and Q3 by transistors 15u. The refresh address on lines 15t-0, 15t-1 and 15t-2, etc., occur in sequence, one-at-a-time, generated by a ring counter; for example, if the RAM 15 is partitioned in 64 rows, then a 64 bit ring counter generates one refresh address bit each state time, refreshing the entire array once each 64 states. The refresh pulse occurs on a line 15t during Q3, while transistors 15u precharge and equallize the data and data bar lines. A row address on a line 15s might begin to come up to 1 during the later part of Q3 since read access is in Q4, so the sizes of the transistors are such that nodes 15n will not be both forced to Vdd-Vt when transistors 15m and 15q are all turned on. The on transistor in the pair 15p will hold the 0 node lower than the 1 node. After the refresh pulse on 15t goes low, for a cell addressed for both read and refresh in Q3, the delayed Q3 address line stays high momentarily to assure that the zero-going line 15r will discharge at least slightly through 15q and 15p for the 0 side. Then a bistable sense circuit including cross-coupled transistors 15v is activated by transistor 15w having Q4 on its gate (delayed slightly to make sure Q3 has gone to zero). This flips the data and data bar lines to full logic level, after which the column access transistors 15y are activated for the addressed column and data can be read out onto the D-bus. Internal shift is implemented by lines 15x connecting nodes 15z to adjacent column lines 15r via transistors 15z activated by a RAM move command #RM from decoder ID1, occuring on Q4. The data is held until Q2 of the next cycle (after Q1 precharge of all data and data bar lines 15r) before being applied to the adjacent column for this move operation. Meanwhile, the row address may be incremented by 1; i.e., the next higher line 15t-1, etc., goes high so on Q2 the data is written into the next higher location.

The sixteen bits of the RAM 15 are arranged as seen in FIG. 5k, with column lines (data and data bar lines) 15r running vertical and row lines 15s horizontal. The RAM is only 32-columns wide, so the column select 15y is merely one-of-two, even or odd. There are in this embodiment 144 row lines 15s. The LSB of the address 15b to the RAM is the column address, even or odd. To implement the data move operation, on even columns the LSB of the address buffer is complemented, but for odd columns the LSB of the address buffer is complemented and also the row decoder output on line 15s is incremented.

Auxiliary Registers

Figure 5L:
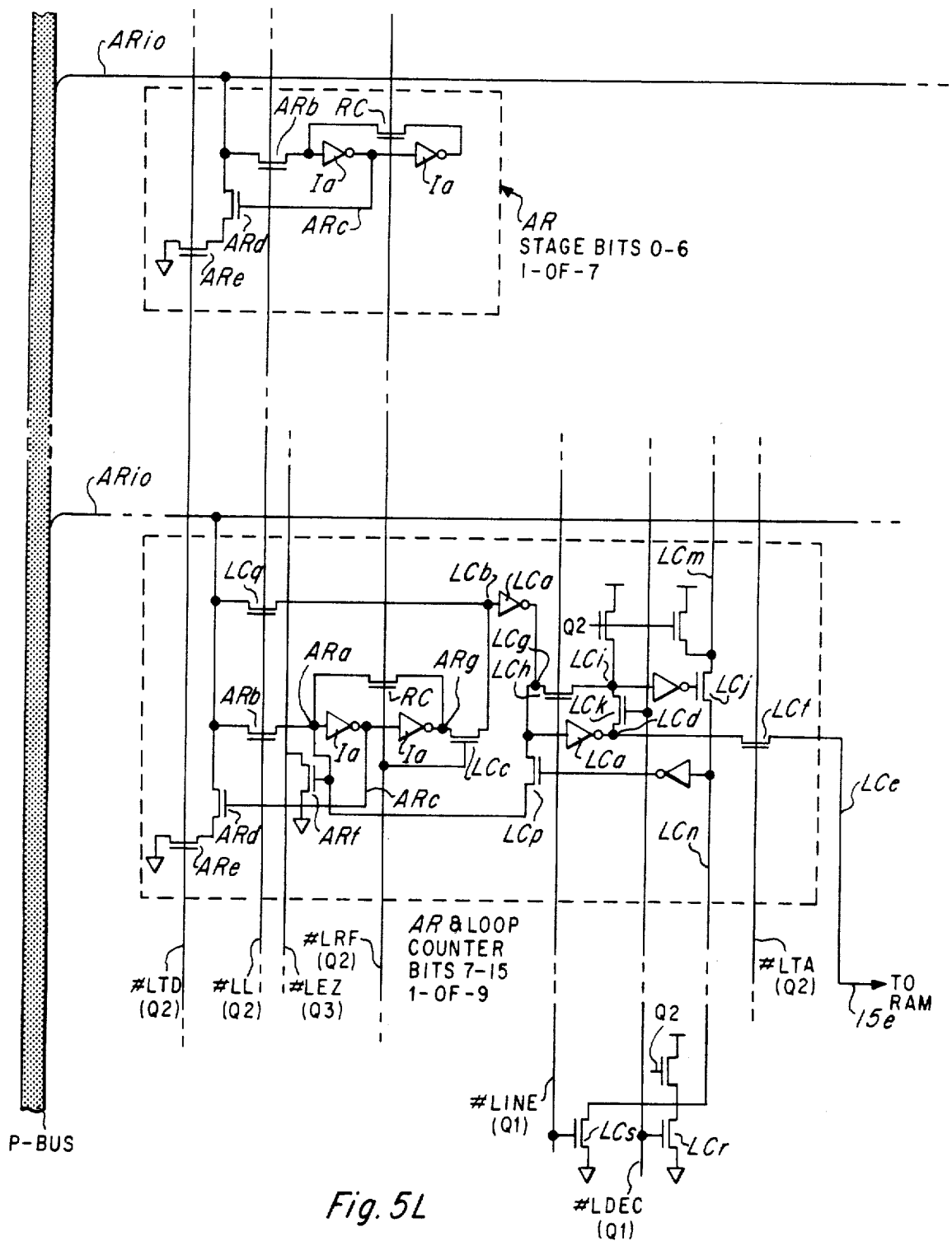

The auxiliary registers AR0 and AR1 are shown in detail in FIG. 5l; these registers are identical, so only one is shown. The architecture permits up to eight auxiliary registers. The high order bits 0–6 are simply recirculating register stages made up of a pair of dynamic inverters Ia having a recirculate transistor RC clocked on Q2 by a loop refresh control bit #LRF from ID1. An input node ARa is loaded from D-Bus via lines ARio and transistor ARb driven by a load-loop control bit #LL from ID2 valid on Q2. An output node ARc is coupled back to lines ARio and the D-Bus by a transistor ARd when a transistor ARe is activated by a logic 1 on a loop-to-D control bit #LTD from ID1 active on Q2. The commands #LL and #LTD are selected based on a 1-of-N selector RP which receives the RRR field from an opcode via P-Bus; that is, a LAR or SAR instruction specifies which AR is to be used.

The auxiliary register stages in the loop counter portion, nine bits 7–15, are similar to that just described, except that the bidirectional counter is added. Each stage contains two inventors Ia as before, and a recirculate transistor RC activated by control bit #LRF on Q2. The input node ARa is loaded through ARb on #LL at Q2, and output node ARc coupled to D-Bus via lines ARio and transistor ARd when ARe is turned on by #LTD. Each of these stages may be zeroed by a transistor ARf connecting the input node ARa to Vss when activated by a control bit #LEZ on Q3. The loop counter part of this stage consists of a pair of inverters LCa and associated circuitry controlled by an increment command #LIN and a decrement command #LDC, both valid on Q1 and selected by RP or ARP. Output node ARg of the register part of this stage is connected to an input node LCb of the loop counter by a transistor LCc activated by the recirculate command #LRF on Q2. When neither #LIN or #LDC is high, the bit is unaltered at output node LCd, and is avaliable to be connected to line LCe going to the address input 15a via transistors LCf when selected command #LTA is valid on Q2. Whenever the "I" bit of the instruction word is 1, indirect addressing is chosen so the auxiliary register is connected to input 15a via this line LCe, thus coupling the register selected by #LTA, etc., to input 15a through transistor LCf and line LCe. When this I-bit, bit-8 of the instruction word on P-Bus is 0, direct addressing is chosen so selector 15d allows bits 9–15 of P-Bus to be connected to input 15a. If the increment command is high, an intermediaate node LCg is connected via transistor LCh to a node LCi precharged on Q2. This node, inverted, controls a propagate transistor LCj for both increment and decrement. If the decrement command is high, instead of increment, then the node LCi is controlled by the node LCd (inverted with respect to node LCg) via transistor LCk. Node LCm on one side of the transistor LCj is precharged on Q2, then conditionally discharged depending upon which of the transistors LCj are on in the chain. Node LCn inverted, is fed back to transistor LCp which connects the node LCg to input ARa of the register stage, so after the count is settled out the new data is entered into the register. When data is loaded into an auxiliary register via transistor ARb, it is also loaded into input LCb of each stage of the loop counter via transistor LCq driven by #LL; this is to eliminate delay through the two inverters of the register stage. The bidirectional count is implemented by precharging node LCn of the LSB then conditionally discharging by transistors LCr and LCs when the selected #LDC or #LIN are high; this propagates toward the MSB through the chain of transistors LCj.

The ROM

The ROM 14 of FIG. 2 is shown in more detail in FIG. 5k. In the example, the ROM is partitioned with sixteen identical groups of 192×8 bits, i.e., 192 rows or X lines with eight columns or Y lines for each group and 16 bits per group. The decoder 14a includes an X or row decoder 14x and a Y or column decoder 14y. The X decoder 14x is a 1-of-192 selector requiring an 8-bit address on address input lines 14bx, and the Y decoder 14y is a set of sixteen indentical 1-of-8 selectors requiring three address bits on input lines 14by. Only eleven bits of the 12-bit PC output PCo are used for the on-chip ROM 14 in the example, while all twelve bits are used for the off-chip program memory 11 via RA bus. The 16-bit output of the Y decoder 14y is applied to the instruction register IR, which is merely a set of sixteen tristate output buffers, and thus to the P-Bus. A "not read IR" command #NRIR from ID2, valid on Q2 and Q3, gates the IR out to P-Bus, or prevents the IR output from reaching P-Bus during off-chip program access or during some instructions such as CALLA, TBLR or TBLW.

The 192×8=1536 word (that is, 192×8×16=24,536 bit) cell array of the ROM 14 is constructed in conventional form; for example the structure may be of the type set forth in U.S. Pat. Nos. 3,541,543, 4,208,726 or 4,230,504 assigned to Texas Instruments. The row lines 14r are polysilicon and the column lines 14c are metal in a typical array. The X decoder circuit is of conventional construction and operates to apply a logic 1 voltage to one selected row line 14r dependent upon the address on lines 14bx, and to apply zero to all other non-selected row lines; the row lines 14r are all predischarged during Q2 and the address 14bx starts to become valid in Q3. As illustrated in FIGS. 3nn–3pp, the address is valid in PC before the end of Q3 in each cycle, and the decoder 14x produces this output on one row line 14r during Q1 of the next cycle.

Figure 5M:
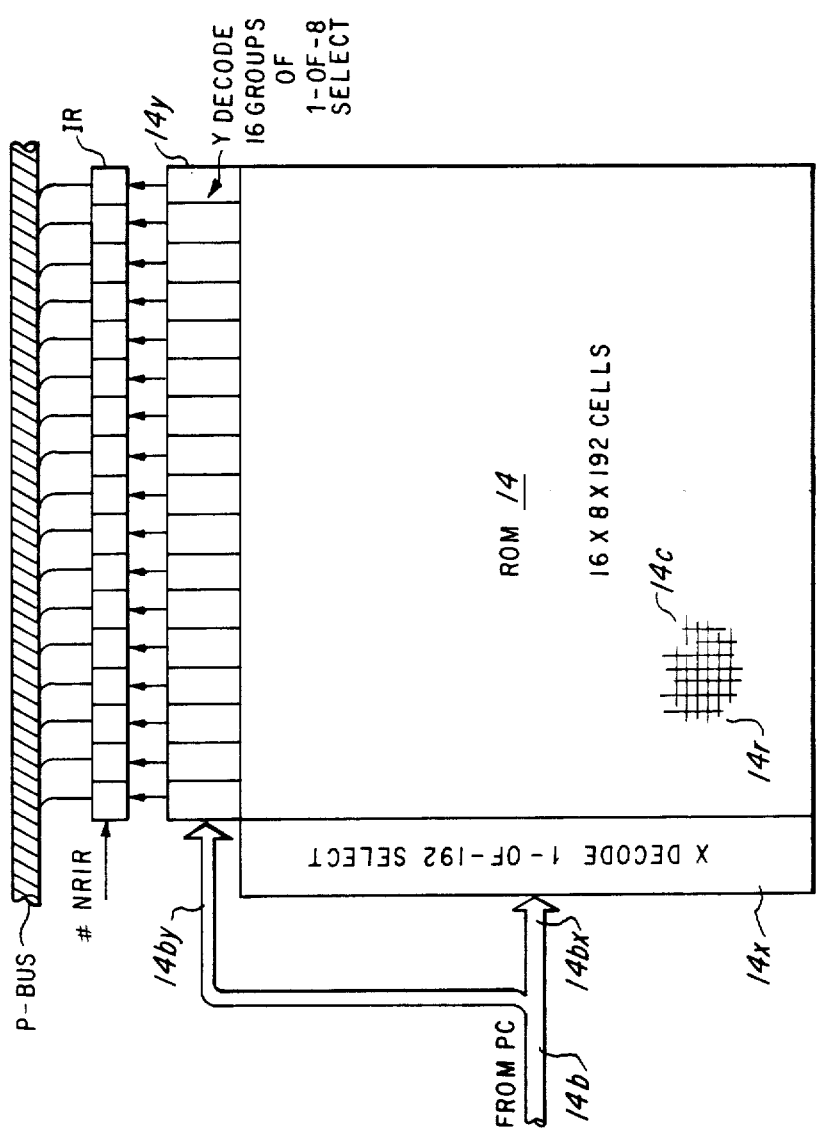
Figure 5N:
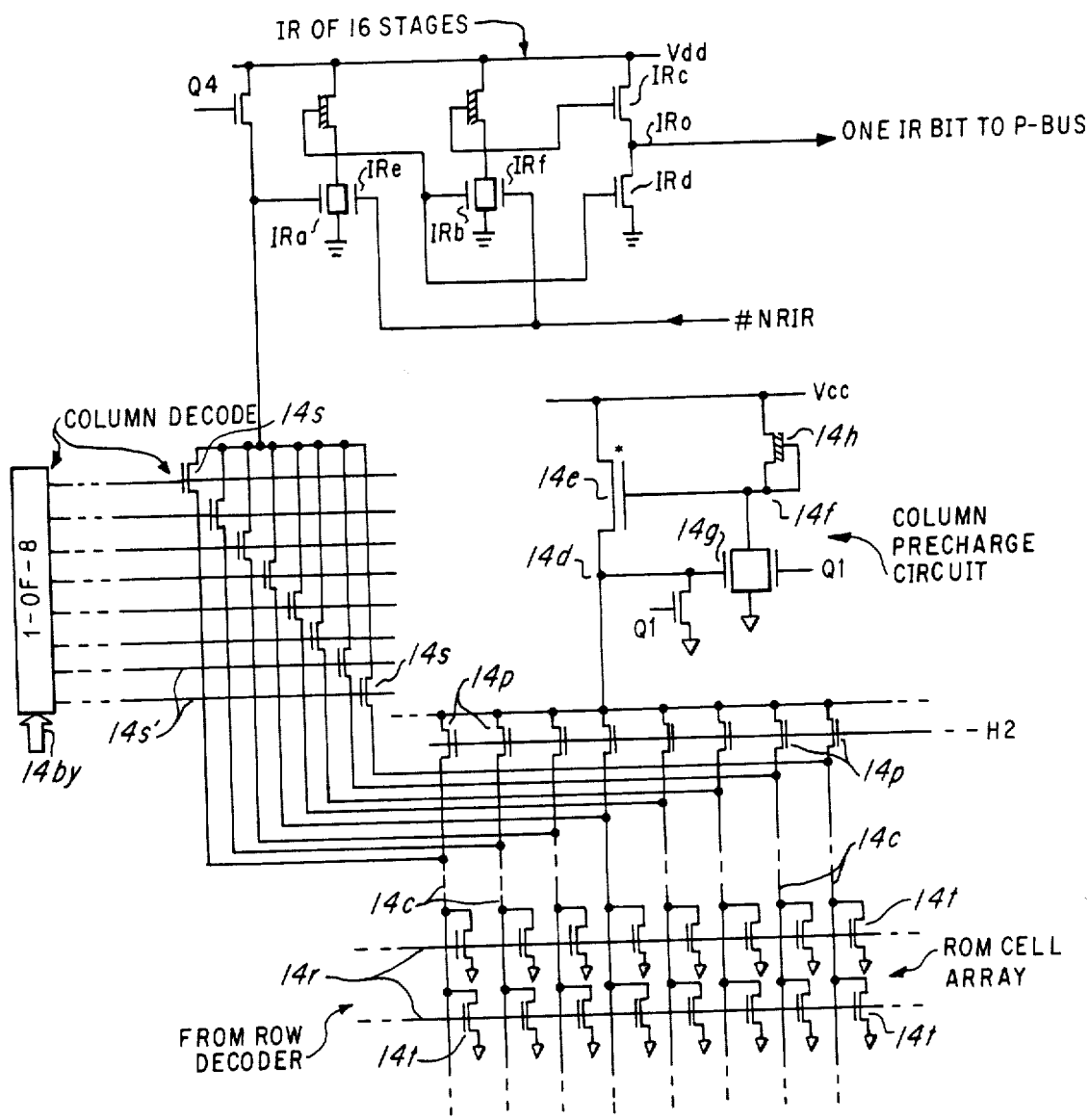
Figures 1, 5N:
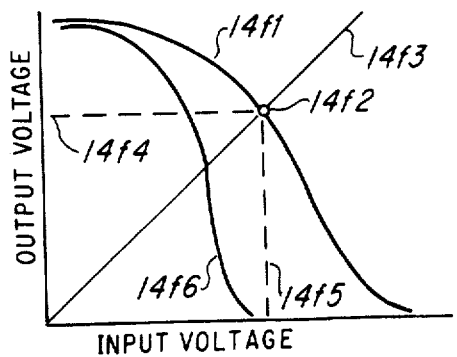
Figure 50:
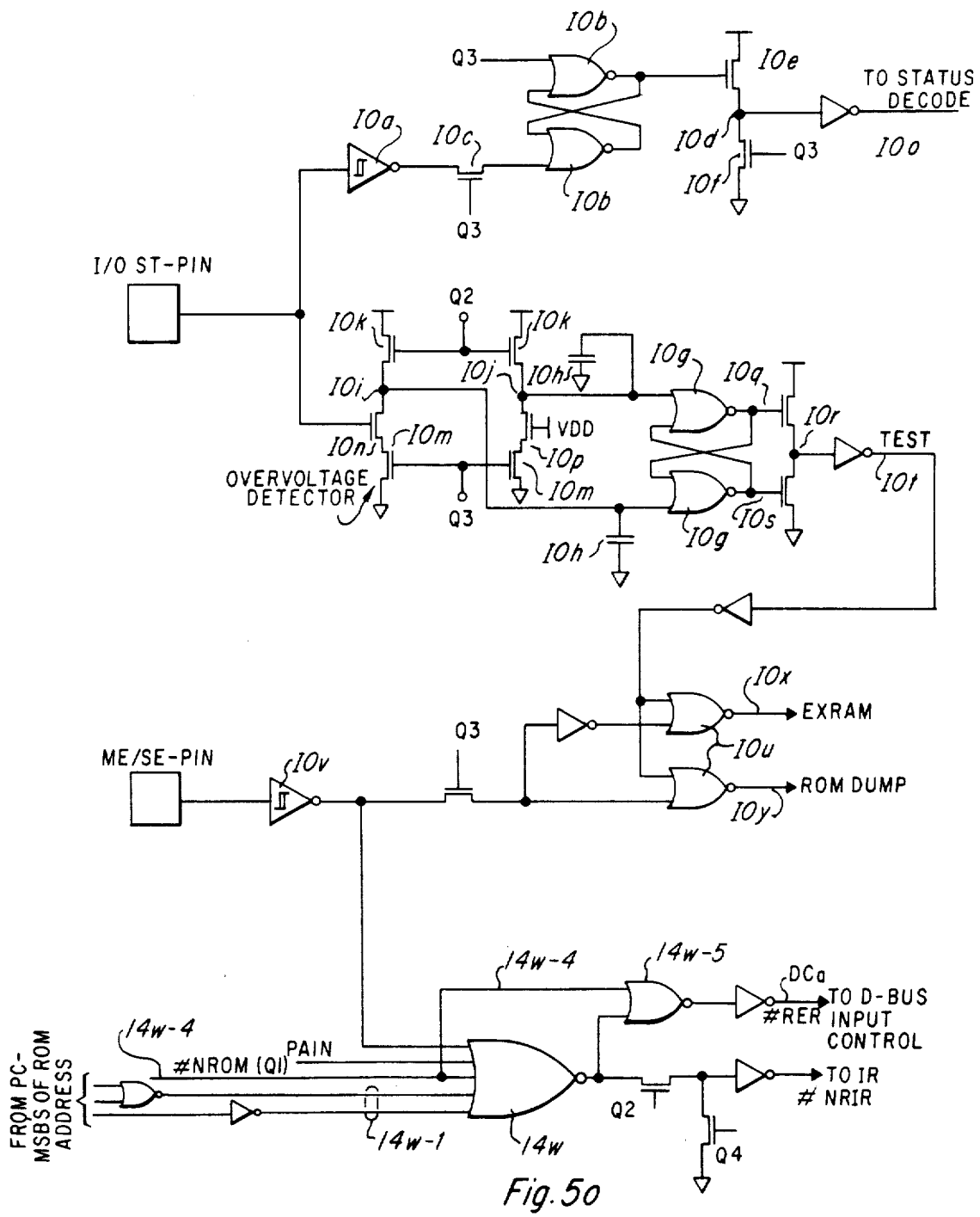

Referring to FIG. 5n and the timing diagrams of FIGS. 3nn-3pp, all of the column lines 14c are precharged beginning at Q2 to a level less than Vcc as will be explained, and the selected set of sixteen column lines conditionally discharge through the selected cell transistors 14t, depending upon whether a 1 or 0 is programmed in each during manufacture. A set of sixteen tristate buffer circuits in IR function as sense amplifiers to detect a 1 or 0 indication for each selected column line. The column select transistors 14s are all off except one in each group which is turned on during Q1. All of the lines 14s' connected to the gates of column select transistors 14s are predischarged during Q2 and one goes high during Q1.

All of the column lines 14c are precharged to a level less than Vcc through transistors 14p which have an H2 clock on the gates. The H2 clock is high during Q2 and Q3. The precharge level is set at a node 14d coupled to Vcc through a large natural transistor 14e. The gate of this transistor 14e has a voltage thereon established by an output node 14f of a low beta ratio amplifier consisting of driver transistor 14g and depletion load 14h. The input of the transistor 14g is the node 14d. The beta ratio of this amplifier is selected to be about 3 and the output voltage at node 14f is connected back via transistor 14e so the output is approximately the same as input voltage at node 14d. The nodes 14f and 14d are predischarged during Q1, so initially as Q2 begins the transistor 14g is off and transistor 14e is on full, then as the node 14d and the bit lines 14c charge the circuit quickly goes through a transition where transistor 14g conducts more and transistor 14e less until a level is reached of about 3.5 volts, dependent upon process variations, temperature, etc. In FIG. 5n-1, a plot of output voltage as a function of input voltage for an amplifier includes a graph 14f1 which shows a beta ratio of about three, determined by the ratio of the channel width-to-length ratios of the transistors 14g and 14h. The low or zero threshold of the transistor 14e establishes that the input voltage on node 14d is the same as the output voltage on node 14f, so the operation point 14f2 is on the out-equal-in line 14f3, providing an output voltage 14f4 which then becomes the logic 1 input voltage 14f5 of the high-beta-ratio buffer stage of IR, illustrated by a graph 14f6. The range in which the high-beta buffer switches from low to high is abrupt. In this manner the zero-going bit lines 14c do not have as far to discharge in Q1 of the operating cycle as seen in FIG. 3nn since the precharge level 14f2 is less than Vcc, and so the bit lines are valid quicker and fast access is achieved; however, the problem of insufficient precharge is avoided because the precharge level will always be significantly higher than one Vt and will track changes in Vdd and Vt. Thus, the output buffer in IR need not be a complex sense amplifier. The noise margin will be at least 500 mv; that is, the difference between a 1 and a 0 on the lines 14c, after conditional discharge during Q1, will cause a large change in output on graph 14f6 of FIG. 5n-1 as Q2 begins, so the output buffers can immediately begin to drive P-Bus. The output buffers in IR are shown in FIG. 5n and include an input inverter IRa with gate precharged on Q4, and with intermediate stage IRb and push-pull output IRc and IRd. Shunt transistors IRe and IRf are activated by the command #NRIR (not read internal ROM) from the decoder ID2,active-low on Q2 and Q3, which tristates the IR output IRo to P-Bus during Q1 and Q4 by turning on transistors IRe and IRf to hold the gates of transistors IRc and IRd at ground, then allows the ROM to drive the P-Bus in Q2 and Q3 when #NRIR is low, or holds the output IRo in high impedance state when #NRIR stays high, i.e., no read is defined. During Q1 and Q4 the output is tristated in all cycles (placed in high impedance mode). If the internal ROM 14 is to be read, the outputs on the columns 14c become valid by the end of Q1, and #NRIR goes low beginning at Q2 so the P-Bus is valid during Q2 and Q3.

The size of the transistor 14e in channel width to length ratio is about twenty-five times bigger than the cell transistors 14t because it must conduct current to precharge all 128 of the lines 14c. The transistor 14e is a natural or unimplanted device having a threshold voltage of about zero to +0.2 v so the drop across it is small.

The Test Control

The microcomputer 10 has two test modes for making tests of manufactured chips to find out if all internal circuitry is functional and within specifications. Also, if problems exist, the test modes aid in isolating the problems. The chip contains 55,000 transistors, very few of which are directly accessable, and any one of which could cause the microcomputer to fail under some conditions. The test modes should be difficult to enter after the system has been constructed because the microcomputer might be placed in an unwanted condition inadvertently, but yet the test modes should be easily initiated without extra pins, etc., when in the manufacturing or assembly cycle. This objective is usually accomplished by using overvoltage on dual-function pins, but heretofore the circuitry used has been unreliable when process variations cause wide ranges in threshold voltages or the like. Thus, the circuit of FIG. 5o is used for control of the test modes.

Referring to FIG. 5o, a circuit connected to the I/O ST- pin generates a branch or not branch signal to the status decoder SD in normal operation, depending upon logic 0 or logic 1 (+5 v) on this external pin. When this pin is raised to an overvoltage, +10 v for example, the test mode is signalled, however. The path for normal operation includes a Schmidt trigger IOa with output coupled to one input of a bistable latch IOb through a transistor IOc clocked on Q3. The clock Q3 on the other input will cause both outputs to go low, then when Q3 ends the input via IOc stays high and so the latch goes to one state. The latch output drives an output node IOd by a transistor IOe, and the inverted output on line IOo is taken from this node. On Q3 of each cycle the I/O ST- pin is interrogated by discharging the node IOd via transistor IOf and coupling Q3 to one input of the latch and the Schmidt output to the other. When Q3 goes low, the node IOd stays low if transistor IOe is off, or goes high if IOe is on, i.e., depending on the state of the latch IOb. When the I/O ST- pin is high, the Schmidt output is low, and Q3 causes the latch IOb to flip to the condition with the voltage to transistor IOe high, node IOd high, and output IOo low, indicating no branch to status decode SD if a BIOZ instruction is being executed; this indication is valid from the end of Q3 to the beginning of the next Q3. If I/O ST- pin is low, both inputs to latch IOb are nearly Vdd, during Q3 but after Q3 the 1 trapped on one input causes the latch to flip the other way, producing a valid or branch signal on line IOo.

The test mode control, also connected to the I/O ST- pin, uses a latch IOg which is unbalanced by capacitors IOh of unequal size at its inputs. These inputs are connected to nodes IOi and IOj in the high-voltage detector circuit. These nodes are precharged to Vdd-Vt on Q2 by transistors IOk, then discharged in a race condition by transistors IOm on Q3. The I/O ST- pin is connected to transistor IOn in one path and Vdd to the gate of transistor IOp in the other. If an overvoltage of at least about Vdd+3 is on the I/O ST- pin, transistor 10n conducts heavier than 10p, the node IOj tends to stay high longer during Q3 and the latch IOg flips to a state with output IOq low, node IOr low, and test control IOt high, indicating test mode. If the voltage on the test pin is a logic 1, the two paths IOn and IOp will conduct about the same, and the larger capacitor IOh on the IOi node causes the latch IOg to flip the other way because this latch input discharges slower, and output IOs leaves the node IOr high and output IOt low, indicating no test condition. A zero on I/O ST- pin gives the same IOt low condition as a one on I/O ST-.

A major advantage of the overvoltage detector described above is that it is keyed to Vdd, so if Vdd changes the trip level will still be above Vdd, and also if threshold voltages Vt change with process variations the Vt of both transistors IOn and IOp will change the same, so the circuit will still operate properly.

The test line IOt is evaluated in the circuitry of FIG. 5m along with the condition of the ME/SE- pin to determine which of the two test modes is to be implemented. A pair of Nor gates IOu receive the inverted test command IOt along with an input from the ME/SE- pin which is detected by a Schmidt trigger IOv and gated on Q3. When IOt is high, one of the commands EXRAM or ROM Dump on lines IOx or IOy will be high on Q3, depending upon the status of the ME/SE- pin. When line IOt is low, neither EXRAM or ROM Dump can be high, regardless of ME/SE-. When ME/ST- is zero and I/O ST- at +10 v, IOx line at the output of gates IOn is high, indicating external RAM or EXRAM test mode, whereas if ME/ST- is a 1 the test mode signalled by line IOy is ROM Dump.

The ROM Dump test mode is explained above with reference to FIGS. 3ee-3hh. The line IOy is connected to the instruction decoder ID2 as an input and causes the decoder to stimulate an instruction (not in the Table A instruction set) which increments PC each cycle, couples the IR output via P-Bus and BIM to D-Bus and external bus D, without executing any of the instructions accessed in this manner.

The external RAM test mode invoked by line IOx adds a three cycle instruction sequence illustrated in the timing diagram of FIG. 3mm to 3pp. This test mode is useful for instructions of Table A which affect the ALU and Acc. Instead of one cycle instructions these are converted to four-cycle instructions when in this test mode, and the internal RAM 15 with its addressing circuitry is ignored. In place of RAM 15, all data reference is via the D-Bus, buffers DC, and external bus D, to external memory. At the end of the sequence, Acc-H and Acc-L are transferred off-chip to the test machine, represented by peripherals 12. In this test mode, the pin ME/SI- in low so the device is in the systems emulator mode, meaning that all program fetch is off-chip; the internal ROM 14 is ignored and the #NRIR command does not occur so the outputs from IR are always in the high impedence state. The EXRAM command on IOx causes the continuous generation of four pseudo instruction inputs to the instruction decoders to simulate instructions which read bus D to inter D-Bus, execute on ALU/Acc related instruction, output Acc-H, then output Acc-L in four successive states.

The logic circuitry of FIG. 5o generates the #NRIR command to ROM 14 by a multi-input gate 14w. Inputs 14w-1 are the MSB bits from the PC and detect that the address is outside the range on on-chip ROM 14 so the address must be off-chip; this prevents #NRIR from going active-low, and instead produces a command #RER, read external ROM, going to the data I/O control DC via line DCa. Also, an input 14w-2 from the ME/SE- pin causes the same function; the internal ROM is disabled, and external program fetch is implemented. An interrupt conduction PAIN cuases this same condition when input 14w-3 is high. An input 14w-4 to the gate 14w is also an input to gate 14w-5 and disables both internal and external ROM commands #NRIR and #RER; this is used in instructions which employ the BIM and P-Bus for transfer of the contents of Acc to PC, such as CALA, TBLR and TBLW. The #NROM command on input 14w-4 is an output of the instruction decoders IR1 to IR2.

Referring to FIG. 3qq, an operating sequence for the external RAM test mode is illustrated, assuming that the instruction being executed is ADD. This instruction is accessed from external memory by loading PC in Q3/S0, reaches the P-Bus in Q2/S1, and is decoded in ID1 and ID2 beginning at Q3/S1. The external test machine uses the same opcode to fetch the required operand and apply it to the external bus D by Q4/S1, at which time the input buffer control DC is activated to copy bus D to internal D-Bus; this operand is available in Q1/S2 as an input to shifter S, and the shifter output So is applied to the ALU-b input also in Q1/S2. The ALU output is loaded into Acc in S2/Q4, and Acc is saturated in Q1/S3, from which it is applied to external bus D during the same Q2. Then, in the next state, the output is repeated for Acc-H which is thus available on bus D in Q2/S4.

Program Counter and Stack

Figure 5P:
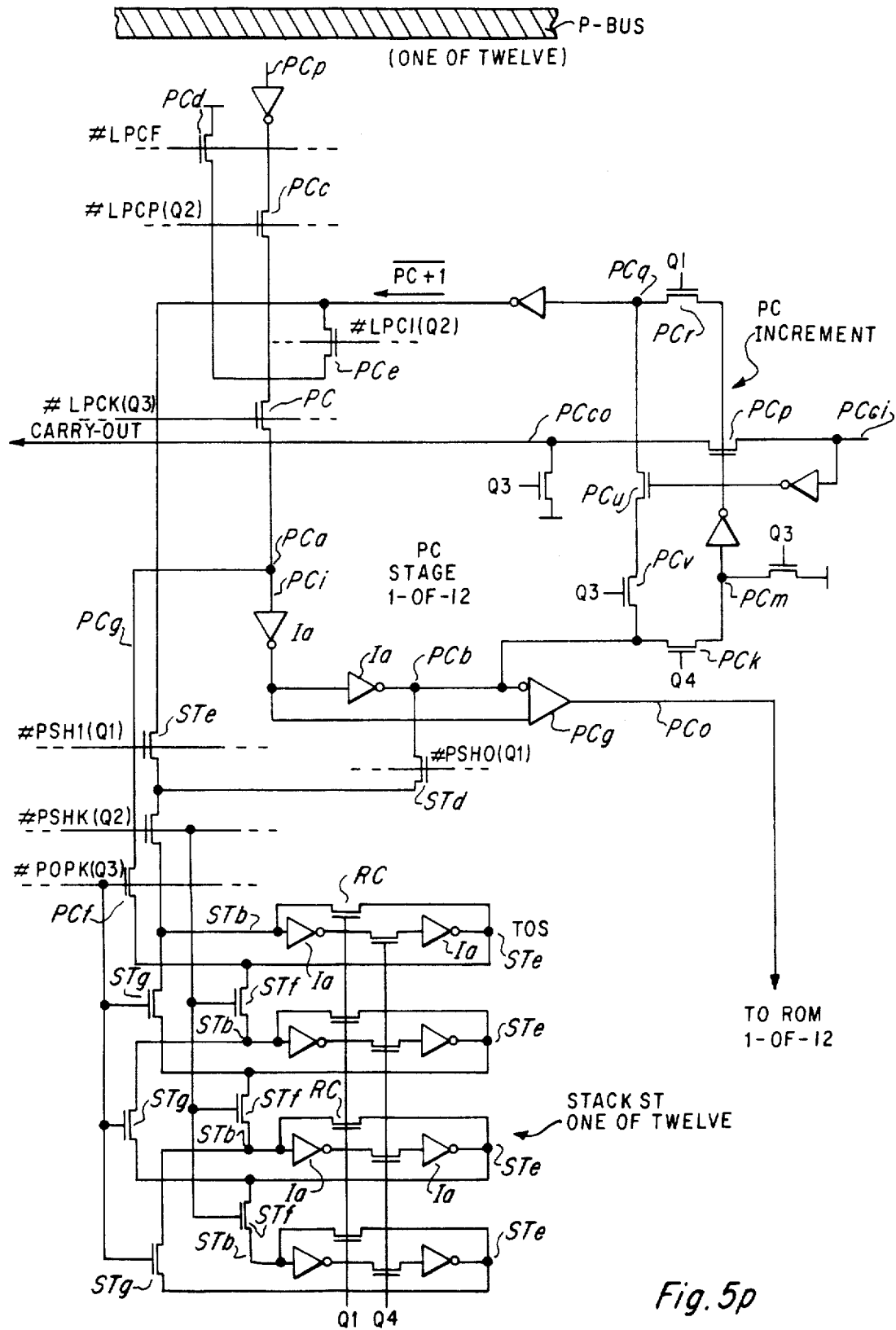

The program counter PC and the stack ST are shown in FIG. 5p as one representative bit of the twelve identical bits. Two inverter stages Ia between an input node PCa and output node PCb make up the bit of the PC register. The input node PCa can be loaded from one of four sources determined by selector PCs: the P-Bus via transistor PCc; the fixed address for reset via transistor PCd; the incrementer via transistor PCe; or from the stack via transistor PCf and line PCt. A transistor PCh controlled by a "load PC clock" command #LPCK on Q3 gates in one of the three sources via PCc, PCd or PCe; if the stack is the source, then the "pop clock" command #POPK on Q3 gates the TOS data bit into node PCa. The address output PO from PC to the program memory is through a push-pull buffer PCg responsive to the node PCb and an intermediate node; this address on PCo is valid on Q3 of each cycle. The bit on node PCb is also connected by transistor PCk on Q4 to a node PCm precharged on Q3, so this node PCm is conditionally discharged in Q4 by the PC data and is inverted to control a carry-propagate transistor PCp in the counter chain for the increment circuit, then in Q1 the node PCm inverted is connected to node PCq via transistor PCr. The carry-out node PCco for each bit is precharged on Q3 and conditionally discharged through the chain of the transistors PCp depending upon the count; the carry-in node PCci, inverted, controls a transistor PCu which is in series with a transistor PCv gated on Q2; this series circuit between nodes PCb and PCq completes the binary add with carry function. During Q2 the data on nodes PCq for the twelve bits represents the incremented program counter contents (PC+1), and this data is either used on Q3 to load PC through an inverter and transistors PCe an PCh, or ignored.

The stack ST in FIG. 5p consists of four 12-bit registers, each bit containing two dynamic inverters Ia and a recirculate transistor RC clocked ion Q1. Data is gated from one inverter to the other by transistors STa clocked on Q4. The PC contents can be pushed to input node STb of TOS either incremented or not incremented via transistors STc or STd. A push-1 command #PSH1 from decoder ID2 activates transistor STc and pushes incremented PC to TOS on Q1, from node PCq to node STb. Alternately a push-0 command #PSH0 activates transistors STd and pushes PC nonincremented to TOS on Q1, from node PCb to node STb. Whenever a push is performed, the push clock #PSHK is produced in Q2 and this connects the output node STe of each of the top three stack registers to the input node STb of the next lower register via transistors STf. A pop clock #POPK from the instruction decode ID2, conversely, activates transistor PCf to load TOS to PC and also activates transistors STg to shift the contents of each stack register up one by connecting nodes STe to node STb, all on Q3.

Data I/O Buffer

Figure 5Q:
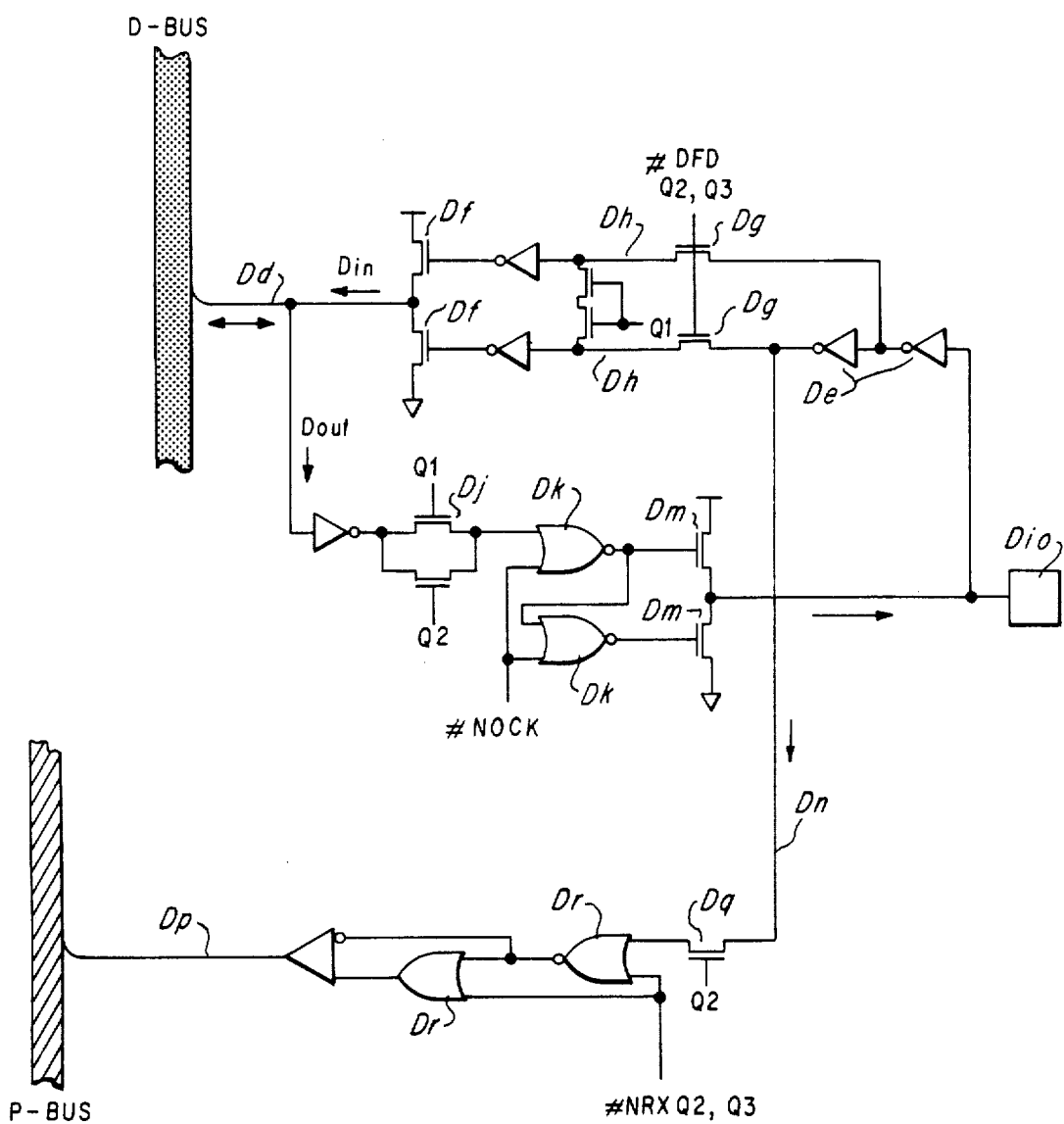

In FIG. 5q one of the data input/output buffer and control circuits DC is shown in detail. Sixteen identical circuits such as FIG. 5q are included in the microcomputer 10. This circuitry has several functions: (1) to connect the data I/O pad Dio to the internal D-Bus via lines Dd for data input or to the P-Bus via lines Dp for instruction word input from external ROM 11, (2) connect the internal D-Bus via lines Dd to the pad Dio for data output, or (3) "tristate" the pad Dio, i.e. place in a high impedance node.

The bonding pad Dio is connected (through input protection devices, not shown) to inverters De which produce complementary inputs to push-pull transistors Df via transistors Dg and inverters. Nodes Dh are precharged on Q1 and conditionally discharge back into inverters De if transistors Dg are on; otherwise both transistors Df are off and a high impedance is presented to internal D-Bus via line Dd. If the D-from-D control #DFD from ID1 is high (valid on Q2 and Q4) the input pad Dio can control this bit of D-bus via line Dd. Data output from line Dd is gate through an inverter and transistors Dj on Q1 and Q2 to gates Dk controlled by the not-output-clock command #NOCK valid on Q4.

Output of gates Dk drive push-pull transistors Dm and thus pad Dio. If #NOCK is not asserted, both transistors Dm are off and the pad Dio is in the high impedance state.

Input to the P-Bus is from the output of inverter De via line Dn and transistor Dq gated on Q2, driving a push-pull buffer via gates Dr controlled by "not read external" command #NRX valid on Q2, Q3. Thus, if #NRX is asserted by ID2, active low, the data on the Dio pads will be gated into gates Dr on Q2 and will remain valid on P-Bus during Q2 and Q3.

Emulator Mode Interrupts

When the ME/SE- pin is at logic 1 level, +5 v, the microcomputer 10 is operating in its memory expansion mode in which the on-chip ROM 14 is the program source, which off-chip memory references also available. When ME/SE- is at zero, however, all program addresses go off-chip and the on-chip ROM is not used. In addition, a mode of operation is available in which the system switches between off-chip and on-chip program store. An overvoltage detector is included on the ME/SE- pin just as that shown in FIG. 5o for the IO ST- pin. When +10 v is placed on the ME/SE- pin, the overvoltage detector generates an interrupt command which causes a non-maskable interrupt. That is, the system is operating with external memory in SE mode with ME/SE- at zero, then the system drives ME/SE- to +10 v, and this non-maskable interrupt pushes PC+1 to ST, loads the 0002 vector into PC and proceeds to execute from on-chip ROM. Until a RET instruction is reached, the interrupt latch is in the DINT condition, i.e., normal user interrupt operation is disabled. A RET instruction clears the emulator interrupt and resumes normal operation in ME mode. The emulator interrupt is non-maskable in that even if the interrupt latch was previously in the DINT condition the interrupt will be implemented when ME/SE- pin is brought to +10 v.

The emulator interrupt is very useful in development of systems and software using the microcomputer 10 because fixed emulator firmware can be permanently programmed into the ROM 14, then the user writes his own software to be executed from external memory 11 while in development, with switching back and forth from external to internal using this interrupt mechanism.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

TABLE A

| | | | | |
|---|---|---|---|---|
| | THE INSTRUCTION SET | | | |
| Source Code | Object Code-Binary | No. of Cycles | No. of Words | DESCRIPTION |
| ADD | 0000SSSSIAAAAAAA | 1 | 1 | Add word at RAM address A (shifted S places to left) to Acc; Result to Acc |
| SUB | 0001SSSSIAAAAAAA | 1 | 1 | Subtract word at address A (shifted S places to left) from ACC; Result to Acc |
| LAC | 0010SSSSIAAAAAAA | 1 | 1 | Load Acc with word at address A (shifted S places to left) |
| SAR | 0011ORRRIAAAAAAA | 1 | 1 | Store contents of Aux Reg number R at location defined by A |
| LAR | 00111RRRIAAAAAAA | 1 | 1 | Load Aux Reg R with value at location A |
| IN | 01000PPPIAAAAAAA | 2 | 1 | Input value on external data bus, store in A |
| OUT | 01001PPPIAAAAAAA | 2 | 1 | Output value at address A to ext data bus |

TABLE A-continued
THE INSTRUCTION SET

| Source Code | Object Code-Binary | No. of Cycles | No. of Words | DESCRIPTION |
|---|---|---|---|---|
| SACL | 01010XXXIAAAAAAA | 1 | 1 | Store low order Acc bits in location A, shifted X places left |
| SACH | 01011XXXIAAAAAAA | 1 | 1 | Store high order Acc bits in location A, shifted X places left |
| ADDH | 01100000IAAAAAAA | 1 | 1 | Add value at address A to high order Acc bits; result to Acc; no shift |
| ADDS | 01100001IAAAAAAA | 1 | 1 | Add Acc to value at address A sign extension suppressed |
| SUBH | 01100010IAAAAAAA | 1 | 1 | Subtract value at address A from high order Acc bits; result to Acc; no shift |
| SUBS | 01100AAIAAAAAAA | 1 | 1 | Subtract with sign extension suppressed |
| SUBC | 01100100IAAAAAAA | 2 | 1 | Conditional subtract for divide; left shift ALU output and conditional + 1 |
| ZALH | 01100101IAAAAAAA | 1 | 1 | Zero Accumulator and Load High - order half of Acc with addressed data |
| ZALS | 01100110IAAAAAAA | 1 | 1 | Zero Accumulator and Load with sign Extension Suppressed |
| TBLR | 01100111IAAAAAAA | 3 | 1 | Table Read; read data from program memory using Acc or address; store in RAM |
| MAR | 01101000IAAAAAAA | 1 | 1 | Modify Auxiliary Registers |
| DSHT | 01101001IAAAAAAA | 1 | 1 | Data Shift; value defined by A shifted to A + 1 |
| LT | 01101010IAAAAAAA | 1 | 1 | Load T Reg with value defined by A |
| LTD | 01101011IAAAAAAA | 1 | 1 | Load T Reg with value A; shift A to A + 1; Acc + Preg Acc |
| LTA | 01101100IAAAAAAA | 1 | 1 | Load T Reg with value defined by A; Acc + Preg Acc |
| MPY | 01101101IAAAAAAA | 1 | 1 | Multiply T times value defined by A, result to P Reg |
| LDPK | 01101110DDDDDDDD | 1 | 1 | Load page reg for data memory with 8-bit constant D |
| LDP | 01101111IAAAAAAA | 1 | 1 | Load DP reg with value whose address is at A |
| LARK | 0111ORRRDDDDDDDD | 1 | 1 | Load Auxiliary Register R with 8-bit constant D; MSB's Zero |
| EXOR | 01111000IAAAAAAA | 1 | 1 | Exclusive OR Acc with value defined by A; result to LSBs of Acc; zero⊖ MSB's |
| AND | 01111001IAAAAAAA | 1 | 1 | AND LSB's of Acc with value defined by A; result to LSB's of Acc; (zero) · (MSB's) |
| OR | 01111010IAAAAAAA | 1 | 1 | OR LSB's of Acc with value defined by A; result to Acc; (zero) + (MSB's of Acc) |
| LST | 01111011IAAAAAAA | 1 | 1 | Load Status with 16-bit value found at location A in RAM |
| SST | 01111100IAAAAAAA | 1 | 1 | Store Status in location defined by 8-bit address A in RAM |
| TBLW | 01111101IAAAAAAA | 3 | 1 | Table Write; write the value at RAM address to program memory address in Acc |
| LACK | 01111110DDDDDDDD | 1 | 1 | Load Accumulator with 8-bit constant from instruction word |
| NOOP | 01111110000000 | 1 | 1 | No-operation |
| DINT | 0111111110000001 | 1 | 1 | Disenable Interrupt-masks interrupt input INT |
| EINT | 0111111110000010 | 1 | 1 | Enable Interrupt-unmasks interrupt input INT |
| ABS | 0111111111000000 | 1 | 1 | Absolute Value operation; if Acc O, Acc Acc; else Acc Acc |
| ZAC | 0111111110001001 | 1 | 1 | Clear Accumulator; zeros Acc |
| RAMV | 0111111110001010 | 1 | 1 | Reset Overflow Mode |
| SAMV | 0111111110001011 | 1 | 1 | Set Overflow Mode |
| CALLA | 0111111110001100 | 2 | 1 | Call subroutine indirect |
| RET | 0111111110001101 | 2 | 1 | Return from Subroutine |
| PAC | 0111111110001110 | 1 | 1 | Load accumulator with contents of P Reg |
| APAC | 0111111110001111 | 1 | 1 | Add accumulator to contents of P Reg; Result to Acc |
| SPAC | 0111111110010000 | 1 | 1 | Subtract contents of P Reg from Accumulator; Result to Acc |
| MPYK | 100CCCCCCCCCCCCC | 1 | 1 | Multiply by constant C |
| BARNZ | 11110100XXXXXXXX | 2 | 2 | Branch if Loop Counter Not Zero, to location defined PC+1 |
| BV | 11110101XXXXXXXX | 2 | 2 | Branch if Overflow Bit in ST is 1 |
| BIOZ | 11110110XXXXXXXX | 2 | 2 | Branch if IO Bit in ST (from IO pin) is 1 |
| CALL | 11111000XXXXXXXX | 2 | 2 | Call Subroutine |
| B | 11111001XXXXXXXX | 2 | 2 | Unconditional Branch to location W at PC+1 |
| BLZ | 11111010XXXXXXXX | 2 | 2 | Branch if Acc is less than zero |
| BLEZ | 11111011XXXXXXXX | 2 | 2 | Branch if Acc is less than or equal to zero |
| BGZ | 11111100XXXXXXXX | 2 | 2 | Branch if Acc is greater than zero |
| BGEZ | 11111101XXXXXXXX | 2 | 2 | Branch if Acc is greater than or equal to zero |
| BNZ | 11111110XXXXXXXX | 2 | 2 | Branch if Acc is not zero |
| BZ | 11111111XXXXXXXX | 2 | 2 | Branch if Acc is equal to zero |

TABLE B
ALU FUNCTIONS

| | Control Code | | | | | | Propogate Node | Generate Node | Output |
|---|---|---|---|---|---|---|---|---|---|
| | #AUM0 | #AUM1 | #AUM2 | #AUM3 | #AUM4 | #AUMB | | | |
| Add | 0 | 1 | 1 | 0 | 0 | 0 | $A + B$ | $AB$ | $A + B + C_{in}$ |
| Subtract | 1 | 0 | 0 | 1 | 0 | 0 | $A + B$ | $AB$ | $A + B + C_{in}$ |
| Load Acc | 0 | 1 | 0 | 1 | 1 | 0 | $B$ | $X$ | $B + 1 = B$ |
| Exclusive Or | 1 | 0 | 0 | 1 | 1 | 0 | $A + B$ | $X$ | $A + B + 1 = A + B$ |
| Or | 1 | 0 | 0 | 1 | 1 | 0 | $AB (= A + B)$ | $X$ | $A + B + 1 = A + B$ |
| And | 0 | 1 | 1 | 1 | 1 | 0 | $A + AB$ | $X$ | $(A + AB) + 1 = A + B = AB$ |
| Abs. Value | 0 | 0 | 1 | 1 | 0 | 1 | $A$ | 0 | $A + C_{in}$ |

What is claimed is:

1. A pseudo-static read/write memory cell comprising:

first and second driver transistors each having a current path and a control electrode, the control electrode of each driver transistor cross-coupled to one end of the current path of the other driver transistor to provide a bistable circuit;

first and second storage nodes, the first storage node being coupled to said one end of said current path of the first driver transistor, and the second storage node being coupled to said one end of said current path of the second driver transistor;

first and second access transistors each having a current path and a control electrode;

first and second data lines for read or write of a data bit and its complement, the current paths of the first and second access transistors respectively coupling the first and second storage nodes to the first and second data lines;

first and second refresh transistors each having a current path and a control electrode; the current path of the first refresh transistor directly connecting the first storage node to a voltage supply without intervening circuit elements; the current path of the second refresh transistor directly connecting the second storage node to said voltage supply line without intervening circuit elements;

a first address line connected to the control electrodes of the first and second access transistors; and a second address line connected to the control electrodes of the first and second refresh transistors;

and means for applying a single clock voltage to said second address line to turn on said first and second refresh transistors to refresh said cell.

2. A memory cell according to claim 1 wherein the first address line activates the control electrodes of the access transistors in ramdom sequence and the second address line activates the control electrodes of the refresh transistors in a regular repeating sequence.

3. A memory cell according to claim 2 wherein all of said transistors are insulated-gate field effect transistors, all of said current paths are source-to-drain paths, and all of said control electrodes are gate electrodes.

4. A memory cell according to claim 2 wherein the second address line activates the control electrodes of the access transistors in a time period which always terminates before the first address line ceases activating the control electrodes of the access transistors.

5. A memory cell according to claim 4 wherein the first address line activates the control electrodes of the access transistors for data write into the cell at a time period when the second address line cannot activate the control electrodes of the refresh transistors.

6. A read/write semiconductor memory array comprising a plurality of rows and columns of pseudo-static read/write memory cells;

each cell having first and second driver transistors, each said driver transistor having a current path and a control electrode, the control electrode of each driver transistor cross-coupled to one end of the current path of the other driver transistor to provide a bistable circuit;

each cell having first and second storage nodes, the first storage node being coupled to said one end of said current path of the first driver transistor, the second storage node being coupled to said one end of said current path of the second driver transistor;

each cell having first and second access transistors, each access transistor having a current path and a control electrode;

the columns having first and second data lines for read or write of data bits and complements, the current paths of the first and second access transistors of each cell in a column respectively coupling the first and second storage nodes to the first and second data lines for this column;

each cell having first and second refresh transistors, each refresh transistor having a current path and a control electrode, the current path of the first refresh transistor connecting the first storage node to a voltage supply; the current path of the second refresh transistor connecting the second storage node to said voltage supply;

each of the rows having a first address line connected to the control electrodes of the first and second access transistors of each cell in the row;

each of the rows also having second address line connected to the control electrodes of the first and second refresh transistors of each cell in the row;

and means for applying a single check voltage to said second address line to turn on said first and second refresh transistors to refresh the cells.

7. A memory array according to claim 6 wherein the first address line activates the control electrodes of the access transistors in one random selected row and the second address line activates the control electrodes of the refresh transistors in a regular repeating sequence of rows.

8. A memory array according to claim 7 wherein all of said transistors are insulated-gate field effect transistors, all of said current paths are source-to-drain paths, and all of said control electrodes are gate electrodes.

9. A memory array according to claim 7 wherein the second address line activates the control electrodes of the access transistors in a time period which always terminates before the first address line ceases activating the control electrodes of the access transistors.

10. A memory array according to claim 9 wherein the first address line activates the control electrodes of the access transistors for data write into a cell of the array at a time period when the second address line cannot activate the control electrodes of the refresh transistors in any cell in the array.

11. A microcomputer system comprising:
(a) a microcomputer device formed in a single integrated circuit and having data input/output terminals and address output terminals;
(b) memory external to the microcomputer device having an address input and data input/output means;
(c) input/output peripheral means for transfer of information to or from external equipment; said input/output peripheral means having an address input and data input/output;
(d) external address bus means coupled to the address output terminals of the microcomputer device, and to the address input of the memory means, and to said address input of the peripheral means;
(e) external data bus means coupled to the data input/output terminals of the microcomputer device, and to the data input/output means of the memory means, and to said data input/output of said peripheral means;
(f) the microcomputer device comprising:
an arithmetic/logic unit having data input and an accumulator data output;
a pseudo-static data memory having an access address input and a separate refresh address input, and having data input/output means;
internal data bus means coupled to the data input and accumulator data output of the arithmetic/logic unit, and coupled to the data input/output means of the pseudo-static data memory; the data input and data output of the arithmetic/logic unit being selectively coupled to the data input/output means of the data memory by said internal data bus means;

refresh address generator means for applying a repeating sequence of refresh addresses to said refresh address input, said refresh address being applied to said refresh address input by a path separate from said internal data bus means an internal program memory having an address input and having an instruction output, the program memory storing instruction words;

program address means connected to the address input of the program memory means;

control means receiving instruction words from said instruction output and generating controls in response to said instruction words, the controls being coupled to the arithmetic/logic unit, to the internal bus means and to control inputs of the data input/output means of the data memory; and means for applying refresh addresses to said refresh address input of the data memory transparent to the control means;

internal program bus means coupled to said instruction output, to said control means, and to said program address means;

timing means for establishing overlapping operating cycles during one of which data may be transferred from the data memory to the data input of the arithmetic/logic and a refresh address applied to the data memory, and also the arithmetic/logic unit produces results to the accumulator data output for one instruction, the control means receives an instruction word from the instruction output for the next instruction and the program address means applies an address to the address input of the program memory for another instruction.

12. A system according to claim 11 wherein data is written from said internal data bus means into said data memory during one part of an operating cycle and read from said data memory to said internal data bus means during another different path of an operating cycle.

13. A system according to claim 12 wherein the data access of the data memory for reading to the internal data bus means may occur during at least part of the same time period that the data memory receives a refresh address.

14. A microcomputer system according to claim 13 wherein said pseudo-static data memory comprises a read/write memory array in the form of a plurality of rows and columns of pseudo-static read/write memory cells;

each cell having first and second driver transistors each with a current path and a control electrode, the control electrode of each cross-coupled to one end of the current path of the other to provide a bistable circuit;

each cell having first and second storage nodes respectively coupled to said one ends of said current paths of the first and second driver transistors;

each cell having first and second access transistors each with a current path and a control electrode;

the columns having first and second data lines for read or write of data bits and complements, the current paths of the first and second access transistors of each cell in a column respectively coupling the first and second storage nodes to the first and second data lines;

each cell having first and second refresh transistors each with a current path and a control electrode, the current paths of the first and second refresh transistors respectively connecting the first and second storage nodes to voltage supply means;

the rows having first address means connected to the control electrodes of the first and second access transistors of each cell in the row;

each of the rows also having second address means connected to the control electrodes of the first and second refresh transistors of each cell in the row.

15. A system according to claim 14 wherein the first address means activates the control electrodes of the access transistors in one random selected row and the second address means activates the control electrodes of the refresh transistors in a regular repeating sequence of rows.

16. A system according to claim 15 wherein all of said transistors are insulated-gate field effect transistors, all of said current paths are source-to-drain paths, and all of said control electrodes are gate electrodes.

17. A system according to claim 16 wherein the second address means activates the control electrodes of the access transistors in a time period which always terminates before the first address means ceases activating the control electrodes of the access transistors.

18. A system according to claim 17 wherein the first address means activates the control electrodes of the access transistors for data write into a cell of the array at a time period when the second period when the second address means cannot activate the control electrodes of the refresh transistors in any cell in the array.

* * * * *